United States Patent
Sato et al.

(10) Patent No.: US 8,199,788 B2
(45) Date of Patent: *Jun. 12, 2012

(54) SURFACE-EMISSION LASER DIODE AND FABRICATION PROCESS THEREOF

(75) Inventors: Shunichi Sato, Miyagi (JP); Akihiro Itoh, Miyagi (JP); Naoto Jikutani, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/691,476

(22) Filed: Jan. 21, 2010

(65) Prior Publication Data

US 2010/0118907 A1    May 13, 2010

Related U.S. Application Data

(63) Continuation of application No. 10/567,809, filed on Apr. 25, 2008, now Pat. No. 7,684,458.

(30) Foreign Application Priority Data

| Jun. 11, 2004 | (JP) | 2004-173890 |
| Dec. 13, 2004 | (JP) | 2004-359671 |
| Mar. 25, 2005 | (JP) | 2005-088188 |
| Mar. 31, 2005 | (JP) | 2005-101765 |

(51) Int. Cl.
*H01S 5/00*    (2006.01)

(52) U.S. Cl. ........... 372/50.124; 372/45.01; 372/45.011; 372/50.11

(58) Field of Classification Search ............. 372/50.124, 372/45.01, 45.011, 50.11
See application file for complete search history.

(56) References Cited

U.S. PATENT DOCUMENTS 5,633,886 A    5/1997    Ramdani et al.
(Continued)

FOREIGN PATENT DOCUMENTS

EP    1026798 A2    8/2000
(Continued)

OTHER PUBLICATIONS

Nobuhiko Nishiyama et al, (Dec. 1998) Single-Traverse Mode and Stable Polarization Operation Under High-Speed Modulation of InGaAs-GaAs Vertical-Cavity.
(Continued)

*Primary Examiner* — Kinam Park
(74) *Attorney, Agent, or Firm* — Cooper & Dunham LLP

(57) ABSTRACT

A surface-emission laser diode comprises a cavity region over a semiconductor substrate and includes an active layer containing at least one quantum well active layer producing a laser light and a barrier layer, a spacer layer is provided in the vicinity of the active layer and formed of at least one material, an upper and lower reflectors are provided at a top part and a bottom part of the cavity region, the cavity region and the upper and lower reflectors form a mesa structure over the semiconductor substrate, the upper and lower reflectors being formed of a semiconductor distributed Bragg reflector having a periodic change of refractive index and reflecting incident light by interference of optical waves, at least a part of the semiconductor distributed Bragg reflector is formed of a layer of small refractive index of $Al_xGa_{1-x}As$ ($0<x\leq1$) and a layer of large refractive index of $Al_yGa_{1-y}As$ ($0\leq y<x\leq1$), the lower reflector is formed of a first lower reflector having a low-refractive index layer of AlAs and a second lower reflector formed on the first lower reflector, the second lower reflector has a low-refractive index layer of AlGaAs, any one layer constituting the cavity region contains In.

11 Claims, 10 Drawing Sheets

U.S. PATENT DOCUMENTS

| | | | |
|---|---|---|---|
| 5,649,553 | A | 7/1997 | Pillai et al. |
| 6,233,264 | B1 | 5/2001 | Sato |
| 6,376,269 | B1 | 4/2002 | Chen et al. |
| 6,541,297 | B2 | 4/2003 | Takahashi |
| 6,700,914 | B2 | 3/2004 | Yokouchi et al. |
| 7,684,458 | B2 * | 3/2010 | Sato et al. ............... 372/50.124 |
| 2002/0075926 | A1 | 6/2002 | Coldren et al. |
| 2002/0101899 | A1 | 8/2002 | Yokouchi et al. |
| 2002/0186736 | A1 | 12/2002 | Takahashi |
| 2003/0043875 | A1 | 3/2003 | Gen-Ei et al. |
| 2003/0103543 | A1 | 6/2003 | Moser et al. |
| 2003/0156613 | A1 | 8/2003 | Uenohara et al. |
| 2004/0091011 | A1 * | 5/2004 | Liu ................................. 372/46 |

FOREIGN PATENT DOCUMENTS

| | | |
|---|---|---|
| EP | 1294063 A1 | 3/2003 |
| JP | 9-107153 | 4/1997 |
| JP | 11-312847 | 11/1999 |
| JP | 2000-294877 | 10/2000 |
| JP | 2000-312054 | 11/2000 |
| JP | 2001-60739 | 3/2001 |
| JP | 2001-168461 | 6/2001 |
| JP | 2001-223433 | 8/2001 |
| JP | 2002-164621 | 6/2002 |
| JP | 2002-353568 | 12/2002 |
| JP | 2003-78208 | 3/2003 |
| JP | 2003-133646 | 5/2003 |
| JP | 2004-103754 | 4/2004 |
| JP | 2004-158666 | 6/2004 |

OTHER PUBLICATIONS

Surface Emitting Laser Grown on GaAs (311) B Substrate, IEEE Photonics Technology Letters, vol. 10, No. 12, pp. 1676-1678.

N. Tansu et al. (Jun. 2000) "Low-Temperature Sensitive, Compressively Strained in GaAsP Active (=0.78-0.85 m) Region Diode Lasers", IEEE Photonics TEchnology Letter, vol. 12, No. 6, pp. 603-605.

Jun. 15, 2009 European search report in connection with a counterpart European patent application No. 05 74 8559.

Jun. 9, 2011 Japanese official action in connection with counterpart Japanese patent application.

* cited by examiner

TIME CHANGE OF In (451nm) / Al (396nm) EMISSION INTENSITY RATIO

SURFACE-EMISSION LASER DIODE AND FABRICATION PROCESS THEREOF

CROSS-REFERENCE TO RELATED APPLICATION

This application is a continuation of application Ser. No. 10/567,809, filed Apr. 25, 2008, the entire contents of which are incorporated by reference herein.

TECHNICAL FIELD

This disclosure relates to surface-emission laser diodes and the fabrication process thereof.

BACKGROUND ART

A surface-emission laser diode (surface-emission semiconductor laser) is a laser diode that emits light in a vertical direction to the substrate and is used for civil purposes, such as optical source of optical telecommunication including optical interconnection, optical source of optical pickup devices, optical source of image forming apparatuses, and the like.
Patent Reference 1 Japanese Laid-Open Patent Application 2002-164621
Patent Reference 2 Japanese Laid-Open Patent Application 9-107153 official gazette
Patent Reference 3 Japanese Laid-Open Patent Application 2001-60739
Patent Reference 4 Japanese Laid Open Patent Application 2001-168461
Non-patent Reference 1 IEEE Photonics Technology Letters, Vol. 10, No. 12, pp. 1676-1678, 1998 (Tokyo Institute of Technology)
Non-patent Reference 2 IEEE Photonics Technology Letters, Vol. 12, No. 6, pp. 603-605, 2000 (Wisconsin Univ.)

A surface-emission laser diode for such applications is typically targeted to the specifications that the laser diode has a large gain for the active layer, low threshold value, high output, excellent reliability, and controlled polarization direction.

Particularly, surface-emission laser diodes have a tendency of providing small optical output as compared with edge-emission laser diodes in view of the small volume of the active layer. Thus, there are many cases in which demand of increased output is imposed to such surface-emission laser diodes. One approach of increasing the optical output is to suppress the temperature rise of the optical emission part.

First, explanation will be made for a typical device structure of surface-emission laser diode and description will be made further with regard to the measures taken against heat.

FIG. 1 is a diagram showing an example structure of general surface-emission laser diode. It should be noted that the example of FIG. 1 is a surface-emission laser diode having InGaAs/GaAs for the active layer and using the current confinement structure formed by selective oxidization of an AlAs layer.

The general surface-emission laser diode shown in FIG. 1 is produced in the following manner.

By an MOCVD process or MBE process, there is formed a stack of films by consecutively stacking, on an n-GaAs single crystal substrate 11, an n-AlGaAs/n-AlGaAs lower semiconductor multilayer reflector (DBR: distributed Bragg reflector) 12, a lower GaAs spacer layer 13, an AlGaAs/AlGaAs-MQW active layer 14, an upper AlGaAs spacer layer 15, an AlAs layer for selective oxidation 16, and p-AlGaAs/p-AlGaAs upper semiconductor multilayer reflector (DBR).

Next, the stacked film is processed to form a mesa structure by a dry etching process. With this process, it is commonly practiced to conduct the etching such that the etching surface reaches a region inside the lower semiconductor DBR 12.

Next, the AlAs layer for selective oxidation 16 having the sidewall surface exposed by the dry etching process is processed in water vapor, such that there occurs oxidation at the peripheral part thereof, to form an insulation layer of $Al_xO_y$ in such a peripheral part. Thereby, there is formed a current confinement structure that restricts the path of the device drive current only to the AlAs region at the central part where the oxidation has not taken place.

Next, the peripheral part of the mesa structure is filled with an insulation film 18, and a p-side electrode 19 and an n-side electrode 20 are formed at predetermined locations. With this, fabrication of the surface-emission laser diode of FIG. 1 is completed.

Meanwhile, with such a surface-emission laser diode, it is preferable to reduce the height of the mesa structure and thereby to reduce the heat resistance to the substrate for the purpose of improving heat dissipation from the active layer 14. However, with the mesa formation process conducted by a dry etching process, fluctuation in the etching depth of ±10% or more is not unusual, and further in view of the possible fluctuation of etching depth inside the specimen, it is inevitable to set the height of the mesa structure to be larger than the height which is actually necessary.

Patent Reference 1 shows the construction that reduces heat resistance.

With the construction shown in Patent Reference 1, AlAs, having a much larger thermal conductivity as compared with AlGaAs, is used for the low refractive index layers in the majority part of the DBR located at the lower part of the lower semiconductor DBR. On the other hand, conventional AlGaAs is used for the low refractive index layer in the upper part of lower semiconductor DBR. The reason of this is to avoid the situation that the etching surface reaches inside the lower part AlAs-DBR and there takes place oxidation at the edge surface of the AlAs layer of lower part AlAs-DBR exposed at the mesa sidewall surface at the time of conducting the oxidation processing of the AlAs layer for selective oxidation later. When this occurs, the active part in the device is insulated or there occurs increase of device resistance. The reason that such a situation arises is that the oxidation rate of AlGaAs relies heavily upon the Al content and that there occurs increase in the oxidation rate with increase of the Al content. Thus, the oxidation rate becomes the largest with AlAs.

In order to avoid this problem, Patent Reference 1 forms the upper AlGaAs-DBR by using AlGaAs of small oxidation rate and controls the bottom surface of etching such that the bottom surface of etching is located in this upper AlGaAs-DBR. Thereby, exposure of the AlAs edge surface of the lower AlAs-DBR is avoided. With such an upper AlGaAs-DBR, it is preferable that the pair number is equal to or smaller than 4/7 of the entire pair number as set forth in Patent Reference 1. Particularly, it is desirable to set the pair number to 10 pairs or less.

However, with the approach of controlling the bottom surface of etching such that the bottom surface of etching is located in the upper AlGaAs-DBR of only about 10 pairs by way of controlling the etching time, there is caused remarkable decrease of yield, and there arises a problem in that large fluctuation occurs in the position of the bottom surface of etching in the upper AlGaAs-DBR.

Therefore, in order to achieve the object of providing measures against heat while maintaining high yield, control of the mesa formation process by dry etching process becomes important. For this, it is desirable to carry out monitoring of the etching process.

For the monitoring method of dry etching process, there is a known method of plasma atomic emission spectrometry. Further, there is a method that irradiates the surface of the specimen to be etched with light, wherein this method monitors the intensity of the reflection light and detects the etching depth from the change of the interference intensity of the film. From the viewpoint that there is no need of providing observation window and in view of the fact that the method is well established and that there are commercially available instruments, it is thought advantageous to use the plasma atomic emission spectrometry.

With the monitoring method that uses this plasma atomic emission spectrometry, the change of emission intensity corresponding to the semiconductor film composition is detected by monitoring the atomic emission intensity of Ga at 417 nm or the time change of the ratio of the atomic emission intensity of Ga at 417 nm to the atomic emission intensity of Al at 396 nm. In the case of the specimen formed primarily of repetition of the layers of two compositions as in the case of the layered structure of the surface-emission laser diode, this atomic emission intensity change draws an oscillatory waveform.

However, in the semiconductor film used for the surface-emission laser diode that oscillates at the laser oscillation wavelength of a GaAs active layer (about 850 nm), in particular, the change of Ga composition or Ga/Al composition ratio is small. Further, the film thickness of the DBR or cavity is small in correspondence to the wavelength. Thus, the amplitude of the oscillatory waveform of the plasma atomic emission spectrometry becomes small. Thereby, it is not easy to carry out the monitoring. Further, in the case the specimen to be etched has large size, there arises a problem in that monitoring becomes difficult because of the distribution of etching rate inside the specimen.

Meanwhile, it is known that excellent carrier confinement to the active layer is attained in the surface-emission laser diode of the 850 nm band and 980 nm band.

For example, GaAs is used for the quantum well active layer and AlGaAs is used for the barrier layer and the spacer layer (cladding layer) of a surface-emission laser diode of the 850 nm band. Further, with such a surface-emission laser diode of the 850 nm band, it is possible to use the current confinement structure that uses a high-performance AlGaAs-system reflector (DBR) and the current confinement structure that uses an Al oxide film.

Further, various proposals have been made with regard to polarization control of such a surface-emission laser diode. For example, there is proposed a method of providing anisotropy in the outer shape of the active layer as viewed from the optical emission direction. Particularly, Non-Patent Reference 1 shows that polarization control is possible by anisotropy of optical gain realized by using a (311)B substrate, in other words a so-called off-substrate that is inclined from (100) by 25° in the (111)B direction, such that the optical gain in the inclined direction is increased. Further, it is shown that similar effect is obtained also with a (311)A substrate.

However, with the technology of Non-Patent Reference 1, there is a drawback in that it is difficult to conduct crystal growth on the heavily inclined (311)B substrate as compared with the crystal growth on the (100) substrate and that crystal growth on the (311)A substrate is even more difficult.

Further, in any of these substrates in which the substrate is heavily inclined, the cost of the substrate is increased by twice or more and it is difficult to carry out cleaving process. Further, handling of the substrate is difficult.

Meanwhile, the surface-emission laser diode of the wavelength shorter than 850 nm is realized by increasing the bandgap of the quantum well active layer by adding thereto Al.

For example, there is a proposal of a surface-emission laser diode of the 780 nm band in which Al is added to the quantum well active layer by about 12% in terms of the compositional ratio.

However, such a surface emission laser diode of the band shorter than 850 nm, there is caused a decrease in the band discontinuity between the quantum well active layer and the barrier layer or the spacer layer, and the efficiency of carrier confinement to the active layer is decreased. Thereby, there arises a problem in that it is difficult to attain good temperature characteristics as compared with the surface-emission laser diode of the 850 nm band. Further, because the active layer is added with active Al, there is a tendency that oxygen is incorporated into the active layer during the growth or processing thereof, while this leads to the problem of formation of non-optical recombination center, which in turn invites degradation of efficiency of optical emission and degradation of reliability.

Patent Reference 2 proposes a surface-emission laser diode (780 nm band) that uses an Al-free active region (quantum well active layer and the layers adjacent thereto) in a surface-emission laser diode of the wavelength band of 850 nm or shorter for the purpose of suppressing the formation of non-optical recombination center.

With this conventional surface-emission laser diode, GaAsP having a tensile strain is used for the quantum well active layer, and GaInP having a compressive strain is used for the barrier layer. Further, lattice matched GaInP is used for the spacer layer (the layer between the cladding layer and the first and third quantum well active layer), and AlGaInP is used for the cladding layer. According to the technology of Patent Reference 2, reliability of the surface-emission laser diode is improved in view of use of the Al-free composition of the active region.

Further, Non-Patent Reference 2 proposes a surface-emission laser diode of the 780 nm band that uses GaInPAs having a compressive strain for the quantum well active layer for the purpose of attaining the effect of Al-free active region and further for the purpose of increasing the gain of the active layer, wherein Non-Patent Reference 2 further teaches the use of lattice matched GaInP or GaInP having a tensile strain for the barrier layer and the use of lattice matched AlGaInP for the spacer layer (the layer between the cladding layer and the first and third quantum well active layers) and further the use of AlGaInP (having Al composition larger than the spacer layer) for the cladding layer.

With the surface-emission laser diode of Non-Patent Reference 2, the barrier layer has a lattice matched composition, and thus, the barrier layer has a larger bandgap as compared with the compressive strain composition, and thus, the efficiency of carrier confinement is improved as compared with the structure of Patent Reference 2 mentioned before.

With regard to polarization control, Patent Reference 3 shows the technology of using a substrate having a surface orientation inclined in the direction of (111)A surface or (111)B surface from the (100) surface orientation by the angle (inclination angle) of 15-40°, wherein this technology uses the anisotropy of optical gain in combination with the multiple quantum well active layer of InAlGaAs and InGaAsP having a compressive strain for increasing the optical gain in the inclined direction.

Further, Patent Reference 4 shows the method that forms the mesa shape in a circular, elliptical or elongated circular shape and sets the direction of the major axis in the direction of (111)A surface or (111)B surface from (100). In this case, a substrate having a surface orientation offset by 2° (including −5°-+5°) in the [110] direction from (100) is used. It should be noted that this is not the substrate inclined in the A surface or B surface direction.

However, it has not been realized a surface-emission laser diode of the wavelength shorter than 850 nm and at the same time having a large gain for the active layer and small threshold value, high output power, excellent reliability and controlled polarization direction.

Thus, while Patent Reference 2 can provide improved reliability in view of the use of Al-free active layer, the reference is silent about the control method of polarization. Further, while Non-Patent Reference 2 provides a structure of excellent carrier confinement, it is silent about the control method of polarization. Further, while Patent Reference 3 enables control of polarization direction, it is totally indifferent to reliability or structure matched to the property of the materials. Further, while Patent Reference 4 can control the polarization direction, it is totally indifferent about achieving high gain and long lifetime for the surface-emission laser diode of the wavelength shorter than 850 nm.

Further, in the case a material of (Al)GaInP system is used for the material forming the cavity region sandwiched by the upper and lower reflectors as described in Non-Patent Reference 2, it is known that there arises large increase of threshold current because of separation (segregation) of In such as carry-over of In into the AlGaAs layer at the interface between the cavity region and the upper reflector, which is formed by the material of the AlGaAs system.

Further, AlGaInP, a quaternary mixed crystal, has large thermal resistance, and there also arises a problem with a material of the (Al)GaInP system in that Zn (zinc), which is used for the p-type dopant, easily causes diffusion.

Thus, it has not been realized conventionally to provide a surface-emission laser diode of the wavelength shorter than 850 nm, having large gain for the active layer and low threshold value, high output, excellent reliability and controlled polarization direction.

In an aspect of this disclosure, there is provided a surface-emission laser diode having small Ga content or small change of Ga/Al ratio in a semiconductor distributed Bragg reflector (DBR) and having improved heat dissipation, and having a construction that can improve the controllability of etching at the time of forming the mesa structure by etching a laser stacking structure, and that is capable of performing high output operation.

In another aspect of this disclosure, there is provided a surface-emission laser diode of the wavelength shorter than 850 nm, the surface-emission laser diode having excellent reliability and being a high-output surface-emission laser diode of low threshold value while having a large gain of active layer.

In another aspect of this disclosure, there is provided a surface-emission laser diode of the wavelength shorter than 850 nm, the surface-emission laser diode having excellent reliability, large gain for the active layer and low threshold value, high output power and controlled polarization direction.

In another aspect, there is provided any one or more of a surface-emission laser diode array, an image forming apparatus, an optical pickup system, an optical transmission module, an optical transceiver module and an optical telecommunication system in which the foregoing surface-emission laser diode is integrated.

In another aspect of this disclosure, there is provided a surface-emission laser diode, comprising:

a semiconductor substrate;

a cavity region formed over said semiconductor substrate, said cavity region comprising: an active layer structural part including at least one quantum well active layer producing a laser light and a barrier layer; and a spacer layer provided in a vicinity of said active layer structural part, said spacer layer comprising at least one material; and an upper reflector and a lower reflector provided over said semiconductor substrate respectively at a top part and a bottom part of said cavity region, said cavity region, said upper reflector and said lower reflector forming a mesa structure over said semiconductor substrate, said upper reflector and said lower reflector constituting a semiconductor distributed Bragg reflector having a periodic change of refractive index and reflecting an incident light by interference of optical waves, at least a part of said semiconductor is distributed Bragg reflector being formed of a layer of small refractive index of $Al_xGa_{1-x}As$ ($0<x\leq1$) and a layer of large refractive index of $Al_yGa_{1-y}As$ ($0\leq y<x\leq1$), said lower reflector being formed of a first lower reflector having a low-refractive index layer of AlAs and a second lower reflector formed on said first lower reflector, said second lower reflector having a low-refractive index layer of AlGaAs, wherein any one layer constituting said cavity region contains In.

In another aspect of this disclosure, there is provided a surface-emission laser diode, comprising:

a (100) GaAs substrate having a surface orientation inclined in a direction of a (111)A surface by an angle of 5° to 20°;

a cavity region provided over said GaAs substrate, said cavity region including an active layer structural part comprising at least one layer of quantum well active layer producing a laser light and barrier layers, and a spacer layer provided in a vicinity of said active layer structural part, said spacer layer comprising at lease one material; and an upper reflector and a lower reflector is provided at a top part and a bottom part of said cavity region, said cavity region and said upper and lower reflectors forming a mesa structure over said GaAs substrate, said upper reflector and said lower reflector comprising a semiconductor distributed Bragg reflector having a periodic change of refractive index and reflecting an incident light by interference of optical waves, at least a part of said semiconductor distributed Bragg reflector being formed of a layer of small refractive index of $Al_xGa_{1-x}As$ ($0<x\leq1$) and a layer of large refractive index of $Al_yGa_{1-y}As$ ($0\leq y<x\leq1$), a part of said spacer layer comprising $(Al_aGa_{1-a})_bIn_{1-b}P$ ($0<a\leq1$, $0\leq b\leq1$), said quantum well active layer comprising $Ga_cIn_{1-c}P_dAs_{1-d}$ ($0\leq c\leq1$, $0\leq d\leq1$), said barrier layers comprising $Ga_eIn_{1-e}P_fAs_{1-f}$ ($0\leq e\leq1$, $0\leq f\leq1$), said quantum well active layer having a compressive strain, said active layer structural part having a shape anisotropy elongated in a direction of a (111)A surface as viewed from a direction of light emission.

In another aspect of this disclosure, there is provided a method of fabricating a surface emission laser diode, said surface emission layer diode comprising, over a semiconductor substrate: a cavity region comprising an active layer structural part including at least one quantum well active layer producing a laser light and barrier layers, and a spacer layer of at least one material provided in a vicinity of said active layer structural part; and an upper reflector and a lower reflector provided at a top part and a bottom part of said cavity region, said method comprising the steps of:

forming a stacked structure including said lower reflector, said cavity region and said upper reflector over said semiconductor substrate; and forming a mesa structure by patterning said stacked film by dry etching, said step of forming said stacked structure including a step of incorporating In to any one layer constituting said cavity region, said step of forming said mesa structure by said dry etching comprises a step of controlling a height of said mesa structure by monitoring light emission of In.

In another aspect of this disclosure, there is provided a surface-emission laser diode, comprising:

a GaAs substrate;

a cavity region formed over said GaAs substrate, said cavity region including at least one quantum well active layer producing a laser light and barrier layers; and an upper reflector and a lower reflector provided at a top part and a bottom part of said cavity region over said GaAs substrate, said upper reflector and/or said lower reflector including a semiconductor Bragg reflector, at least a part of said semiconductor distributed Bragg reflector comprising a semiconductor layer containing Al, Ga and As as major components, wherein there is provided, between said active layer and said semiconductor layer that contains Al, Ga and As as major components, a semiconductor layer containing Al, In and P as major components such that said semiconductor layer containing Al, In and P as major components is provided adjacent to said semiconductor layer that contains Al, Ga and As as major components, an interface between said semiconductor layer containing Al, Ga and As as major components and said semiconductor layer containing Al, In and P as major components being formed coincident to a location of a node of electric field strength distribution.

In another aspect of this disclosure, there is provided a surface-emission laser diode, comprising:

a GaAs substrate;

a cavity region formed over said GaAs substrate and having at least one quantum well active layer producing a laser light and barrier layers; and an upper reflector and a lower reflector provided at a top part and a bottom part of said cavity region over said GaAs substrate, said upper reflector and/or lower reflector including a semiconductor distributed Bragg reflector, at least a part of said semiconductor distributed Bragg reflector comprising a semiconductor layer containing Al, Ga and As as major components, there being provided, between said active layer and said semiconductor layer containing Al, Ga and As as major components, a $(Al_aGa_{1-a})_bIn_{1-b}P$ ($0<a\leq1$, $0\leq b\leq1$) layer adjacent to said semiconductor layer containing Al, Ga and As as major components, said $(Al_aGa_{1-a})_bIn_{1-b}P$ ($0<a\leq1$, $0\leq b\leq1$) layer being added with Mg (magnesium) as a p-type dopant, said semiconductor layer containing Al, Ga and As as major components being added with C (carbon) as a p-type dopant.

In another aspect of this disclosure, there is provided a surface-emission laser diode, comprising:

a GaAs substrate;

a cavity region formed over said GaAs substrate, said cavity region including at least one quantum well active layer producing a laser light and barrier layers; and an upper reflector and a lower reflector provided at a top part and a bottom part of said cavity region over said GaAs substrate, said upper reflector and/or lower reflector including a semiconductor distributed Bragg reflector, at least a part of said semiconductor distributed Bragg reflector comprising a semiconductor layer containing Al, Ga and As as major components, there being provided, between said active layer and said semiconductor layer containing Al, Ga and As as major components, a $(Al_aGa_{1-a})_bIn_{1-b}P$ ($0<a\leq1$, $0\leq b\leq1$) layer adjacent to said semiconductor layer containing Al, Ga and As as major components, said $(Al_aGa_{1-a})_bIn_{1-b}P$ ($0<a\leq1$, $0\leq b\leq1$) layer being a semiconductor layer formed of a short period superlattice structure of AlInP and GaInP.

In another aspect of this disclosure, there is provided a surface-emission laser diode, comprising:

a GaAs substrate;

a cavity region formed over said GaAs substrate, said cavity region including at least one quantum well active layer producing a laser light and barrier layers; and an upper reflector and a lower reflector provided at a top part and a bottom part of said cavity region over said GaAs substrate, said upper reflector and/or lower reflector including a semiconductor distributed Bragg reflector, at least a part of said semiconductor distributed Bragg reflector comprising a low refractive index layer of $Al_xGa_{1-x}As$ ($0<x\leq1$) and a high refractive index layer of $Al_yGa_{1-y}As$ ($0\leq y<x\leq1$), one of said low refractive index layers constituting said upper reflector and/or said lower is reflector and located closest to said active layer comprising $(Al_aGa_{1-a})_bIn_{1-b}P$ ($0<a\leq1$, $0\leq b\leq1$), an interface between said cavity region and said low refractive index layer of said upper reflector and/or said lower reflector located closest to said active layer being coincident to an anti-node of an electric strength distribution.

When any one layer constituting the cavity region contains In, precision and reproducibility of mesa etching is improved by detecting exposure of said In-containing layer at the time of the mesa etching of the laser lamination structure comprising the cavity and the upper and lower semiconductor DBRs. Even in the case the lower semiconductor DBR contains AlAs/(Al)GaAs-DBR of excellent heat dissipation, it is possible to realize a construction in with the AlAs/(Al)GaAs-DBR is provided to the neighbor of the cavity. With such a construction, temperature rise at the time of laser driving is suppressed and a high output power surface-emission laser diode of excellent temperature characteristics is provided. At the same time, it becomes possible to provide a surface-emission laser diode having excellent uniformity in the laser characteristics and characterized by excellent reproducibility in the processing and excellent yield.

Particularly, by incorporating In into the upper or lower spacer layer constituting the active region and having much larger thickness as compared with the active layer structural part, it becomes possible to form the mesa structure with further improved reproducibility and further improved precision, and with this, it becomes possible to form a surface-emission laser diode of further improved temperature characteristics, higher output power and further improved uniformity in laser characteristics, with higher reproducibility of processing and with higher yield.

Further, by forming the semiconductor DBR constituting the second lower reflector in the aforementioned surface-emission laser diode, such that the semiconductor DBR has the thickness of 10 pairs or less, the thickness of the semiconductor DBR is set to be larger than the precision of the mesa etching and at the same time minimum. With this, temperature rise at the time of driving is suppressed further, and a surface-emission laser diode of high output power is obtained with excellent temperature characteristics.

Further, by forming a part of the spacer layer of the aforementioned surface-emission laser diode by $(Al_aGa_{1-a})_bIn_{1-b}P$ ($0<a\leq1$, $0\leq b\leq1$) and by forming the quantum well active layer by $Ga_cIn_{1-c}P_dAs_{1-d}$ ($0\leq c\leq1$, $0\leq d\leq1$), and further by forming the barrier layer by $Ga_eIn_{1-e}P_fAs_{1-f}$ ($0\leq e\leq1$, $0\leq f\leq1$), and further by using an AlGaInP material and thus $(Al_aGa_{1-a})_bIn_{1-b}P$ ($0<a\leq1$, $0\leq b\leq1$) for a part of the spacer layer, it becomes possible to increase the bandgap difference between the spacer layer and the quantum well active layer as compared with the case of forming the spacer layer by the AlGaAs system. Thereby, there is achieved improvement of carrier confinement efficiency, and it becomes possible to realize a high-output laser having a further lower threshold value in combination with the excellent heat dissipation effect pertinent to such a structure.

Further, in the aforementioned surface emission laser diode, a GaInPAs material can be used for the barrier layer and the quantum well active layer, and thus, the quantum well active layer is formed of $Ga_cIn_{1-c}P_dAs_{1-d}$ ($0\leq c\leq1$, $0\leq d\leq1$), and that the barrier layers are formed of $Ga_eIn_{1-e}P_fAs_{1-f}$ ($0\leq e\leq1$, $0\leq f\leq1$). Thus, the active layer structural part formed of the quantum well active layer and the layer adjacent thereto does not contain Al, and the problem of incorporation of oxygen into the active layer structural part by Al, and associated problem of formation of non-optical recombination center, can be suppressed, and a surface-emission laser diode of long lifetime can be realized.

Further, by forming the quantum well active layer with a compressive strain composition in the aforementioned surface-emission laser diode such that a compressive strain is accumulated in the quantum well active layer, the carrier confinement effect is augmented with the effect of the strain, and the optical gain of the active layer structural part is increased further. Further, improvement of heat dissipation is added to the foregoing. Thereby, the threshold value is decreased further. Thus, it becomes possible to realize a surface-emission laser diode of extremely high efficiency and high output power. Further, with decrease of the threshold value attained by the improvement of carrier confinement efficiency and further by the increase of gain as a result of use of the strained quantum well active layer, it becomes possible to decrease the reflectivity of the DBR at the exit side of light (upper semiconductor DBR). As a result of decrease of the reflectivity of the DBR at the optical exit side, a further increase of the optical power becomes possible.

Further, because the semiconductor substrate is a (100) GaAs substrate having a surface orientation inclined in the direction of a (111)A surface with an angle in the range from 5° to 20° (in other words, as a result of use of the (100) GaAs substrate having the surface orientation inclined in the direction of the (111)A surface with the angle of 5° to 20° by taking into consideration the surface orientation of the substrate) in the aforementioned surface-emission laser diode, adverse effects to the device characteristics of the semiconductor layer, such as decrease of bandgap caused by formation of natural super lattices or deterioration of surface morphology or formation of non-optical recombination centers caused by hillock (hill-like defect), are reduced.

Further, a surface-emission laser diode that uses the (100) GaAs substrate having the surface orientation inclined in the direction of the (111)A surface within the angular range of 5° to 20° (in other words the (100)GaAs substrate having the surface orientation inclined in the direction of the (111)A surface within the angular range of 5° to 20° with regard to the control of polarization) cannot attain the polarization control effect as in the case of using the (311)B substrate (corresponds to 25° inclination) currently drawing attention, and the anisotropy of optical gain attained with the use of inclined substrate becomes inevitably small. In such surface-emission laser diode, the foregoing decrease of anisotropy of optical gain can be compensated for by providing a compressive strain to the quantum well active layer and induce increase of anisotropy of the optical gain. Thereby, it becomes possible to control the polarization direction effectively. Thus, there is induced a synergistic effect of improvement of heat dissipation efficiency and increase of gain of the active layer structural part, and it becomes possible to realize a high output power surface-emission laser diode oscillating at a wavelength shorter than 850 nm and at the same time having low threshold value, excellent reliability and controlled polarization direction.

Next, with the use of the AlGaInP material, and thus $(Al_aGa_{1-a})In_{1-b}P$ ($0<a\leq1$, $0\leq b\leq1$) for a part of the space layer, it becomes possible to secure a large bandgap between the spacer layer and the quantum well active layer as compared with the case of forming the spacer layer with the AlGaAs system, and the efficiency of carrier confinement is improved. Further, the threshold of laser oscillation is decreased and it becomes possible to increase the output.

In the aforementioned surface-emission laser diode, the active layer structural part formed of the quantum well layer and the layer adjacent thereto has an Al-free construction as a result of use of GaInPAs material for the barrier layers and the quantum well active layer, and as a result, incorporation of oxygen into the active layer structure by oxygen is reduced, and formation of the non-recombination centers is suppressed. With this, a surface-emission laser diode of long lifetime is realized.

Further, it becomes possible to decrease the threshold value of laser oscillation further with the effect of the compressive strain, by using a compressive strain composition for the quantum well active layer, and it becomes possible to increase the efficiency of laser oscillation and obtain large output.

Further, in the aforementioned surface-emission laser diode, there is caused further decrease of threshold value of laser oscillation because of the improvement of efficiency of carrier confinement to the active layer structural part and because of improvement of gain by the use of the strained quantum well active layer, and it becomes possible to decrease the reflectivity of the exit-side DBR. Thereby, it becomes possible to obtain further higher output.

Further, in the aforementioned surface-emission laser diode, it becomes possible, with the use of the (100)GaAs substrate having a surface orientation inclined in the direction of a (111)A surface with an angle within the range of 5° to 20° by taking into consideration the effect of the surface orientation of the substrate, to suppress the adversary the effects to the device characteristics of the laser such diode as decrease of bandgap caused by formation of natural super lattices, deterioration of surface morphology caused by hillocks (hill-like defect), formation of non-optical recombination centers, or the like.

With the polarization control, the surface-emission laser diode according to the second aspect of the present invention cannot utilize the effect attained by using the (311)B substrate, which is through most promising at the present juncture as noted before, and the anisotropy of optical gain associated with the use of inclined substrate becomes inevitably small. With the present invention, this decrease is compensated for, by increasing the anisotropy of optical gain attained by providing a compressive strain to the quantum well active layer, and by increasing the optical gain in the inclined direction of the substrate (111)A surface direction) by providing anisotropy in the outer shape of the active layer as viewed from the optical emission direction of the surface-emission laser diode. With this, control of polarization direction becomes extremely easy.

Thus, in the aforementioned surface-emission laser diode it becomes possible to realize a high output power surface-emission laser diode oscillating at the wavelength shorter than 850 nm and having a large optical gain for the active layer structural part, small threshold value of laser oscillation, excellent reliability, and controlled polarization plane.

Further, in the aforementioned surface-emission laser diode, it becomes possible to increase the band discontinuity to the quantum well active layer by accumulating a tensile strain in the barrier layers. Thereby, it becomes possible to increase the gain. With this, the threshold value of laser oscillation is decreased and the surface-emission laser diode becomes possible to perform high output power operation. With the material of the GaInPAs system, it should be noted that the semiconductor material constituting the barrier layer can increase the bandgap by decreasing the lattice constant.

Further, in the aforementioned surface-emission laser diode, it becomes possible to realize a surface-emission laser diode of the oscillation wavelength larger than about 680 nm. Further, as a result of the use of the AlGaInP system material for the spacer layer, it becomes possible to realize the carrier confinement equivalent to or superior to the case of the surface-emission laser diode of the 780 nm band that uses the active layer of the AlGaAs system, even in the case the active layer, formed of the quantum well layer and barrier layer, is formed of a material free from Al, as long as the compositional wavelength is 680 nm or longer. Further, the effect of the strained quantum well active layer is added thereto. Thus, it becomes possible to realize the characteristics equivalent to or superior to the surface-emission layer diode of the 780 nm band that has the active layer of the AlGaAs system.

Further, with the aforementioned method of fabricating a surface emission laser diode, said surface emission layer diode comprising, over a semiconductor substrate: a cavity region comprising an active layer structural part including at least one quantum well active layer producing a laser light and barrier layers, and a spacer layer of at least one material and provided in a vicinity of said active layer structural part; and an upper reflector and a lower reflector provided at a top part and a bottom part of said cavity region, said method comprising the steps of: forming a stacked structure including said lower reflector, said cavity region and said upper reflector over said semiconductor substrate; and forming a mesa structure by patterning said stacked film by dry etching, said step of forming said stacked structure including a step of incorporating In to any one layer constituting said cavity region, said step of forming said mesa structure by said dry etching comprises a step of controlling a height of said mesa structure by monitoring light emission of In, it becomes possible to detect the cavity part positively in the foregoing dry etching process, it becomes possible to form the mesa structure with good reproducibility and with excellent precision, and it becomes possible to fabricate such a surface-emission laser diode with good reproducibility and good yield.

By providing, in the aforementioned surface-emission laser diode, the interface between the semiconductor layer containing Al, Ga and As as major components and the semiconductor layer containing Al, In and P as major components to be coincident to a location of a node of electric field strength distribution, it becomes possible to decrease the effect of optical absorption at the foregoing interface significantly, even in the case there is caused some segregation of In at the time of crystal growth of the semiconductor layer containing Al, Ga and As as the major components on the semiconductor layer containing Al, In and P as the major components, and it becomes possible to suppress the adversary effect of increase of threshold value caused by the segregation of In.

By adding, in the aforementioned surface-emission laser diode, Mg (magnesium) to the semiconductor layer containing Al, In and P as the major components as a p-type dopant, and by adding C (carbon) to the semiconductor layer containing Al, Ga and As as the major components as a p-type dopant, it becomes possible to suppress the diffusion of dopant and reduce the memory effect, and it becomes possible to carry out the doping with good controllability. Thereby, a doping profile near the designed profile is obtained, and degradation of the crystal quality of the active layer is suppressed. With this, a high output power surface-emission laser diode having a low threshold value can be realized easily.

Further, with the aforementioned surface-emission laser diode, the efficiency of heat dissipation is improved and high output operation is realized easily by pseudo-constructing the AlGaInP mixed crystal by AlInP having small thermal resistance and GaInP.

Further, it becomes possible, with the user of the spacer layer of $(Al_aGa_{1-a})_bIn_{1-b}P$ ($0<a\leq1$, $0\leq b\leq1$) in the surface-emission laser diode, to increase the bandgap difference between the spacer layer and the quantum well active layer as compared with the case of forming the spacer layer by the AlGaAs system. Thereby, the threshold of laser oscillation is decreased, the efficiency of laser oscillation is improved, and high output operation is realized. Further, by using $Ga_cIn_{1-c}P_dAs_{1-d}$ ($0\leq c\leq1$, $0\leq d\leq1$) for the quantum well active layer and by $Ga_eIn_{1-e}P_fAs_{1-f}$ ($0\leq e\leq1$, $0\leq f\leq1$) for the barrier layers, it becomes possible to construct the active layer by a material free from Al, and the active region formed of the quantum well active layer and the adjacent layer becomes Al-free. Thereby, it becomes possible to reduce the incorporation of oxygen, and formation of the non-optical recombination centers is suppressed. Thereby, it becomes possible to realize a surface-emission laser diode of long lifetime. Thus, a high output power surface-emission laser diode of the wavelength of 850 nm or shorter and having a large gain for the active layer, low threshold value of laser oscillation and good reliability is realized.

Further, with the aforementioned surface-emission laser diode, it is possible to reduce the threshold value of laser oscillation by the effect of strain, by using the compressive strain composition for the quantum well active layer, and the efficiency of laser oscillation is improved. Further, as a result of improvement of the carrier confinement efficiency and increase of the gain attained by the use of the strained quantum well active layer, the threshold of laser oscillation is decreased further, and it becomes possible to reduce the reflectivity of the exit-side DBR. With this, it becomes possible to increase the laser output further.

Further, it becomes possible to increase the degree of freedom of design such as use of the quantum well active layer of larger strain, by compensating for the strain of the quantum well active layer in the surface-emission laser diode. Further, because the material of the smaller lattice constant has a larger bandgap in the semiconductor material of the GaInPAs system and used for the barrier layer, it becomes possible to increase the band discontinuity to the quantum well active layer. Thereby, the gain is increased and it becomes possible to carry out low-threshold value operation and high output power operation.

Further, with the aforementioned surface-emission laser diode, it becomes possible, by constructing the lower reflector such that the lower reflector includes AlAs having small thermal resistance for the low refractive index layers, the dissipation characteristics of heat generated in the active layer are improved, and the temperature rise at the time of driving is suppressed. Thus, a high output power surface-emission laser diode of excellent temperature characteristics is obtained.

Further, with the aforementioned surface-emission laser diode, junction of the AlGaInP system material and the AlGaAs system material is made easily by interposing an intermediate layer of small Al content between the low refractive index layer and the high refractive index layer of the semiconductor distributed Bragg reflector. Thus, in the case of laminating the Al$_y$Ga$_{1-y}$As ($0 \leq y$, $x \leq 1$) high refractive index layer on the $(Al_aGa_{1-a})In_{1-b}P$ ($0 < a \leq 1$, $0 \leq b \leq 1$) low refractive index layer, it becomes possible to conduct the growth of the high refractive index layer in a wide conditional range by reducing the Al content at the interface. Further, with such a construction, the band discontinuity of the valence band is decreased and the resistance against the current flowing in the stacked direction is reduced.

Further, with the aforementioned surface-emission laser diode, it becomes possible, as a result of the use of the AlGaInP system spacer layer, it becomes possible to realize the carrier confinement equivalent to or superior to the case of the surface-emission laser diode of the 780 nm band that uses the active layer of the AlGaAs system, even in the case of using the Al-free active layer (quantum well layer and barrier layer), as long as the compositional wavelength is 680 nm or longer.

Further, with the aforementioned surface-emission laser diode, it becomes possible to reduce the adversary effects to the device characteristics of the semiconductor layer, such as decrease of bandgap caused by formation of natural super lattices or deterioration of surface morphology or formation of non-optical recombination centers caused by hillock (hill-like defect), by using the (100) GaAs substrate having a surface orientation inclined in the direction of a (111)A surface with an angle in the range from 5° to 20°. Further, it becomes possible to conduct polarization control by utilizing the nature of the anisotropic substrate. When it is not possible to attain the polarization control as in the case of using the (311)B substrate, which is currently thought most promising, and the anisotropy of optical gain attained with the use of inclined substrate becomes inevitably small, the surface-emission laser diode can successfully compensate for the foregoing decrease of anisotropy of optical gain by providing a compressive strain to the quantum well active layer and induce increase of anisotropy of the optical gain. Thereby, it becomes possible to improve the controllability of the polarization direction with such a surface-emission laser diode.

Further, with the aforementioned surface-emission laser diode, it becomes possible to improve the controllability of the polarization direction, by providing anisotropy to the peripheral shape of the active layer as viewed from the optical exit direction of the surface-emission laser diode such that there is formed a shape elongated in the (111)A direction, such that the effect of increase of the optical gain in the inclined direction of the substrate ((111)A surface direction) is added.

Further, by forming the surface-emission layer diode on the same substrate in plural numbers, it is possible to construct a surface-emission laser diode array. Thus, precision and controllability of mesa formation are improved, and it becomes possible to produce the surface-emission laser diode array having uniform laser characteristics and good processing reproducibility, with high yield and low cost.

Particularly, with the use of the aforementioned surface-emission laser diode, thermal interference between the elements in the array is suppressed because of the improvement of the heat dissipation characteristics, and it becomes possible to form a high-density array in which the surface-emission laser diode elements are disposed with closer distance from each other.

Further, by applying the construction of integrating a large number of surface-emission laser diodes that are, capable of performing high output power operation, on the same substrate for the image writing optical system of an electron photographic image forming apparatus, it becomes possible to achieve high-speed writing by using plural beams at the same time, and the writing speed is improved significantly. Thereby, it becomes possible to carry out printing without decreasing the speed even in the case the density of the writing dots is increased. Further, when compared at the same dot density, the image forming apparatus that uses such a surface-emission laser diode enables printing at higher speed as compared with the conventional image forming apparatuses. Further, when the aforementioned surface-emission laser diode is applied to communication, the data transmission is made by a large number of beams simultaneously, and high-speed communication is realized.

Further, the surface-emission laser diode operates at low power consumption, and thus, it becomes possible, when operated in the state of being incorporated into an apparatus, to reduce the temperature rise in the apparatus.

Further, by using the high output power surface-emission laser diode or the surface-emission laser diode array of such high output power surface-emission laser diodes for the writing optical source, it becomes possible to improve the printing speed as compared with the image forming apparatus that uses a conventional surface-emission laser diode.

Alternatively, in the case of printing at the conventional speed, it becomes possible to reduce the number of the laser arrays, and the yield of production of the surface-emission laser diode array chip is improved significantly. Further, it becomes possible to reduce the cost of the image forming apparatus. In the case the surface-emission laser diode capable of controlling the polarization plane is used, reliability of image formation is improved. Further, in the case a surface-emission laser diode free from Al in the active layer structural part formed of a quantum well active layer and a spacer layer is used, lifetime comparable to the surface-emission laser diode for telecommunication purposes such as the surface-emission laser diode of the 850 nm band is attained, and thus, it becomes possible to reuse the optical writing optical unit. Thereby, the load to the environment is reduced.

Further, by using the aforementioned surface-emission laser diode or the surface-emission laser diode array that uses such surface-emission laser diodes for the optical source of optical pickup, it becomes possible to realize a handy type optical pickup system of long battery life. In conventional compact disk devices, a semiconductor layer of 780 nm wavelength is used for the optical writing and playback of recording medium, wherein a surface-emission laser diode has power consumption smaller than that of an edge-emission laser diode by a factor of 1/10.

Further, by using the aforementioned surface-emission laser diode or the surface-emission laser diode array of such surface-emission laser diodes for the high-power optical source of optical transmission module or optical transceiver module, it becomes possible to construct an economical high-speed optical transmission system that uses a low cost POF (plastic optical fiber).

With the optical transmission that uses an acrylic POF, a surface-emission laser diode of the oscillation wavelength of 650 nm has been used conventionally for the optical source in view of the absorption loss characteristics of the optical fiber, while the use of the surface-emission laser diode in practical purposes is not been successful. Because of this, LEDs are used currently, while an LED is difficult to perform high-speed modulation, and it is indispensable to provide a laser diode in order to realize high-speed transmission exceeding 1 Gbps.

With the aforementioned surface-emission laser diode having the wavelength of 680 nm or longer, a large gain is attained for the active layer and it is possible to provide a large output. Further, the surface-emission laser diode has excellent high temperature characteristics. Thus, by using such a surface-emission laser diode, it is possible to achieve, in spite of the fact there is an increase of absorption loss by the fiber, optical transmission of short range. Thus, an economical high-speed optical transmission module or an optical transceiver module that combines a low cost POF with a low cost optical source of surface-emission laser diode is realized. Further, an optical communication system that uses these is realized. Because such an optical communicating system is extremely economical, it is suited for the optical communication systems of home use, or for use in office rooms, or for the use inside an apparatus.

BEST MODE FOR IMPLEMENTING THE INVENTION

Figure 1:
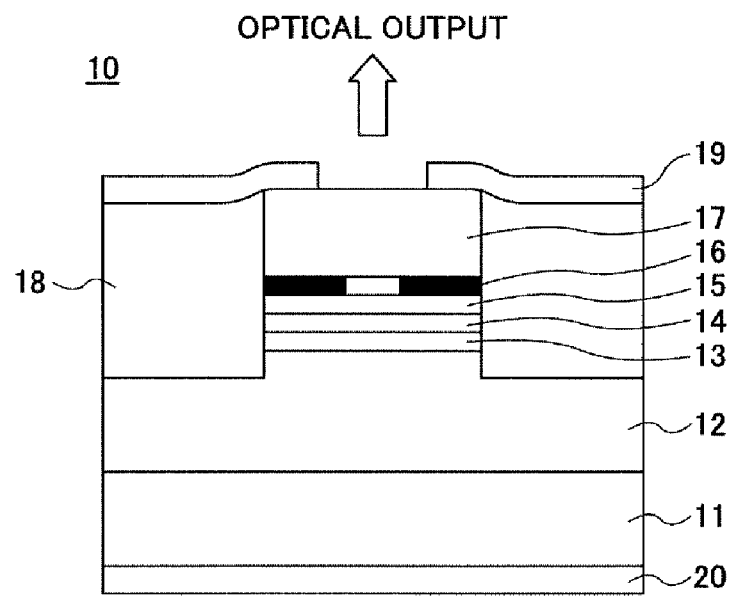
FIG. 1 is a diagram showing a construction example of a general surface-emission laser diode.

Hereinafter, various modes of the present invention will be explained with reference to the drawings.
(First Mode)

According to a first mode of the present invention, there is provided a surface-emission laser diode, comprising:
a semiconductor substrate;
a cavity region formed over said semiconductor substrate, said cavity region comprising an active layer structural part including at least one quantum well active layer producing a laser light and barrier layers, and a spacer layer provided in a vicinity of said active layer structural part, said spacer layer comprising at least one material; and
an upper reflector and a lower reflector provided over said semiconductor substrate at a top part and a bottom part of said cavity region,
said cavity region, said upper reflector and said lower reflector forming a mesa structure over said semiconductor substrate,
said upper reflector and said lower reflector constituting a semiconductor distributed Bragg reflector having a periodic change of refractive index and reflecting an incident light by interference of optical waves,
at least a part of said semiconductor distributed Bragg reflector being formed of a layer of small refractive index of $Al_xGa_{1-x}As$ ($0<x\leq1$) and a layer of large refractive index of $Al_yGa_{1-y}As$ ($0\leq y<x\leq1$),
said lower reflector being formed of a first lower reflector having a low-refractive index layer of AlAs and a second lower reflector formed on said first lower reflector, said second lower reflector having a low-refractive index layer of AlGaAs, wherein any one layer constituting said cavity region contains In.

With this first mode of the present invention, any one layer constituting the cavity region contains In, and the lower semiconductor DBR contains an AlAs/(Al)GaAs-DBR having excellent heat dissipation characteristic. Thus, the precision and reproducibility of mesa formation is improved, and it becomes possible to provide the AlAs/(Al)GaAs-DBR to the region close to the cavity region.

With this, temperature rise at the time of driving is suppressed, and a high output power surface-emission laser diode having excellent temperature characteristics is provided. At the same time, a surface-emission laser diode having highly uniform laser characteristics, excellent reproducibility for processing and excellent yield is provided.

With the surface-emission laser diode of the first mode, it is possible to introduce In to at least the lower spacer layer and the upper spacer layer among the layers constituting the cavity region.

According to such a construction in which In is contained in the spacer layer having much larger thickness than the active layer structural part among the layers constituting the cavity region, it becomes possible to form the mesa structure with further improved reproducibility and further improved precision, and with this, it becomes possible to obtain a surface-emission laser diode of further improved temperature characteristics, higher output power and further improved uniformity in laser characteristics, with higher reproducibility of processing and with higher yield.

Further, it is preferable that the second lower reflector of the surface-emission laser diode according to the mode of the present invention includes 10 pairs or less.

With such a construction, the thickness of the second lower semiconductor DBR is set to be larger than the precision of the mesa etching and at the same time minimum. With this, it becomes possible to produce the surface-emission laser diode with improved yield.

Further, the surface emission laser diode of the first mode of the present invention can be fabricated by: forming, on a semiconductor substrate, a cavity region comprising an active layer structural part including at least one quantum well active layer producing a laser light and a barrier layer; and forming a spacer layer of at least one material so as to be provided in a vicinity of said active layer structural part to form of a stacked film, such that, in the stacked film, an upper reflector and a lower reflector are provided at a top part and a bottom part of said cavity region, and processing the stacked film by a dry etching process to form a mesa structure. Thereby, with the present mode, In is incorporated to any one layer constituting said cavity region, and the height of said mesa structure is controlled by monitoring light emission of In in the dry etching step.

According to the fabrication process of the foregoing mode, the height of the mesa structure is controlled in the step of forming the mesa structure by the dry etching of the stacked film, by monitoring the light emission of In. Because the dry etching is conducted while monitoring the light emission of In from the cavity layer, it is possible to detect the cavity layer positively, and with this, it becomes possible to form the mesa structure with high reproducibility and high precision. As a result, it becomes possible with the present mode to produce the first surface-emission laser diode with high reproducibility and yield.

Figure 2:
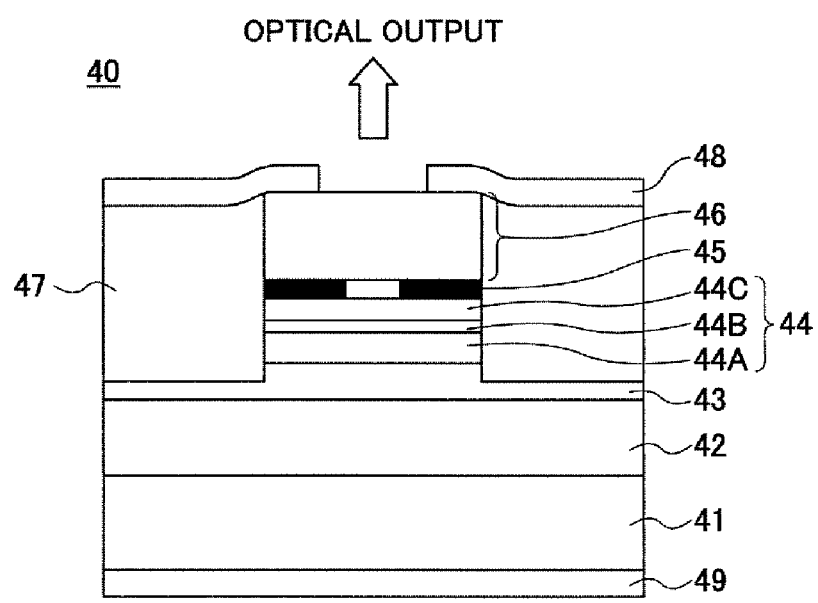
FIG. 2 is a diagram showing the fundamental construction example of a surface-emission laser diode of a first mode.

FIG. 2 shows the fundamental construction of a surface-emission laser diode 40 according to the first mode of the present invention.

Referring to FIG. 2, the surface-emission laser diode 40 has a VCSEL stacked structure formed of consecutive lamination of: a first lower semiconductor DBR 42 of AlAs/Al$_{1-u}$Ga$_u$As (0<u≦1) formed on a monocrystalline semiconductor substrate 41 of GaAs, InP, GaP, GaNAs, Si, Ge, or the like, directly or via an intermediate layer by way of an MOCVD process or an MBE process; a second lower DBR 43 of Al$_{1-v}$Ga$_v$As/Al$_{1-w}$Ga$_w$As (0<v<1, 0<w≦1, v<w); a cavity layer 44 of a lower spacer layer 44A, an active layer 44B, and an upper spacer layer 44C, the cavity layer 44 containing In in any one layer of the lower spacer layer 44A, the active layer 44B and the upper spacer layer 44C; a selective oxidation layer 45 of Al$_{1-t}$Ga$_t$As (0≦t≦0.05); and an Al$_{1-v}$Ga$_v$As/Al$_{1-w}$Ga$_w$As (0<v<1, 0<w≦1, v<w) upper DBR 46.

Here, it should be noted that the layer containing In is formed of a compound semiconductor material represented as Al$_{1-x-y}$Ga$_x$In$_y$As$_{1-z}$P$_z$ (0≦x≦1, 0<y≦1, 0<(x+y)≦1, 0≦z≦1), and typically formed of GaInP, GaInAsP, GaInAs, AlGaInAs, AlGaInAsP, wherein the layer may further contain other group III or group V element such as B, N, Sb, Tl, or the like.

Table 1 represents examples of such a VCSEL stacked structure.

TABLE I

| | Wavelength Band (nm) | Quantum Well Active Layer (well/barrier) | Upper/lower Spacer Layer | Upper Semiconductor DBR |
|---|---|---|---|---|
| Ex 1 | 650 | InGaP/AlGaInP | (Al$_{0.5}$Ga$_{0.5}$)$_{0.5}$In$_{0.5}$P | Al$_{0.95}$Ga$_{0.05}$As/Al$_{0.5}$Ga$_{0.5}$As |
| Ex 2 | 780 | GaInAsP/AlGaInP | (Al$_{0.5}$Ga$_{0.5}$)$_{0.5}$In$_{0.5}$P | Al$_{0.95}$Ga$_{0.05}$As/Al$_{0.3}$Ga$_{0.7}$As |
| Ex 3 | 850 | GaAs/InGaAsP | In$_{0.27}$Ga$_{0.73}$As$_{0.44}$P$_{0.56}$ | Al$_{0.95}$Ga$_{0.05}$As/Al$_{0.15}$Ga$_{0.85}$As |
| Ex 4 | 980 | GaInAs/GaAs | GaIn(As)P | Al$_{0.95}$Ga$_{0.05}$As/GaAs |
| Ex 5 | 1300 | GaInNAs/GaAs | GaIn(As)P | Al$_{0.95}$Ga$_{0.05}$As/GaAs |

| | Wavelength Band (nm) | First Lower Semiconductor DBR | Second Lower Semiconductor DBR |
|---|---|---|---|
| Ex 1 | 650 | AlAs/Al$_{0.5}$Ga$_{0.5}$As | Al$_{0.95}$Ga$_{0.05}$As/Al$_{0.5}$Ga$_{0.5}$As |
| Ex 2 | 780 | AlAs/Al$_{0.3}$Ga$_{0.7}$As | Al$_{0.95}$Ga$_{0.05}$As/Al$_{0.3}$Ga$_{0.7}$As |
| Ex 3 | 850 | AlAs/Al$_{0.15}$Ga$_{0.85}$As | Al$_{0.95}$Ga$_{0.05}$As/Al$_{0.15}$Ga$_{0.85}$As |
| Ex 4 | 980 | AlAs/GaAs | Al$_{0.95}$Ga$_{0.05}$As/GaAs |
| Ex 5 | 1300 | AlAs/GaAs | Al$_{0.95}$Ga$_{0.05}$As/GaAs |

Next, a mesa mask pattern is formed by a photoresist, or the like, and the stacked structure thus formed is held in a processing vessel of a dry etching apparatus. Further, a halogen gas such as $Cl_2$, $BCl_3$, $SiCl_4$, $CCl_4$, $CF_4$, or the like, is introduced into the processing vessel, and a mesa etching is conducted by d dry etching process that uses plasma such as reactive ion beam etching (RISE) method, induction coupled plasma (ICP) etching method, reactive ion etching method (RIE), or the like.

During such mesa etching process, plasma atomic emission spectrometry is conducted via an observation window provided to the processing vessel of the dry etching apparatus, and the time change of emission intensity of In at the wavelength of 451 nm is monitored. With the present invention, the atomic emission of In is detected only when the cavity region is etched, and thus, it becomes possible to stop the etching positively while the etching is in progress inside the second semiconductor DBR 43.

Next, the Al(Ga)As layer for selective oxidation 45 is processed in water vapor, and a current confinement structure of $Al_xO_y$ is formed. Next, the space surrounding the mesa structure thus formed is filled with an insulation film 47 of polyimide or SiO2 except for the part where electrode is to be provided and the part used for optical output. By forming the insulation film 47, the surface-emission laser element is planarized.

Further, a p-side electrode 48 and an n-side electrode 49 are formed at respective locations, and fabrication of the surface-emission laser diode 40 of FIG. 2 is completed.

With the surface-emission laser diode 40, positive carriers and negative carriers are injected respectively from the p-side electrode 48 and the n-side electrode 49, and there are caused photoemission in the active layer 44B. With this, it becomes possible to obtain a laser light in the vertical direction to the substrate 41. While FIG. 2 shows the construction that provides an optical output in the upward direction of the substrate 41, it is also possible to construct such that optical output is obtained in the downward direction of the substrate 41.

Here, it should be noted that all of the lower spacer layer 44A, the active layer 44B, and the upper spacer layer 44C constitutes the cavity 44, and the thickness of the cavity, defined as a sum of these, becomes $(N_0+1) \times \lambda/n$. In many cases, the cavity thickness is $\lambda/n$. Here, $N_0$ is an integer of 0 or larger, $\lambda$ is the oscillation wavelength, and n is the refractive index of the semiconductor constituting the cavity 44.

Further, because the active layer 44B is usually implemented in the form of thin quantum well structure, the majority of the cavity length is occupied by the upper and lower spacer layers 44A and 44C. Further, the thickness of the semiconductor DBR 43 is $(1+2 \times N_0) \times \lambda/(4 \times n)$. In many cases, it is $\lambda/(4 \times n)$. Thus, the upper and lower spacer layers 44A and 44C have a thickness much larger than any other films in the stacked structure.

From this, strong photoemission of In is achieved at the time of the etching in the case the upper and lower spacer layers 44A and 44C contains In, and it becomes possible to control the endpoint of etching with high precision. With this, the reproducibility of the mesa etching is improved significantly.

Further, it becomes possible to control the variation of the etching depth, when the foregoing VSCEL stacked structure is etched on a single wafer by using the foregoing monitoring method, such that the bottom of the mesa structure is located within the range of 2 or 3 pairs of the foregoing second lower semiconductor DBR 43. Thus, even when variation of mesa height within the wafer is taken into consideration, or variation between the wafers when a large number of wafers are etched simultaneously is taken into consideration, it is possible to achieve the necessary etching control by using ordinary etching process, provided that there are only ten repetitions in the maximum for the high refractive index layer and the low refractive index layer in the second lower semiconductor DBR 43.

Thus, according to the present mode, it becomes possible to use the construction in which the AlAs/(Al)GaAs-DBR43 of small thermal resistance is provided to the vicinity of the cavity of the surface-emission laser diode. Thereby, the efficiency of heat dissipation is improved and the temperature rise at the time of driving is suppressed, and a high output power surface-emission laser diode of excellent temperature characteristics is obtained.

In the case of using the material or thickness in which the oxidation rate of the low refractive indeed layer in the first lower semiconductor DBR 42 is larger than the oxidation rate of the selectively oxidized semiconductor layer 45, the mesa etching should not reach the first lower semiconductor DBR 42. Such a situation is not limited to the case in which the selective oxidized layer 45 and the low refractive index layer of the first lower semiconductor DBR 42 are both formed of AlAs. For example, there can be a case in which the layer for selective oxidation 45 is not AlAs but contains a small amount of Ga and the low refractive index layer of the first lower semiconductor DBR is not AlAs but also contains Ga.

Even in such cases, however, satisfactory heat dissipation effect is attained as long as the low refractive index layer of the second lower semiconductor DBR 43 is formed of the material having the oxidation rate smaller than the oxidation rate of the layer for selective oxidation 45 and when the low refractive index layer of the first lower semiconductor DBR 42 is of the composition or material in which the thermal resistance is smaller than the low refractive index layer of the second layer semiconductor DBR 43.

Further, in addition to the method of simply monitoring the photo emission intensity of In, it is also possible, with the emission spectrometry of In, to monitor the ratio of the emission intensity of In to the emission intensity of other constituent element, or the ratio of the emission intensity of In to the emission intensity of the wavelength different from any of the foregoing, so as to cancel out the effect of variation of the plasma state.

In order to control the etching bottom to be right underneath the cavity, it is also possible to use GaInP or AlGaInP for the uppermost layer of the lower semiconductor DBR 43 and use GaAs or AlGaAs for the upper layer that includes the cavity. With such a case, it becomes possible to conduct selective oxidation by using a $H_2SO_4/H_2O_2/H_2O$ solution. However, with such a wet etching process, control of the mesa width is difficult, and there tends to arise the problems in that, because of etching anisotropy, there is formed a mesa of asymmetric shape. In view of the foregoing situations, it is preferable to conduct the mesa etching by a dry etching process.

With the foregoing construction, it should be noted that, while the AlAs selective oxidized layer 45 is provided in the vicinity of the active layer 44B, the location is not limited, in view of the cases in which it is provided inside the DBR as the low refractive index layer of the upper semiconductor DBR 46 or the low refractive index layer of the lower semiconductor DBRs 42 and 43.

Further, while explanation has been made for the case in which In is contained only in the cavity region 44, all what is required is that the situation of the etching of the cavity region 44 is grasped and that the etching does not reach the first lower reflector 42, and thus, it is also possible to provide a layer containing In other than the cavity region, such as a part of the reflector 43 closest to the cavity region 44.

(Second Mode)

According to a second mode, there is provided a surface emission laser diode, in which a part of the spacer layers 44A and 44C is formed of $(Al_aGa_{1-a})_bIn_{1-b}P$ ($0<a\leq 1$, $0\leq b\leq 1$) in the surface-emission laser diode 40 of the first mode and the active layer 44B is formed of a quantum well layer of $Ga_cIn_{1-c}P_dAs_{1-d}$ ($0\leq c\leq 1$, $0\leq d\leq 1$) and a barrier layer of $Ga_eIn_{1-e}P_fAs_{1-f}$ ($0\leq e\leq 1$, $0\leq f\leq 1$).

By using $(Al_aGa_{1-a})_bIn_{1-b}P$ ($0<a\leq 1$, $0\leq b\leq 1$) for a part of the spacer layers 44A and 44C, it becomes possible to increase the bandgap difference between the space layer and the quantum well active layer as compared with the case of forming the spacer layer by the AlGaAs system.

Table 2 shows the bandgap difference caused between the spacer layer and the quantum well layer and between the barrier layer and the quantum well layer for the typical material compositions used in the surface-emission layer diode of the 780 nm and 850 nm wavelengths that uses the AlGaAs (spacer)/AlGaAs (quantum well active layer) system and further in the surface-emission laser diode of the 780 nm wavelength band that uses the AlGaInP (spacer) layer/GaInPAs (quantum well active layer).

TABLE 2

| Wavelength | | 780 nm<br>Spacer layer/quantum well active layer<br>AlGaAs/AlGaAs system material |
|---|---|---|
| Spacer layer | | $Al_{0.6}Ga_{0.4}As$<br>(Eg = 2.0226 eV) |
| Active layer | Quantum well active layer | $Al_{0.12}Ga_{0.88}As$<br>(Eg = 1.5567 eV) |
| | Barrier layer | $Al_{0.3}Ga_{0.7}As$<br>(Eg = 1.7755 eV) |
| Eg difference (ΔEg) between spacer layer and quantum well layer | | 465.9 meV |
| Eg difference (ΔEg) between barrier layer and quantum well layer | | 218.8 meV |

| Wavelength | | 780 nm<br>AlGaInP/GaInPAs system material |
|---|---|---|
| Spacer layer | | $(Al_xGa_{1-x})_{0.5}In_{0.5}P$<br>(Eg(x = 0.7) = 2.289 eV) |
| Active layer | Quantum well active layer | GaInPAs (compressive strain)<br>(Eg = 1.5567 eV) |
| | Barrier layer | $Ga_xIn_{1-x}P$ (tensile strain)<br>(Eg(x = 0.6) = 2.02 eV) |
| Eg difference (ΔEg) between spacer layer and quantum well layer | | 743.3 meV |
| Eg difference (ΔEg) between barrier layer and quantum well layer | | 463.3 meV |

| Wavelength | | 850 nm (Ref.)<br>AlGaAs/GaAs system material |
|---|---|---|
| Spacer layer | | $Al_{0.6}Ga_{0.4}As$<br>(Eg = 2.0226 eV) |
| Active layer | Quantum well active layer | GaAs<br>(Eg = 1.42 eV) |
| | Barrier layer | $Al_{0.3}Ga_{0.7}As$<br>(Eg = 1.7755 eV) |

TABLE 2-continued

| | |
|---|---|
| Eg difference (ΔEg) between spacer layer and quantum well layer | 602.6 meV |
| Eg difference (ΔEg) between barrier layer and quantum well layer | 355.5 meV |

As can be seen in Table 2, it becomes possible to secure a large bandgap difference with the surface-emission laser diode of the 780 nm band that uses the AlGaInP (spacer layer)/GaInPAs (quantum well active layer) system as compared with the surface-emission laser diode of the 780 nm wavelength band of the AlGaAs/AlGaAs system or the surface-emission laser diode of the 850 nm band of the AlGaAs/AlGaAs system.

Further, with the surface-emission laser diode of such a construction, it is possible to use a compressive strain composition for the quantum well active layer. With increase of strain, band splitting between the heavy holes and light holes is increased, while this leads to increase of the gain and decrease of threshold value of laser oscillation. Thereby, the efficiency of laser oscillation is improved and the laser output is increased. It should be noted that this effect is not achieved with the surface-emission laser diode of the 850 nm band that uses the AlGaAs/AlGaAs system.

Thus, according to the surface-emission laser diode of the present invention that uses the AlGaInP/GaInPAs material system, the threshold value is decreased as compared with the surface-emission laser diode of 850 nm that uses the AlGaAs/AlGaAs system, and it becomes possible to realize a high output power laser of improved laser oscillation efficiency.

Further, according to the surface-emission laser diode of the second mode, the efficiency of carrier confinement is improved and the threshold value is decreased also by the increase of gain as a result of use of the strained quantum well active layer, and as a result, it becomes possible to reduce the reflectivity of the exit-side DBR. With this, it is possible to attain further increase of the optical output.

Further, with the surface-emission laser diode of the second mode, the quantum well active layer is formed of $Ga_cIn_{1-c}P_dAs_{1-d}$ ($0\leq c\leq 1$, $0\leq d\leq 1$) and the barrier layer is formed of $Ga_eIn_{1-e}P_fAs_{1-f}$ ($0\leq e\leq 1$, $0\leq f\leq 1$), while it should be noted that this material is free from Al, and thus, incorporation of oxygen into the quantum well active layer is reduced because of the fact that the active layer structural part 44, formed of the quantum well active layer and the layer adjacent thereto, is free from Al. Thereby, formation of non-optical recombination center can be suppressed and it becomes possible to realize a surface-emission laser diode of long lifetime.

Thus, by using AlGaInP material for a part of the spacer layers 44A and 44C and by using GaInPAs for the barrier layer or quantum well active layer, the optical gain of the active layer is increased, and it becomes possible to realize a reliable high output power surface-emission laser diode that has a low threshold value and oscillates at the wavelength band shorter than 850 nm.

In order to attain the foregoing effect, it is preferable to consider the surface orientation of the substrate 41 as explained below.

In the surface-emission laser diode that uses AlGaInP or GaInP for the active region, in particular, it is preferable to use a (100) GaAs substrate having a surface orientation inclined in the direction of a (111)A surface by an angle (inclination angle) of the range of 5° to 20° for the substrate 41. The reason of this is that, when the surface orientation of the substrate is close to (100), there is caused problems such as decrease of bandgap by formation of natural superlattices, deterioration of surface morphology caused by hillock (hill-like defect), formation of non-optical recombination centers, and the like, and there is a possibility that the device characteristics of the laser diode formed on the substrate is adversary affected.

When the surface orientation of the substrate is inclined from (100) surface to the direction of (111)A surface, formation of the natural superlattice is suppressed in correspondence to the inclination angle. Thus, the bandgap changes sharply in the range of the inclination angle of 10° to 15°, and thereafter, the band gap approaches the nominal bandgap (bandgap value of the mixed crystal). Further, formation of hillocks is gradually suppressed.

On the other hand, when the inclination angle in the direction of (111)A surface exceeds 20°, crystal growth on the substrate becomes difficult. Thus, with the red color laser (630 nm to 680 nm) that uses the AlGaInP material, the substrate inclined to the angle in the range of 5° to 20° (in many cases in the range of 7° to 15°) is used commonly. This applies not only to the case AlGaInP is used for the spacer layer (cladding layer), but also to the case in which GaInP is used for the barrier layer as in the example of Table 2. Further, in anticipation of adversary effect caused also in the case the barrier layer and the quantum well active layer are formed of GaInPAs, it is preferable to use a (100) GaAs substrate having a surface orientation inclined in the direction of (111)A surface with the angle in the range of 5° to 20° (more preferably with the angle in the range of 7° to 15°), for the growth of these materials.

On the other hand, in the case the surface orientation of the substrate 41 is inclined in the direction of (111)A surface, it is not possible to use the control technology of polarization angle (polarization direction) that uses the optical gain anisotropy of (311)B substrate and thought as being most promising technology at the current juncture. Thus, while the present mode can suppress the cost of the substrate by using an inclination angle (range of 5° to 20°) smaller than the (311)B substrate (inclination angle of 25°) and that cleaving is made easily and handling of the substrate becomes easier, the optical gain anisotropy that can be obtained becomes inevitably small.

Thus, the present mode compensates for the decrease of the optical gain anisotropy by the increase of the optical gain anisotropy induced by applying a compressive strain to the quantum well active layer.

It should be noted that, while the foregoing example limits the wavelength to be shorter than 850 nm, this is merely because a very large advantage is obtained with this wavelength range, and similar effect is obtained also in the wavelength longer than 850 nm.

Thus, with the present mode, a surface-emission laser diode of high output power and excellent reliability is obtained such that the surface laser diode operates at the wavelength of 850 nm or shorter and has the feature of, in addition to the features of the first mode of large gain for the active layer and reduced threshold value, controlled polarization direction.

(Third Mode)

According to a third mode, there is provided a surface-emission laser diode, comprising: a (100) GaAs substrate having a surface orientation inclined in a direction of a (111)A surface by an angle of 5° to 20°; a cavity region provided over said GaAs substrate, said cavity region including an active layer structural part comprising at least one layer of quantum well active layer producing a laser light and barrier layers, and a spacer layer provided in a vicinity of said active layer structural part, said spacer layer comprising at lease one material; and an upper reflector and a lower reflector provided at a top part and a bottom part of said cavity region, said cavity region and said upper and lower reflectors forming a mesa structure over said GaAs substrate, said upper reflector and said lower reflector comprising a semiconductor distributed Bragg reflector having a periodic change of refractive index and reflecting an incident light by interference of optical waves, at least a part of said semiconductor distributed Bragg reflector being formed of a layer of small refractive index of $Al_xGa_{1-x}As$ ($0<x\leq1$) and a layer of large refractive index of $Al_yGa_{1-y}As$ ($0\leq y<x=1$), a part of said spacer layer comprising $(Al_aGa_{1-a})_bIn_{1-b}$ ($0<a\leq1$, $0\leq b\leq1$), said quantum well active layer comprising $Ga_cIn_{1-c}P_dAs_{1-d}$ ($0\leq c\leq1$, $0\leq d\leq1$), said barrier layers comprising $Ga_eIn_{1-e}P_fAs_{1-f}$ ($0\leq e\leq1$, $0\leq f\leq1$), said quantum well active layer having a compressive strain, said active layer structural part having a shape anisotropy elongated in a direction of a (111)A surface as viewed from a direction of light emission.

When controlling the polarization angle (polarization direction) by using the optical gain anisotropy caused by inclining the surface orientation of the substrate in the direction of (111)A surface with the surface emission laser diode of the present invention, it is not possible to utilize the effect of the (311)B substrate, which is thought as being most promising at the current juncture, because of the use of the inclination angle (range of 5° to 20°), which is smaller than the (311)B substrate (inclination angle of 25°).

Thus, with the third mode of the present invention, this decrease is compensated for by the increase of the optical gain anisotropy obtained by applying a compressive strain to the quantum well active layer, and further by providing anisotropy to the outer shape of the active layer as viewed from the direction of optical emission of the surface-emission laser diode, such that the optical gain in the inclined direction ((111)A surface direction) of the substrate is increased by providing an elongated shape in the direction of (111)A surface to the active layer. With this, the optical gain in the direction of the inclination angle (direction of (111)A surface) is increased further and controllability of the deflection angle is improved.

(Fourth Mode)

A fourth mode of the present invention provides a surface-emission laser diode of the second or third mode in which the barrier layer has a tensile strain.

In the material of the GaInPAs system used for the barrier layer of the quantum well active layer in the surface-emission laser diode, GaInP has the largest bandgap when compared with the same lattice constant. Further, a larger bandgap is obtained with the material having a smaller lattice constant. Thus, by using a material of the GaInP system of small lattice constant for the barrier layer, it is possible to realize a large band discontinuity between the barrier layer and the quantum well active layer, and it becomes possible to increase the gain of the surface-emission laser diode. With this, the surface-emission laser diode can perform high output power operation with low threshold value. For example, it should be noted that the bandgap of the tensile-strained $Ga_{0.6}In_{0.4}P$ layer is 2.02 eV, the bandgap of the $Ga_{0.5}In_{0.5}P$ lattice matched layer is 1.87 eV, and thus the $Ga_{0.6}In_{0.4}P$ tensile strain layer has a bandgap larger by 150 meV.

(Fifth Mode)

With the fifth mode of the present invention, there is provided a surface-emission laser diode of any of the second through fourth modes in which the oscillation wavelength is about 680 nm or longer.

Comparing the surface-emission laser diode of the present mode with the surface-emission laser diode of 780 nm that uses the active layer of the AlGaAs/AlGaAs system, it can be seen that the bandgap difference between the $Al_xGa_{1-x}As$ (x=0.6, Eg=2.0226 eV), which provides the largest bandgap in the typical compositional range of the $Al_xGa_{1-x}As$ ($0<x\leq1$) system spacer layer used with the surface-emission laser diode of the AlGaAs/AlGaAs system, and the active layer of the compositional wavelength of 780 nm (Eg=1.5567 eV) is generally equal to the bandgap difference (460 meV) between $(Al_aGa_{1-a})_bIn_{1-b}P$ (a=0.7, b=0.5, Eg=2.289 eV), which provides the largest bandgap in the typical compositional range of the $(Al_aGa_{1-a})_bIn_{1-b}P$ ($0<a\leq1$, $0\leq b\leq1$) spacer layer used with the surface emission laser diode of the present mode and the active layer of the compositional wavelength of 680 nm (Eg=1.8233 eV).

Further, with regard to the bandgap difference between the barrier layer and the quantum well active layer, it should be noted that the bandgap difference to the active layer of the compositional wavelength of 680 nm becomes about 200 meV, assuming that the barrier layer has the composition $Ga_eIn_{1-e}P_fAs_{1-f}$ (e=0.6, f=1, Eg=2.02 eV), while this is generally equal to the case of the 780 nm surface-emission laser diode of the active layer of the AlGaAs/AlGaAs system.

This means, that by using the spacer layer of the AlGaInP system, it becomes possible to achieve the carrier confinement equivalent or larger than the surface-emission laser diode of 780 nm that uses the AlGaAs/AlGaAs system active layer, even in the case the surface-emission laser diode is the one that uses the Al-free active layer (quantum well active layer and the barrier layer), as long as the compositional wavelength is longer than 680 nm. In practice, the characteristics equivalent or more are attained in view of the effect of the strained quantum well active layer.

(Sixth Mode)

According to the sixth mode, there is provided a surface-emission laser diode array in which plural surface-emission laser diodes of any of the first through fifth modes are constructed on a common substrate.

Generally, a surface-emission laser diode can easily construct a laser array in view of its surface-emission construction. Further, because each surface-emission laser diode element is formed with an ordinary semiconductor process, it is possible to form the individual surface-emission laser diode elements with high positional precision. Particularly, according to the present invention, controllability of etching at the time of mesa formation is improved, and as a result, there is attained an improvement of yield, and it becomes possible to reduce the production cost.

Further, according to the present invention, heat dissipation efficiency of the lower DBR is improved, and as a result, thermal interference between the elements in the array is reduced, and it becomes possible to increase the output of the individual devices and increase the formation density of the elements.

Further, by using the laser array in which a large number of high output power surface-emission laser diodes of the present invention, each having a polarization direction controlled in a predetermined direction, are integrated on a common substrate, it becomes possible to realize simultaneous writing by plural beams in a writing optical system of image forming apparatus, or the like, and the writing speed is improved significantly. Further, according to such a construction, it becomes possible to conduct printing without decreasing the printing speed even in the case the writing dot density is increased. In the same context, it is possible to increase the printing speed when the writing dot density is held constant. When such a laser array is applied to communication, it becomes possible to carry out simultaneous data transmission with plural beams, and high speed communicating becomes possible. Further, because the surface-emission laser diode operates with low power consumption, it becomes possible to suppress the temperature rise inside an apparatus when the laser diode is assembled into the apparatus.

(Seventh Mode)

According to a seventh mode of the present invention, there is provided an image forming apparatus that uses the surface-emission laser diode of any of the first through fifth modes or the surface-emission laser diode array of the sixth mode for the writing optical source.

Because the surface-emission laser diode or the surface-emission laser diode array of the present invention has a controlled polarization direction and operates with high output power, the image forming apparatus of the present embodiment is capable of performing high speed printing as compared with the image forming apparatus that uses a conventional surface-emission laser diode array. In the case the image forming apparatus is designed to provide a conventional printing speed, on the other hand, it becomes possible to reduce the number of the laser arrays used. Thereby, the yield of production of the surface-emission laser diode array chip is improved significantly, and the production cost of the image forming apparatus can be reduced. Further, because the surface-emission laser diode of the present embodiment uses an Al-free active layer for the active layer, it becomes possible to attain the lifetime equivalent to the lifetime (estimated of 100 million hours at room temperature is reported) of the communication purpose surface-emission laser diode such as the surface-emission laser diode of the 850 nm band, and thus, it becomes possible to reuse the optical unit for optical writing. With this, the load to the environment can be reduced.

(Eighth Mode)

According to an eighth mode of the present invention, there is provided an optical pickup system that uses the surface-emission laser diode according to any of the first through fifth modes or the surface-emission laser diode array of the sixth mode as the optical source.

Conventionally, a compact disk apparatus uses the wavelength of 780 nm for the writing and playback optical source to an optical media. Because the surface-emission laser diode has a power consumption smaller than that of an edge-emission laser diode by the factor of ten, it becomes possible to realize a handy type optical pickup system characterized by long battery life, by using the surface-emission laser diode of the 780 nm band for the playback optical source.

(Ninth Mode)

According to a ninth mode, there is provided an optical transmission module that uses the surface-emission laser diode of any of the first through fifth modes or the surface-emission laser diode array of the sixth mode.

With the optical transmission that uses an acrylic POF, a surface-emission laser diode of the oscillation wavelength of 650 nm has been used conventionally for the optical source in view of the absorption loss characteristics of the optical fiber, while the use of the surface-emission laser diode in practical purposes is not been successful. Because of this, LEDs are used currently, while an LED is difficult to perform high-speed modulation, and it is indispensable to provide a laser diode in order to realize high-speed transmission exceeding 1 Gbps.

With the surface-emission laser diode of the present invention having the wavelength of 680 nm or longer, a large gain is attained for the active layer and it is possible to provide a large output. Further, the surface-emission laser diode of the present invention has excellent high temperature characteristics. Thus, by using such a surface-emission laser diode, it is possible to achieve, in spite of the fact there is an increase of absorption loss by the fiber, optical transmission of short range. Thus, an economical high-speed optical transmission module that combines a low cost POF with a low cost optical source of surface-emission laser diode is realized.

(Tenth Mode)

According to a tenth mode of the present invention, there is provided an optical transceiver module that uses the surface-emission laser diode of any of the first through fifth modes or the surface-emission laser diode array of the sixth mode as an optical source.

With the optical transmission that uses an acrylic POF, a surface-emission laser diode of the oscillation wavelength of 650 nm has been used conventionally for the optical source in view of the absorption loss characteristics of the optical fiber, while the use of the surface-emission laser diode in practical purposes is not been successful. Because of this, LEDs are used currently, while an LED is difficult to perform high-speed modulation, and it is indispensable to provide a laser diode in order to realize high-speed transmission exceeding 1 Gbps.

With the surface-emission laser diode of the present invention having the wavelength of 680 nm or longer, a large gain is attained for the active layer and it is possible to provide a large output. Further, the surface-emission laser diode of the present invention has excellent high temperature characteristics. Thus, by using such a surface-emission laser diode, it is possible to achieve, in spite of the fact there is an increase of absorption loss by the fiber, optical transmission of short range. Thus, an economical high-speed optical transceiver module that combines a low cost POF with a low cost optical source of surface-emission laser diode is realized.

(Eleventh Mode)

According to an optical communication system of the eleventh mode of the present invention, there is provided an optical communication system that uses the surface-emission laser diode according to any of the first through fifth modes or the surface-emission laser diode array of the sixth mode as the optical source.

With the optical transmission that uses an acrylic POF, a surface-emission laser diode of the oscillation wavelength of 650 nm has been used conventionally for the optical source in view of the absorption loss characteristics of the optical fiber, while the use of the surface-emission laser diode in practical purposes is not been successful. Because of this, LEDs are used currently, while an LED is difficult to perform high-speed modulation, and it is indispensable to provide a laser diode in order to realize high-speed transmission exceeding 1 Gbps.

With the surface-emission laser diode of the present invention having the wavelength of 680 nm or longer, a large gain is attained for the active layer and it is possible to provide a large output. Further, the surface-emission laser diode of the present invention has excellent high temperature characteristics. Thus, by using such a surface-emission laser diode, it is possible to achieve, in spite of the fact there is an increase of absorption loss by the fiber, optical transmission of short range. Thus, an economical high-speed optical transceiver module that combines a low cost POF with a low cost optical source of surface-emission laser diode is realized.

Because such a system is extremely economical, it is suited for providing an optical communication system used in common homes and in office rooms or in an apparatus.

Hereinafter, examples of the present invention will be explained.

EXAMPLE 1

Figure 3:
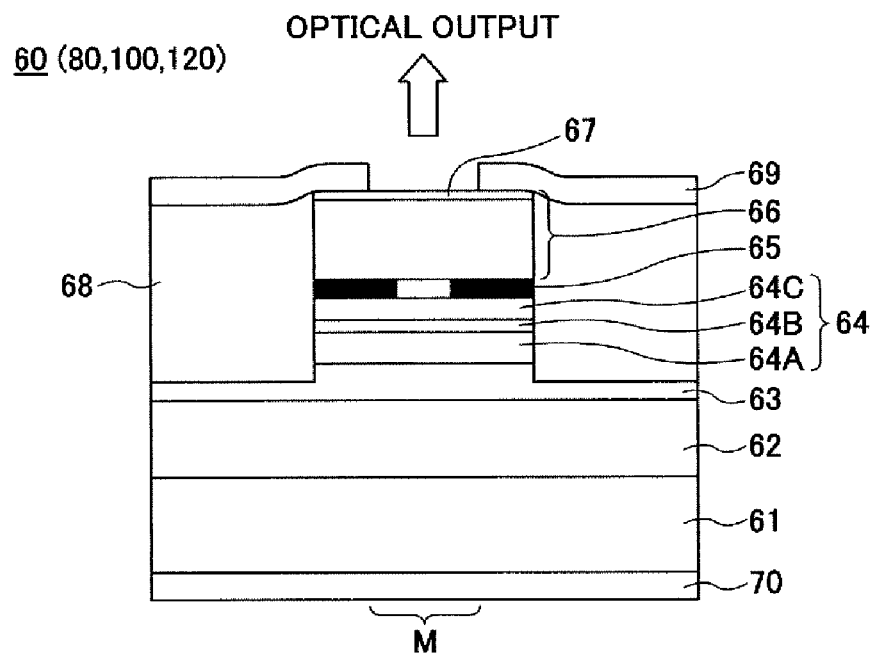
FIG. 3 is a diagram showing the construction of a surface-emission laser diode of Example 1.

FIG. 3 shows the construction of a surface-emission laser diode 60 according to Example 1 of the present invention. It should be noted that the surface-emission laser diodes of Examples 2, 3 and 4 to be described later have also the construction similar to that of FIG. 3.

Referring to FIG. 3, Example 1 forms a VCSEL stacked structure on an n-GaAs monocrystal (100) substrate 61 by consecutively stacking, by way of an MOCVD process, a first lower semiconductor DBR 62 in which an n-AlAs/$Al_{0.3}Ga_{0.7}As$ pair is repeated for 42.5 times, a second lower semiconductor DBR 63 in which an n-$Al_{0.95}Ga_{0.05}As$/$Al_{0.3}Ga_{0.7}As$ pair is repeated six times, a $Ga_{0.5}In_{0.5}P$ lower spacer layer 64A, a GaInAsP/$Ga_{0.5}In_{0.5}P$ (well/barrier) TQW active layer 64B, a $Ga_{0.5}In_{0.5}P$ upper spacer layer 64C, a p-AlAs selective oxidation layer 65, an upper semiconductor DBR 66 in which a p-$Al_{0.95}Ga_{0.05}As$/$Al_{0.3}Ga_{0.7}As$ pair is repeated 34.5 times, and a p-GaAs contact layer 67. Here, the lower spacer layer 64A, the active layer 64B and the upper spacer layer 64C forms a cavity structure 64.

Next, a circular mesa mask is patterned on such a VCSEL stacked structure thus formed by a photoresist, and mesa etching is started by a reactive ion beam etching (RIBE) method by introducing a $Cl_2$ gas.

In the present embodiment, the emission intensity of In (451 nm) and the emission intensity of Al (396 nm) are obtained during the mesa etching process by using a plasma atomic emission spectrometer, and the time change of the ratio (In/Al ratio) is monitored.

Figure 4:
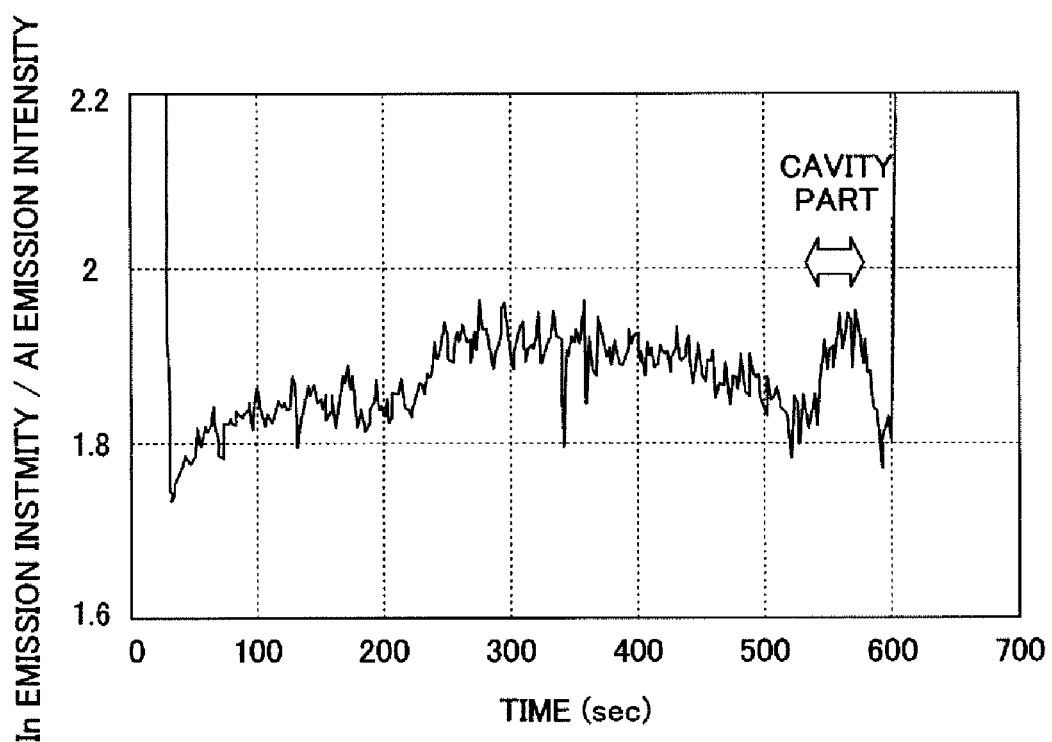
FIG. 4 is a diagram showing the time-change of atomic emission intensity of In(451 nm)/Al(396 nm) ratio of Example 1.

FIG. 4 shows the time change of the the In (451 nm)/Al(396 nm) emission intensity ratio obtained with Example 1.

Referring to FIG. 4, it can be seen that emission of In (451 nm) is detected after several minutes after the commencement of the etching, while this emission disappears in the meantime. Thus, when the etching is terminated at the moment the emission of In has disappeared, the mesa etching stops at the third layer from the top of the second lower semiconductor DBR 63, and the mesa structure M of FIG. 3 is formed.

Next, at the moment the mesa structure M is formed, the AlAs selective oxidation layer 65 is annealed in water vapor ambient at 400° C., and there is formed a current confinement structure inside the AlAs layer for selective oxidation 65 such that the non-oxidized AlAs region has an area of 25 μm$^2$. Further, the surrounding area of the mesa structure is filled with a polyimide protective film 68 excluding the part used for electrode contact and the part used for optical exit.

Next, a p-side electrode film 69 is deposited on the top surface of the mesa structure M in contact with the p-type contact layer 67 by an evaporation deposition process, and an opening for optical output is formed by a liftoff process. Further, an n-side electrode 70 is provided on the rear side of the substrate 61 and the surface-emission laser diode of the construction shown in FIG. 3 is fabricated.

With the surface-emission laser diode 60 of Example 1, positive carriers and negative carriers are injected respectively from the p-side electrode 69 and the n-side electrode 70, and the laser beam of the wavelength of 780 nm is emitted in the direction perpendicular to the substrate 61 via the opening formed in the upper electrode 69.

With the surface-emission laser diode 60 of Example 1, the VCSEL stacked structure containing In in the entirety of the cavity structure 64 is etched while monitoring the photoemission of In, and it becomes possible to detect the cavity structure 64 conveniently at the time of etching. Thus, it becomes possible to form the second lower semiconductor DBR 63 with the number of layers smaller than 4/7 of the total lower semiconductor DBR. As a result, temperature rise of the device is suppressed and it becomes possible to drive the surface-emission laser diode with higher output power. Further, with the present embodiment, mesa etching is conducted with good reproducibility, and the mesa heights become uniform, and it becomes possible to obtain surface-emission laser diodes of uniform laser characteristics with high yield.

EXAMPLE 2

Next, a surface-emission laser diode 80 according to Example 2 of the present invention will be explained. As noted before, the surface-emission laser diode 80 of Example 2 has a construction similar to that of FIG. 3.

Referring to FIG. 3, Example 2 forms a VCSEL stacked structure on an n-GaAs monocrystal (100) substrate 61 by consecutively stacking, by way of an MOCVD process, a first lower semiconductor DBR 62 in which an n-AlAs/$Al_{0.5}Ga_{0.5}As$ pair is repeated for 47.5 times, a second lower semiconductor DBR 63 in which an n-$Al_{0.95}Ga_{0.05}As$/$Al_{0.5}Ga_{0.5}As$ pair is repeated ten times, a $(Al_{0.5}Ga_{0.5})_{0.5}In_{0.5}P$ lower spacer layer 64A, an $In_{0.46}Ga_{0.54}P/(Al_{0.5}Ga_{0.5})_{0.5}In_{0.5}P$ (well/barrier) TQW active layer 64S, a $(Al_{0.5}Ga_{0.5})_{0.5}In_{0.5}P$ upper spacer layer 64C, a p-AlAs selective oxidation layer 65, an upper semiconductor DBR 66 in which a p-$Al_{0.95}Ga_{0.05}As$/$Al_{0.5}Ga_{0.5}As$ pair is repeated 40.5 times, and a p-GaAs contact layer 67.

Next, a circular mesa mask is patterned on such a VCSEL stacked structure thus formed by a photoresist, and mesa etching is conducted by an ICP etching method by introducing a $Cl_2$ gas.

In the present embodiment, time-change of the emission intensity of In (451 nm) is monitored by a plasma emission spectrometer during this plasma etching process. With progress of the etching, emission of In (451 nm) is detected, while this emission disappears in the meantime. Thus, by terminating the etching process at the moment the emission of In has disappeared, a mesa structure M, in which the mesa etching has stopped in the second lower semiconductor DBR 63, is obtained.

Next, at the moment the mesa structure M is formed, the AlAs selective oxidation layer 65 is annealed in water vapor ambient at 400° C., and there is formed a current confinement structure inside the AlAs layer for selective oxidation 65 such that the non-oxidized AlAs region has an area of 25 μm². Further, the surrounding area of the mesa structure is filled with a polyimide protective film 68 excluding the part used for electrode contact and the part used for optical exit.

Next, a p-side electrode film 69 is deposited on the top surface of the mesa structure M in contact with the p-type contact layer 67 by an evaporation deposition process, and an opening for optical output is formed by a liftoff process. Further, an n-side electrode 70 is provided on the rear side of the substrate 61 and the surface-emission laser diode of the construction shown in FIG. 3 is fabricated.

With the surface-emission laser diode 80 of Example 2, positive carriers and negative carriers are injected respectively from the p-side electrode 69 and the n-side electrode 70, and the laser beam of the wavelength of 650 nm is emitted in the direction perpendicular to the substrate 61 via the opening formed in the upper electrode 69.

With the surface-emission laser diode 80 of Example 2, it becomes possible to obtain surface-emission laser diodes of uniform laser characteristics similar to the surface-emission laser diode of Example 1 with high yield.

EXAMPLE 3

Next, a surface-emission laser diode 100 according to Example 3 of the present invention will be explained. As noted before, the surface-emission laser diode 100 of Example 3 has a construction similar to that of FIG. 3.

Referring to FIG. 3, Example 3 forms a VCSEL stacked structure on an n-GaAs monocrystal (100) substrate 61 by consecutively stacking, by way of an MOCVD process, a first lower semiconductor DBR 62 in which an n-AlAs/$Al_{0.5}Ga_{0.5}As$ pair is repeated for 40.5 times, a second lower semiconductor DBR 63 in which an n-$Al_{0.55}Ga_{0.05}As$/$Al_{0.15}Ga_{0.85}As$ pair is repeated five times, an $In_{0.27}Ga_{0.73}As_{0.44}P_{0.56}$ lower spacer layer 64A, an GaAs/$In_{0.27}Ga_{0.73}As_{0.44}P_{0.56}$ (well/barrier) TQW active layer 64B, an $In_{0.27}Ga_{0.73}As_{0.44}P_{0.56}$ upper spacer layer 64C, a p-AlAs selective oxidation layer 65, an upper semiconductor DBR 66 in which a p-$Al_{0.95}Ga_{0.05}As$/$Al_{0.15}Ga_{0.85}As$ pair is repeated 30.5 times, and a p-GaAs contact layer 67.

Next, mesa etching is conducted to the VCSEL stacked structure similarly to Example 2, and after similar thermal annealing process, the surrounding area of the mesa structure M is filled with a polyimide film 68, followed by electrode formation. With this, the surface-emission laser diode 100 of FIG. 3 is obtained.

With the surface-emission laser diode 100 of Example 3, positive carriers and negative carriers are injected respectively from the p-side electrode 69 and the n-side electrode 70, and the laser beam of the wavelength of 850 nm is emitted in the direction perpendicular to the substrate 61 via the opening formed in the upper electrode 69.

With the surface-emission laser diode of Example 3, too, it becomes possible to obtain surface-emission laser diodes of good heat dissipation characteristics and uniform laser characteristics similar to the surface-emission laser diode of Example 1 with high yield.

EXAMPLE 4

Next, a surface-emission laser diode 120 according to Example 4 of the present invention will be explained. As noted before, the surface-emission laser diode 120 of Example 4 has a construction similar to that of FIG. 3.

Referring to FIG. 3, Example 4 forms a VCSEL stacked structure on an n-GaAs monocrystal (100) substrate 61 by consecutively stacking, by way of an MOCVD process, a first lower semiconductor DBR 62 in which an n-AlAs/GaAs pair is repeated for 32.5 times, a second lower semiconductor DBR 63 in which an n-$Al_{0.95}Ga_{0.05}As$/n-GaAs pair is repeated three times, a $Ga_{0.5}In_{0.5}P$ lower spacer layer 64A, a GaInNAs/GaAs (well/barrier) TQW active layer 64B, a $Ga_{0.5}In_{0.5}P$ upper spacer layer 64C, a p-AlAs selective oxidation layer 65, an upper semiconductor DBR 66 in which a p-$Al_{0.95}Ga_{0.05}As$/p-GaAs pair is repeated 26 times, and a p-GaAs contact layer 67.

Next, mesa etching is conducted to the VCSEL stacked structure similarly to Example 2, and after similar thermal annealing process, the surrounding area of the mesa structure M is filled with a polyimide film 68, followed by electrode formation. With this, the surface-emission laser diode 120 of FIG. 3 is obtained.

With the surface-emission laser diode 120 of Example 4, positive carriers and negative carriers are injected respectively from the p-side electrode 69 and the n-side electrode 70, and the laser beam of the wavelength of 1300 nm is emitted in the direction perpendicular to the substrate 61 via the opening formed in the upper electrode 69.

With Example 4, the active layer contains GaInNAs, and thus, in addition to the function and effect of Example 1 explained before, it becomes possible to construct a laser device of the 1.3 μm band also on the GaAs substrate. Thereby, it becomes possible to use the high performance DBR of the AlGaAs system and it becomes further possible to use the selectively oxidized confinement structure. Further, because of large band discontinuity between the barrier layer or spacer layer and the GaInNAs active layer, the efficiency of carrier confinement is improved further and the characteristic temperature is improved further. Thereby, a surface-emission laser diode applicable widely for the optical source of optical transmission is obtained.

Further, because the surface-emission laser diode of the present embodiment is the device of the 1.3 μm band, it is possible to conduct the mesa etching such that the bottom of the etching is located inside the second lower DBR 63, even in the case the semiconductor layers constituting the DBRs 62 and 63 have a large thickness and the second lower DBR 63 has the thickness of only three pairs. With this, heat dissipation characteristics and temperature characteristics are improved further, and it becomes possible to drive the surface-emission laser diode with further higher power.

EXAMPLE 5

Figure 5:
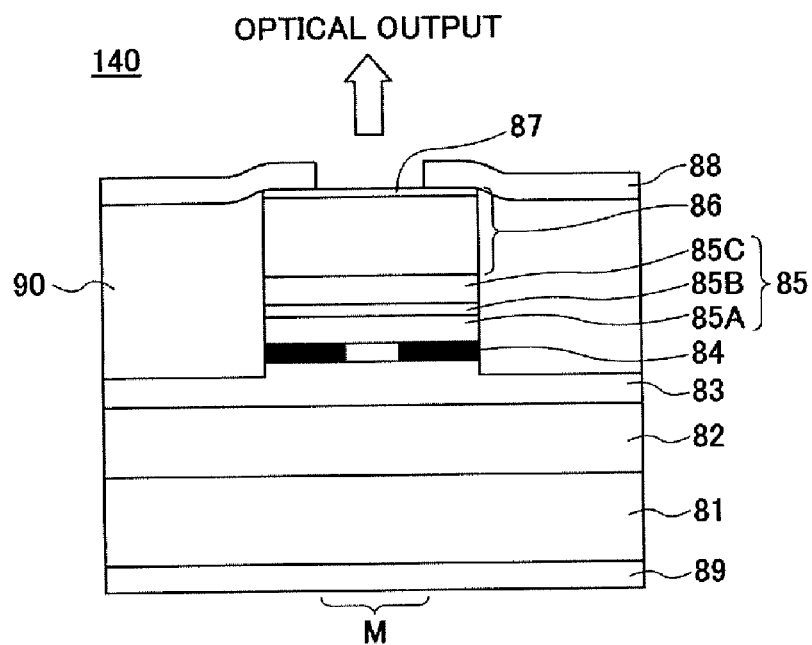
FIG. 5 is a diagram showing the construction of a surface-emission laser diode of Example 5.

FIG. 5 shows the construction of a surface-emission laser diode 140 according to Example 5.

Referring to FIG. 5, Example 5 forms a VCSEL stacked structure on an p-GaAs monocrystal (100) substrate 61 by consecutively stacking, by way of an MOCVD process, a first lower semiconductor DBR 82 in which a p-AlAs/p-$Al_{0.15}Ga_{0.85}As$ pair is repeatedly stacked for 39.5 times, a second lower semiconductor DBR 83 in which a p-$Al_{0.95}Ga_{0.05}As$/p-$Al_{0.15}Ga_{0.85}As$ pair is repeatedly stacked for six times, a p-AlAs layer for selective oxidation 84, an $In_{0.27}Ga_{0.73}As_{0.44}P_{0.56}$ lower spacer layer 85A, a GaAs/$In_{0.27}Ga_{0.73}P_{0.56}$ (well/barrier) TQW active layer 85B, an $In_{0.27}Ga_{0.73}As_{0.44}P_{0.56}$ upper spacer layer 84C, an upper semiconductor DBR 86 in which an n-$Al_{0.95}Ga_{0.05}As$/n-$Al_{0.15}Ga_{0.85}As$ pair is repeatedly stacked for 30.5 times, and an n-GaAs contact layer 87. Here, the lower spacer layer 85A, the active layer 85B and the upper spacer layer 84c forms an active structural part 85 serves for the cavity.

Next, mesa etching is conducted to the VCSEL stacked structure similarly to Example 2, and after similar thermal annealing process, the surrounding area of the mesa structure M is filled with a polyimide film 80, followed by electrode formation. With this, the surface-emission laser diode 120 of FIG. 3 is obtained. With the present invention, it should be noted that the p-side electrode 89 is provided on the rear surface of the substrate 81 and the n-side electrode 88 is formed on the contact layer 87.

With the surface-emission laser diode 120 of Example 5, negative carriers and positive carriers are injected respectively from the n-side electrode 88 and the p-side electrode 89, and the laser beam of the wavelength of 850 nm is emitted in the direction perpendicular to the substrate 81 via the opening formed in the upper electrode 88.

In the surface-emission laser diode such as the one shown in FIG. 5, there is a need of providing the AlAs layer for selective oxidation 84 at the side closer to the substrate as compared with the active structural part 85 in the event the semiconductor layers at the substrate side of the active layer 85B in the active structural part 85 are formed to have the p-conductivity type. This is because, with compound semiconductors, mobility is smaller in the p-conductivity type layer as compared in the n-conductivity type layer and larger confinement effect is obtained by providing the current confinement structure in the p-type conductive region.

As noted above, when forming the semiconductor layers at the side of the substrate in the p-conductivity type, there is a need of more precise etching control. With the stacked film construction of Example 5, it is possible to carry out stable mesa etching by monitoring the progress of the etching by using the plasma atomic emission spectrometry, even in the case the surface-emission laser diode use semiconductor layers of p-conductivity type at the side closer to the substrate.

Other features of the present invention are similar to those of Example 1 explained before, and description thereof will be omitted.

EXAMPLE 6

Next, a surface-emission laser diode according to Example 6 of the present invention will be explained.

Figure 6:
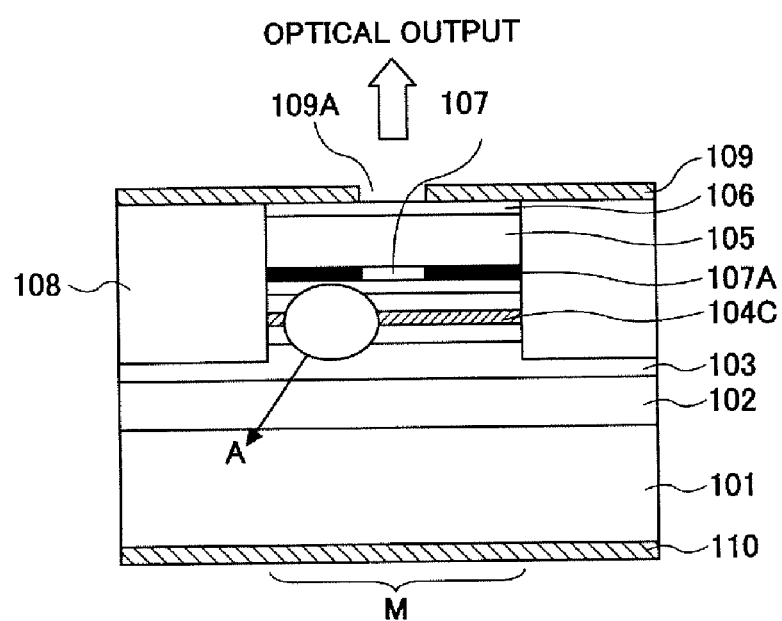
FIG. 6 is a diagram showing the surface-emission laser diode of Example 6.
Figure 7:
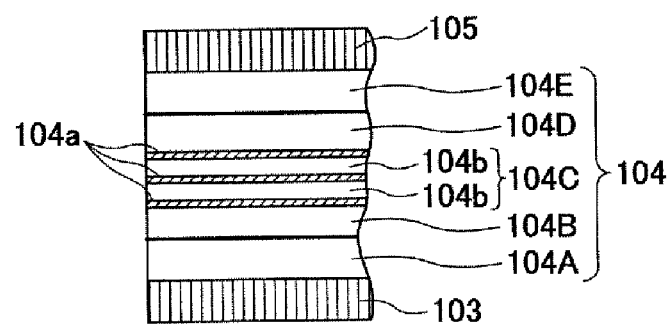
FIG. 7 is a drawing showing the surface-emission laser diode of Example 6.

FIGS. 6 through 7 show the construction of a surface-emission laser diode 160 according to Example 6 of the present invention, wherein FIG. 7 is an enlarged view showing a region A in the vicinity of the active layer of the surface-emission laser diode 160 of FIG. 6. It should be noted that the surface-emission laser diode of Example 6 oscillates at the wavelength of 780 nm.

Referring to FIG. 6, the surface-emission laser diode 160 includes, on an n-(100)GaAs substrate 101 having a surface orientation inclined in a direction of (111)A surface with an inclination angle 15°, a first lower semiconductor DBR (lower first reflector) 102 formed of a periodic structure in which an n-AlAs low refractive index layer and an n-$Al_{0.3}Ga_{0.7}As$ high refractive index layer are stacked alternately for 30.5 periods with the thickness corresponding to ¼ times the oscillation wavelength in the medium; and a second lower semiconductor DBR (lower second reflector) 103 formed of a periodic structure in which an n-$Al_{0.9}Ga_{0.1}As$ low refractive index layer and an n-$Al_{0.3}Ga_{0.7}As$ high refractive index layer are stacked alternately with the thickness corresponding to ¼ times the oscillation wavelength in the medium. It should be noted that FIG. 6 omits detailed illustration.

In the first lower semiconductor DBR 102 and the second lower semiconductor DBR 103, there is imposed a compositional graded layer of the thickness of 20 nm and having the Al content changed gradually from one value to the other value between every layer that constitutes the DBR, and the thickness including the graded layer is set to be equal to ¼ times the oscillation wavelength in the medium. With such a construction, the band discontinuity between the high refractive index layer and the low refractive index layer is relaxed at the time of causing to flow current to the DBR, and the resistance of DBR can be reduced.

Further, on the second layer semiconductor DBR 103, there are stacked consecutively, an $(Al_{0.7}Ga)_{0.5}In_{0.5}P$ lower first spacer (cladding) layer 104A that achieves lattice matching to the second layer semiconductor DBR 103; a $Ga_{0.5}In_{0.5}P$ lower second spacer layer 104B that achieves lattice matching to the $(Al_{0.7}Ga)_{0.5}In_{0.5}P$ lower first spacer (cladding) layer; a quantum well active layer 104C in which three GaInPAs quantum well layers 104a having a compressive strain composition and a bandgap wavelength of 780 nm and two $Ga_{0.5}In_{0.5}P$ barrier layers 104b of a lattice-matching composition to the substrate are stacked alternately; a $Ga_{0.5}In_{0.5}P$ upper second spacer layer 104D; and an $(Al_{0.7}Ga)_{0.5}In_{0.5}P$ upper first spacer (cladding layer) 104E.

The semiconductor layers 104A-104E form a cavity 104 of one wavelength, and there is formed, on the cavity 104, an upper semiconductor DBR (upper reflector) 105 of a periodic structure in which a p-$Al_xGa_{1-x}As$ (x=0.9) low refractive index layer and a p-$Al_xGa_{1-x}As$ (x=0.3) high refractive index layer are stacked alternately for 25 periods, for example (details are omitted in FIG. 6). With the present example, it should be noted that a compositional graded layer is interposed between the low refractive index layer and the high refractive index layer also in the upper reflector 105, similarly to the lower reflector 102 and 103.

Further, a p-GaAs contact layer 106 is formed on the upper reflector 105. As explained before, there is formed a cavity of one oscillation wavelength (so-called lambda cavity) between the lower reflector 103 and the upper reflector 105 with the present embodiment.

Hereinafter, the fabrication process of the surface-emission laser diode 160 of Example 6 will be explained.

With the present embodiment, the growth of the semiconductor layers 102-106 is conducted by an MOCVD process, wherein TMG (trimethyl gallium), TMA (trimethyl aluminum), TMI (trimethyl indium), $PH_3$ (phosphine), and $AsH_3$ (arsine) are used for the source according to the needs. Further, $H_2Se$ (hydrogen selenide) is used for the n-type dopant and $CBr_4$ is used for the p-type dopant. Further, $H_2$ is used for the carrier gas.

Because it is possible to form the construction such as a compositional graded layer by controlling the supply amount of the source gases, MOCVD process is particularly suitable for the crystal growth method of a surface-emission laser diode that includes DBR. Further, it does not require high vacuum state as in the case of MBE process and it is sufficient to merely control the supply flow rate of the source gases and the supply time, MOCVD process is suited for mass production. With Example 6, it should be noted that a part of the low refractive index layer of the p-side DBR (upper reflector) 105 close to the active layer 104C is formed by an AlAs layer 107.

After formation of such a VCSEL stacked structure, a mesa etching is conducted to a predetermined depth, such that at lease a sidewall surface of the p-AlAs layer 107 is exposed, and with this, a mesa structure M is formed. Further, the AlAs layer 107 exposed by the mesa structure M is oxidized in water vapor ambient, starting from the exposed to sidewall surface, and there is formed an $Al_xO_y$ current confinement part 107A in the AlAs layer 107.

Further, the space surrounding the mesa structure M formed by the mesa etching is filled with the polyimide film 108 for planarization, and thereafter, the polyimide film 108 is removed from the p-contact layer 106 and the upper reflector in correspondence to a predetermined optical exit part 109A, and a p-side electrode 109 is formed on the p-contact layer 106 so as to avoid the optical exit part 109A. Further, an n-side electrode 110 is formed on the rear side of the substrate 101.

With Example 6, current confinement is achieved by selective oxidation of the layer for selective oxidation 107 that contains Al and As as the major components, and with this, threshold current is reduced. With the current confinement structure that uses an Al oxide film 107A formed by selective oxidation of the layer for selective oxidation 107, it becomes possible to form the current confinement layer 107A near the active layer 104C, and diffusion of the injected holes is suppressed, and it becomes possible to efficiently confine the carriers into a minute region not exposed to the air. Further, with such a current confinement structure, there occurs a decrease of refractive index when the AlAs film 107 is oxidized to form the Al oxide film 107A, and it becomes possible to confine the light to the minute region where the carriers are confined by way of convex lens effect. Thereby, efficiency of stimulated emission is improved significantly, and with this, the threshold current is decreased. Further, such a construction can easily form a current confinement structure, and it becomes possible to reduce the production cost of the surface-emission laser diode.

Further, with the surface-emission laser diode 160 of Example 6, which uses AlGaInP for a part of the spacer layers 104A and 104E and GaInPAs for the barrier layer and the quantum well active layer, and forms the semiconductor layers on the (100) GaAs substrate of the surface orientation inclined in the (111)A direction by 15°, it becomes possible to suppress the narrowing of bandgap associated with formation of natural superlattices, deterioration of surface morphology caused by hillock (hill-like defect) formation, or the effect of non-optical recombination centers.

Further, with the surface emission laser diode 160, it should be noted that $(Al_{0.7}Ga)_{0.5}In_{0.5}P$, which is a widegap material, is used for the spacer layer (cladding layer) 104A and 104E. Because of this, the bandgap difference between the spacer layers 104A and 104E and the quantum well active layer 104a increases to 743 mV from 466 meV (Al content 0.6) for the case the spacer layer is formed of AlGaAs. Further, the surface-emission laser diode 160 is advantageous with regard to the bandgap difference between the barrier layer 104b and the quantum well active layer 104a, and excellent carrier confinement is realized.

Further, because the quantum well active layer 104a accumulates therein a compressive strain, it is also attained the increase of gain caused by band splitting of heavy holes and light holes. With these, the surface-emission laser diode 160 has a very high gain and it is possible to perform high output power operation at low threshold.

Further, because the quantum well active layer 104a and the barrier layer 104b are formed of the material free from Al, incorporation of oxygen into these layers is reduced, and it becomes possible to suppress formation of non-optical recombination centers. With this, it becomes possible to realize a surface-emission laser diode of long lifetime.

Further, with the surface-emission laser diode 160 of the present example, control of polarization direction is achieved by utilizing the optical gain anisotropy caused by inclination of the substrate.

When compared with the surface-emission laser diode that uses the (311)B substrate (inclination angle 25°), which is thought most promising at the present juncture, the surface-emission laser diode of the present embodiment uses a small inclination angle (15°), and thus, the optical gain anisotropy becomes inevitably small. Thus, with the surface-emission laser diode 160 of Example 6, this decrease of the optical gain anisotropy is compensated for by the increase of the optical gain anisotropy caused by providing a compressive strain to the quantum well active layer. With such a construction, it becomes possible to realize a satisfactory polarization control.

Thus, according to Example 6 of the present invention, the gain of the active layer 104a is increased and heat dissipation is improved, and with this, it becomes possible to realize a high output power surface-emission laser diode of 780 nm wavelength band having low threshold value for laser oscillation, good reliability and controlled polarization direction.

It should be noted that the foregoing effect of the present invention decreases at short wavelength band, but it appears conspicuously in the wavelength band longer than 680 nm. For example, when compared with the surface-emission laser diode of the 780 nm band that uses the active layer of AlGaAs/AlGaAs system, it should be noted that the bandgap difference between the $Al_xGa_{1-x}As$ (x=0.6, Eg=2.0226 eV) having the largest bandgap in the typical compositional range used for $Al_xGa_{1-x}As$ (0<x≦1) system spacer layer and the active layer of the compositional wavelength 780 nm (Eg=1.5567 eV), is generally equal to the bandgap difference (460 meV) between the $(Al_aGa_{1-a})_bIn_{1-b}P$ (a=0.7, b=0.5, Eg=2.289 eV) having the largest bandgap in the typical compositional range used for the $(Al_aGa_{1-a})_bIn_{1-b}P$ (0<a≦1, 0≦b≦1) spacer layer and the active layer of the compositional wavelength of 680 nm (Eg=1.8233 eV).

Further, with regard to the bandgap difference between the barrier layer and the quantum well active layer, the bandgap different to the active layer of the compositional wavelength of 680 nm becomes about 200 meV when the barrier layer is formed of $Ga_eIn_{1-e}P_fAs_{1-f}$ (e=0.6, f=1, Eg=2.02 eV), while this is generally equivalent to the case of the surface-emission laser diode of 780 nm that uses the AlGaAs/AlGaAs system active layer.

This means that it becomes possible to achieve the carrier confinement equivalent to or superior to the case of the surface-emission laser diode of the 780 nm band that uses the active layer of the AlGaAs/AlGaAs system while using an Al-free active layer (quantum well active layer and barrier layer) by using the spacer layer of the AlGaInP system, provided that the compositional wavelength is longer than 680 nm. Further, by taking into consideration the effect of the strained quantum well active layer, it becomes possible with the surface-emission laser diode of the present example to have the characteristics equal to or superior to the surface-emission laser diode of the 780 nm band that uses the conventional active layer of the AlGaAs/AlGaAs system.

EXAMPLE 7

Next, a surface-emission laser diode according to Example 7 of the present invention will be explained.

Figure 8:
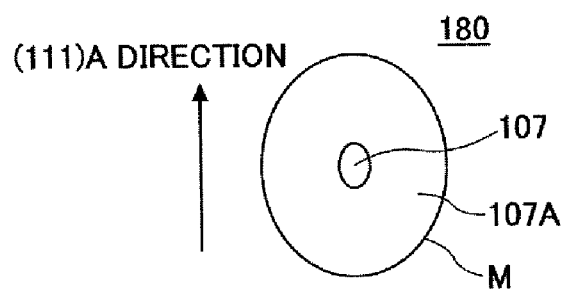
FIG. 8 is a top view diagram showing the surface-emission laser diode of Example 7.

FIG. 8 is a top view diagram of the surface-emission laser diode 180 of Example 7. The surface-emission laser diode 180 of Example 7 has a cross-sectional structure identical to that of the surface-emission laser diode 160 of Example 6, except that the mesa structure M thereof is formed with anisotropy such that the mesa structure M forms an elongated circular shape in the (111)A direction when viewed from the light emission direction of the surface-emission laser diode. Thus, explanation about the cross-sectional structure of the surface-emission laser diode 180 is omitted. Further, because the mesa structure has the elongated elliptic shape, the current injection region 107 defined by the Al oxide film 107A also has an elongated shape in the direction of the (111)A surface. It should be noted that the foregoing shape anisotropy is not limited to elongated elliptic shape but it is possible to use other shape such as rectangular shape.

The present embodiment uses optical gain anisotropy caused by the inclination of the substrate 101 for the polarization control. However, the inclination angle is small (15°) as compared with the case of using the (311)B substrate (inclination angle 25°, which is thought most promising at the current juncture, for the polarization control, and thus, the obtained optical gain anisotropy becomes inevitably small.

With Example 7, such decrease of the optical gain anisotropy is compensated for by increasing the optical gain in the inclination direction of the substrate (direction of (111)A surface), by increasing the optical gain anisotropy by providing a compressive strain to the quantum well active layer 104a and further by providing anisotropy to the outer shape of the active layer as viewed from the optical emission direction of the surface-emission laser diode 180, more specifically, by using an elongated shape in the direction of the (111)A surface. Thereby, polarization control comparable to the case of using the (311)B substrate is realized.

EXAMPLE 8

Next, a surface-emission laser diode of Example 7 of the present invention will be explained.

Figure 9:
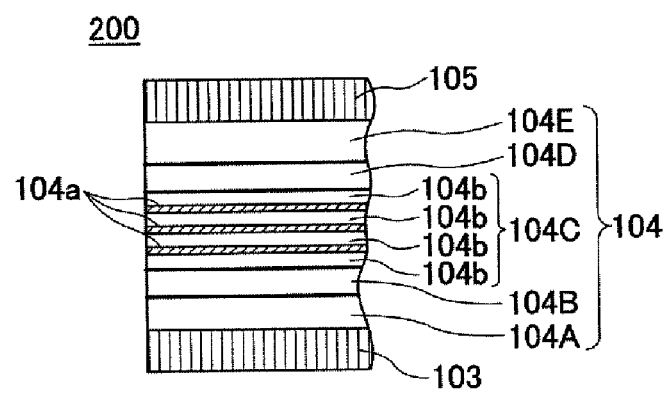
FIG. 9 is a diagram showing the surface-emission laser diode of Example 8.

FIG. 9 shows the construction of surface-emission laser diode 200 of Example 7.

The surface-emission laser diode 200 of FIG. 9 has a construction similar to that of the surface-emission laser diode of Example 6, wherein it should be noted that FIG. 9 shows the region around the active layer of the surface-emission laser diode of Example 8 in enlarged scale.

Referring to FIG. 9, the surface-emission laser diode 200 of Example 8 is different from the surface-emission laser diode 160 of Example 6 in the point that $Ga_{0.6}In_{0.4}P$ having a tensile strain is used for the barrier layer 104b. Further, with Example 8, the barrier layer of $Ga_{0.6}In_{0.4}P$ having the tensile strain is provided also under the first quantum well active layer 104a and over the third quantum well active layer 104a. Other structure is identical to the surface-emission laser diode 160 of FIG. 6.

When comparison is made for the GaInPAs system having the same lattice constant, GaInP has the largest bandgap. Further, in the case of using GaInPAs for the barrier layer 14b, it becomes possible to secure a large bandgap when the composition of small lattice constant is used. Thereby, the band discontinuity to the quantum well active layer 104a can be increased further, and it becomes possible to obtain further low-threshold operation and high output power operation. For example, the tensile-strained $Ga_{0.6}In_{0.4}P$ layer used with Example 8 has a bandgap of 2.02 eV, while this bandgap is larger than that of a $Ga_{0.5}In_{0.5}P$ lattice matched layer of Example 6, which has the bandgap of 1.87 eV, by 150 meV.

EXAMPLE 9

Figure 10:
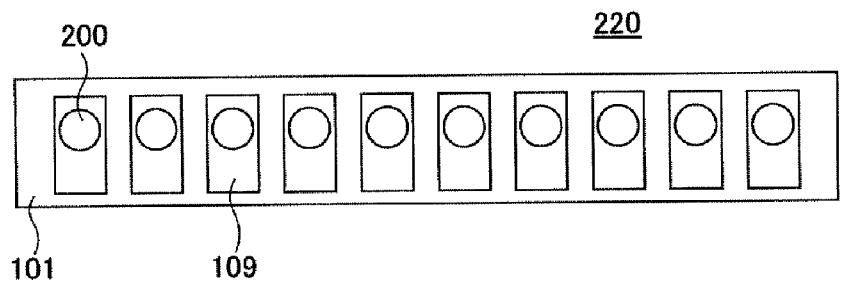
FIG. 10 is a diagram showing a surface-emission laser diode array of Example 9.

FIG. 10 is a top view diagram of a surface-emission laser diode array 220 according to Example 9 of the present invention.

Referring to FIG. 10, there are provided ten surface-emission laser diodes 200 of Example 8 on the substrate 101 with the surface-emission laser diode array 220 in one-dimensional array, except that, in Example 9, p-side and n-side of the surface-emission laser diode 220 are exchanged. Thus, with Example 9, the GaAs substrate 101, on which the surface-emission laser diode 220 is formed, is a substrate, and there are provided n-side electrode pads 109 on the top surface and a p-side common electrode 110 is provided on the rear side.

While plural surface-emission laser diodes 200 are arranged with the example of FIG. 10 in one-dimensional array, it is possible to arrange such surface-emission laser diodes in two dimensional array.

EXAMPLE 10

Figure 11:
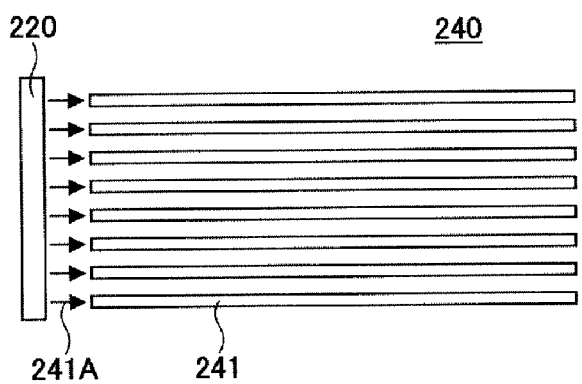
FIG. 11 is a diagram showing an optical transmission module according to Example 10.

FIG. 11 shows an optical transmission module 240 of Example 10.

Referring to FIG. 11, the optical transmission module 240 has a construction of combining low-cost acrylic POFs (plastic optical fibers) 240 with the surface-emission laser diode array chip of FIG. 10. Thus the laser beam 241A from each surface emission laser diode 200 is injected into a corresponding POF 241 and transmitted therethrough.

An acrylic POF shows the minimum absorption loss at the wavelength of 650 nm, and thus, the use of surface-emission laser diode of 650 nm has been studied. However, conventional surface-emission laser diode of 650 nm band has poor high temperature characteristics, and practical use thereof has not been successful. In view of these circumstances, LEDs have been used with the optical transmission modules that use such POF. However, it is difficult to conduct high-speed modulation with LED, and it is thought indispensable to use a laser diode for achieving high-speed transmission exceeding 1 Gbps.

With the surface-emission laser diode 200 used with the optical transmission module of Example 10, the laser oscillation wavelength is 780 nm. However, the surface-emission laser diode has excellent heat dissipation characteristics and large active layer gain, and it is possible to perform high output power operation. Further, because it has excellent high temperature characteristics, it is possible to conduct optical transmission for short distance, in spite of the fact that there is a problem of absorption loss by POF.

In the field of optical communication, parallel transmission is attempted for transmitting larger amount of data at the same time by using a laser array in which plural laser diodes are integrated. With this, high-speed parallel transmission becomes possible and it becomes possible to transmit larger amount of data at the same time.

With Example 10 shown in FIG. 11, the surface-laser diode elements 100 in the surface-laser diode array and the optical fibers 241 are provided in one to one correspondence, while it is also possible to increase the transmission speed further by conducting wavelength multiplexed transmission via a single optical fiber by arranging plural surface-emission laser diode elements of different wavelengths in the form of one-dimensional or two-dimensional array.

Further, the present example combines the low-cost surface-emission laser diode element 200 with low-cost POF 241, and thus, it becomes possible to realize a low-cost optical transmission module, and with this, it becomes possible to realize a low-cost optical communication system. Because such optical communication system is extremely low cost, it is useful for short-distance data communication in homes, in office rooms and inside of apparatuses.

EXAMPLE 11

Figure 12:
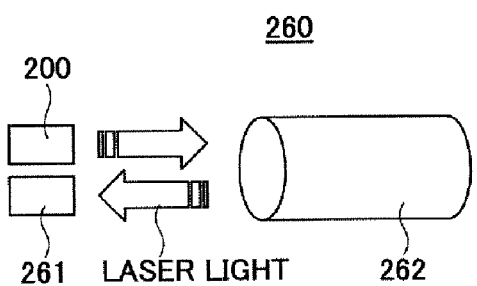
FIG. 12 is a diagram showing an optical transmission/reception module according to Example 11.

FIG. 12 shows the construction of an optical transceiver module 260 according to Example 11 of the present invention.

Referring to FIG. 12, the optical transceiver module 260 has a construction that combines the surface-emission laser diode element 200 of Example 8, a photodiode 261 for reception and an acrylic POF 262.

Both of the surface-emission laser diode 200 of the present invention and POF 262 are low cost, and it becomes possible, with the optical transceiver system 260 that uses the surface-emission laser diode element 200 of the present invention for the optical communication system, to realize a low-cost optical communication system by constructing the optical transceiver module by combining the surface-emission laser diode element 200 for transmission and the photodiode 261 for reception, with a single POF 262.

Further, in view of the fact that POF has a large fiber diameter and it is possible to reduce the mounting cost because of the easiness of coupling to a fiber, it becomes possible to reduce the cost of the optical transceiver module 260 further. Further, in view of the fact that the surface-emission laser diode 200 of the present invention has excellent temperature characteristics and low laser oscillation threshold, the amount of heat generation is small and it becomes possible to realize a low-cost optical communication system that can be used up to high temperatures without cooling.

The optical communicating system 260 according to the present embodiment is particularly useful for short-distance communication such as the optical transmission between devices such as computers by way of LAN (Local Area Network) that uses POF, the optical communications between LSIs on a board, the optical interconnection between elements inside an LSI, and the like.

Meanwhile, the processing performance of LSIs is increasing recently, and it is predicted that the transmission speed of the part connecting such LSIs becomes the bottleneck problem.

On the other hand, by changing the signal connection inside the system from electrical connection to optical interconnect, and by using the optical transmission module 240 or the optical transceiver module 260 for connecting the boards of a computer system, the LSIs in a board or elements inside an LSI, it becomes possible to realize a super-fast computer system.

Further, by using the optical transmission module 220 or the optical transceiver module 260 of the present invention for connection plural computer systems, it becomes possible to construct a super-fast network system. Particularly, the power consumption can be reduced significantly with the surface-emission laser diode as compared with the edge-emission laser diode, and because of easiness of forming a two-dimensional array with the use of surface-emission laser diode elements, the present invention is particularly suited for constructing an optical communication system of parallel transmission type.

EXAMPLE 12

Figure 13:
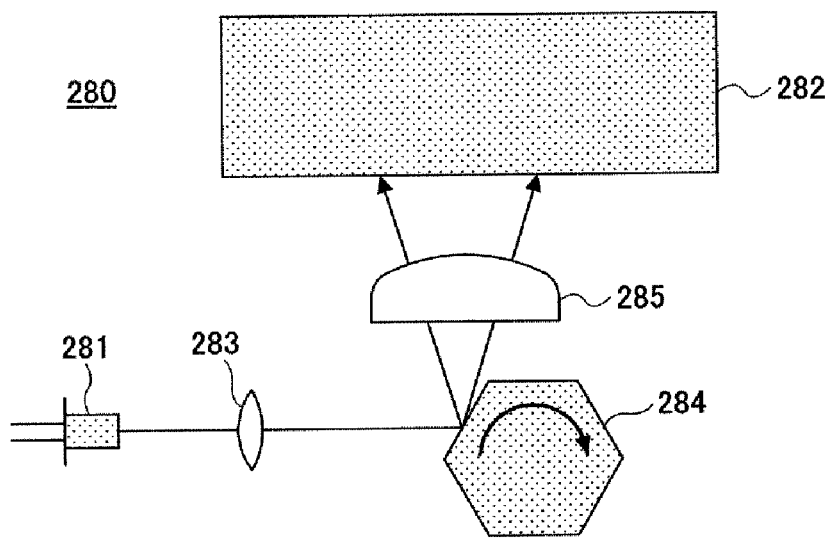
FIG. 13 is a diagram showing a laser printer of according to Example 12.

FIG. 13 shows the construction of a laser printer 280 according to Example 12, wherein it should be noted that the laser printer 280 of FIG. 13 combines a surface-emission laser diode array chip (16 beam VSCEL array) 281, in which the surface-emission laser diodes 200 of Example 8 having the oscillation wavelength of 780 nm are arranged on the GaAs substrate 101 in the form of a 4×4 two-dimensional array, with a photosensitive drum 282. FIG. 13 particularly shows the outline of optical scanning part of the laser printer 280.

Figure 14:
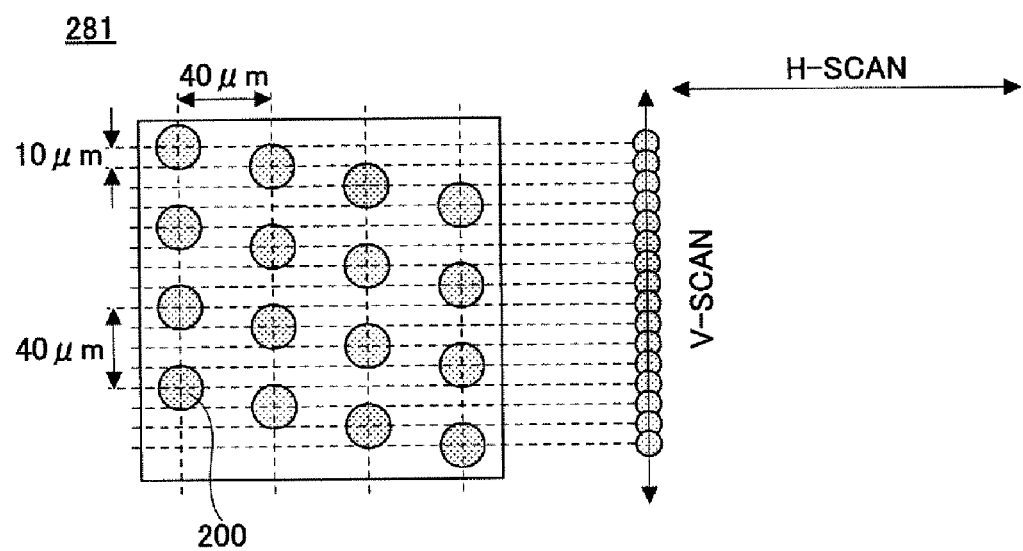
FIG. 14 is a diagram (top view) showing the outline construction of a surface-emission laser diode array chip (16 beam VCSEL array) used in the laser printer of FIG. 13.

FIG. 14 is a top view showing the outline construction of the surface-emission laser diode array chip (16 beam VCSEL array) 281 used with the laser printer 280 of FIG. 13. With such a surface-emission laser diode array chip (16 beam VCSEL array) 281, it is possible to realize the situation equivalent to the case the optical sources are aligned on the photosensitive body 282 in the sub-scanning direction V-SCAN with an interval of 10 µm as shown in FIG. 14, by adjusting the timing of turning-on.

With Example 12, the plural optical beams from the plural surface-emission laser diode array 200 are focused upon a scanning polygonal mirror 284 via an optical system including a lens 283 and form plural optical spots aligned in the sub-scanning direction V-SCAN by adjusting the timing of turning-on while rotating the polygonal mirror 284 at high speed. The plural optical beams are then focused upon the photosensitive body 282 serving for the scanning surface via a so-called f-θ lens for image formation. Thus, according to the present embodiment, the image formation is made by scanning plural beams at the same time.

According to Example 12, it becomes possible to carry out optical writing on the photosensitive body 282 with an interval of about 10 μm in the sub-scanning direction V-SCAN, while this corresponds to the resolution of 2400 DPI (dot/inch). On the other hand, the writing interval in the main scanning direction HSCAN can be controlled easily by the turn-on timing of the optical source.

With the laser printer 280 of the present embodiment, it becomes possible to write 16 dots at the same time, and it becomes possible to perform high-speed printing. Further, by increasing the number of the surface-emission laser diodes 200 in the array, a further high speed printing becomes possible. Further, by adjusting the interval between the surface-emission laser diode elements 200, the dot interval in the sub-scanning direction H-SCAN can be adjusted, and it becomes possible to carry out high-quality printing with the density higher than 2400 DPI. With the surface-emission laser diode of Example 12, the efficiency is improved over the conventional surface-emission laser diode. Further, it has superior heat dissipation characteristics and it becomes possible to maintain high output power even when plural elements are operated at the same time. Thereby, it becomes possible to increase the printing speed.

While Example 12 has shown the application of the laser to laser printer, the surface-emission laser diode of the present invention is applicable to other image forming apparatuses. Further, the surface-emission laser diode of the present invention is applicable also to the optical source for recording and playback in CDs, or the like. Thus, the present invention is applicable to an optical pickup system. Further, the present invention is applicable to optoelectronic hybrid integrated circuit, or the like.

In Examples 9-12, it is also possible to use a surface-emission laser diode of any modes explained before or to be explained below in place of the surface-emission laser diode 200.

(Twelfth Mode)

Figure 15:
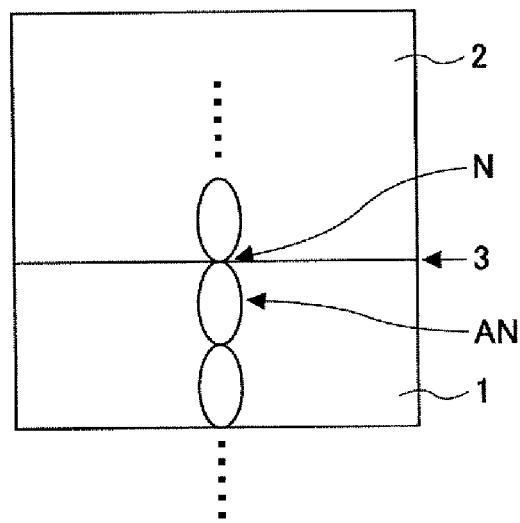
FIG. 15 is a cross-sectional diagram showing, in principle, a part of a first construction example according to a twelfth mode of the present invention.

Hereinafter, twelfth mode of the present invention will be explained with reference to FIGS. 15 and 16, wherein it should be noted the twelfth mode of the present invention relates to the principle of the construction and operation of the surface-emission laser diode.

(1) First Construction

The surface-emission laser diode according to the first construction of the twelfth mode of the present invention comprises a GaAs substrate; a cavity region formed over said GaAs substrate, said cavity region including at least one quantum well active layer producing a laser light and barrier layers; and an upper reflector and a lower reflector provided at a top part and a bottom part of said cavity region over said GaAs substrate, said upper reflector and/or said lower reflector including a semiconductor Bragg reflector, at least a part of said semiconductor distributed Bragg reflector comprising a semiconductor layer containing Al, Ga and As as major components, wherein there is provided, between said active layer and said semiconductor layer that contains Al, Ga and As as major components, a semiconductor layer containing Al, In and P as major components such that said semiconductor layer containing Al, In and P as major components is provided adjacent to said semiconductor layer that contains Al, Ga and As as major components, an interface between said semiconductor layer containing Al, Ga and As as major components and said semiconductor layer containing Al, In and P as major components being formed coincident to a location of a node of electric field strength distribution.

With the surface-emission laser diode of the first construction, the semiconductor layer containing Al, In and P as the major components is formed, for example by $(Al_aGa_{1-a})_b In_{1-b}P$ ($0<a\leq1$, $0\leq b\leq1$).

In conventional surface-emission laser diodes, the interface between the cavity region and the reflector is located coincident to the anti-node of the electric field strength distribution and the semiconductor layer containing Al, In and P as the major components is provided at the uppermost part of the cavity region. Thus, the interface between to the upper reflector formed of the semiconductor layer containing Al, Ga and As as the major components is formed at the location where the effect of optical absorption appears most conspicuously. Meanwhile, when conducting crystal growth of a semiconductor layer containing Al, Ga and As as the major components on the semiconductor layer containing Al, In and P as the major components, there is a tendency that segregation of In such as In carry over takes place, and thus, there has been a need of suppressing this problem. Conventionally, it has been difficult to avoid increase of the threshold value. It should be noted that this problem appears conspicuous when conducting crystal growth of a semiconductor layer containing Al, Ga and As as the major components, on the semiconductor layer containing Al, In and P as the major components.

Contrary to the foregoing, with the surface-emission laser diode of the first construction, in which the interface 3 between the semiconductor layer 1 containing Al, In and P as the major components and the semiconductor layer 2 (part of the upper reflector) containing Al, Ga and As as the major components, is located at the node N of the electric field strength distribution, the surface-emission laser diode is designed so as to drastically decrease the effect of the optical absorption at the interface 3, and it becomes possible to suppress the increase of laser oscillation threshold value effectively even when there has been caused some segregation of In. In FIG. 1, it should be noted that the anti-node of the electric field strength distribution is represented by N.

Here, it is further advantageous to provide is a thin layer for In segregation suppression between the semiconductor layer 1 containing Al, In and P as the major component and the semiconductor layer 2 (part of the upper reflector) containing Al, Ga and As as the major components, for the purpose of suppressing In segregation.

For the semiconductor layer 1 that contains Al, In and P as the major components, it is possible to use a $(Al_aGa_{1-a})_b In_{1-b}P$ ($0<a\leq1$, $0\leq b\leq a$) layer. With such a construction, the effect of decrease of the threshold value is attained for the surface-emission laser diode that uses AlGaInP layer, irrespective of the wavelength, and thus, not only in the red color surface-emission laser diode of the 650 nm band, in which the use of AlGaInP layer is essential, but also in the surface-emission laser diodes of the 780 nm band, 850 nm band, or the like.

(2) Second Construction

The surface-emission laser diode according to the second construction of the second mode of the present invention comprises: a GaAs substrate; a cavity region formed over said GaAs substrate and having at least one quantum well active layer producing a laser light and barrier layers; and an upper reflector and a lower reflector provided at a top part and a bottom part of said cavity region over said GaAs substrate, said upper reflector and/or lower reflector including a semiconductor distributed Bragg reflector, at least a part of said semiconductor distributed Bragg reflector comprising a semiconductor layer containing Al, Ga and As as major components, there being provided, between said active layer and said semiconductor layer containing Al, Ga and As as major components, a $(Al_aGa_{1-a})_bIn_{1-b}P$ $(0<a\leq1, 0\leq b\leq1)$ layer adjacent to said semiconductor layer containing Al, Ga and As as major components, said $(Al_aGa_{1-a})_bIn_{1-b}P$ $(0<a\leq1, 0\leq b\leq1)$ layer being added with Mg (magnesium) as a p-type dopant, said semiconductor layer containing Al, Ga and As as major components being added with C (carbon) as a p-type dopant.

For the p-type dopant of the semiconductor layer containing Al, In and P as the major components, Zn (zinc) is used commonly, while Zn has a large diffusion coefficient and tends to cause diffusion to the active layer or near the active layer, and there arises the problem of degradation of the device characteristics, such as decrease of efficiency of photoemission caused by degradation of the crystal quality, or increase of the absorption loss.

Contrary to this, Mg, which can be used for the p-type dopant, is characterized by smaller diffusion coefficient as compared with Zn and the foregoing problem can be improved. On the other hand, in the semiconductor layer that contains Al, Ga and As as the major components, C has an even smaller diffusion coefficient. Further, addition of Mg to the material containing As causes the problem of poor controllability of doping caused by memory effect.

Thus, with the present construction, Mg is added primarily to the semiconductor layer containing Al, In and P as the major components and C is added to the semiconductor layer containing Al, Ga and As for the major components. With this, diffusion of dopant or memory effect is suppressed, and the controllability of doping is improved, and the doping profile close to the designed profile is obtained. Further, degradation of crystal quality of the active layer is suppressed and high output power operation and low threshold value are realized.

(3) Third Construction

The surface-emission laser diode according to the third construction of the twelfth mode of the present invention comprises: a GaAs substrate; a cavity region formed over said GaAs substrate, said cavity region including at least one quantum well active layer producing a laser light and barrier layers; and an upper reflector and a lower reflector provided at a top part and a bottom part of said cavity region over said GaAs substrate, said upper reflector and/or lower reflector including a semiconductor distributed Bragg reflector, at least a part of said semiconductor distributed Bragg reflector comprising a semiconductor layer containing Al, Ga and As as major components, there being provided, between said active layer and said semiconductor layer containing Al, Ga and As as major components, a $(Al_aGa_{1-a})_bIn_{1-b}P$ $(0<a\leq1, 0\leq b\leq1)$ layer adjacent to said semiconductor layer containing Al, Ga and As as major components, said $(Al_aGa_{1-a})_bIn_{1-b}P$ $(0<a\leq1, 0\leq b\leq1)$ layer being a semiconductor layer formed of a short period superlattice structure of AlInP and GaInP.

Although it changes depending on the material, thermal resistance of a semiconductor layer increases with increasing number of the elements that constitutes the semiconductor material. Thus, AlGaInP, a quaternary material, has a large thermal resistance. Thus, the heat generated in such an active layer is not dissipated easily but is accumulated in the active layer and invites the temperature rise of the active layer. Thus, there has been a problem that the optical output saturates with small injection current.

In the case of surface-emission laser diode, it can be regarded, when there is formed a superlattice structure by stacking the layers having a thickness sufficiently smaller than the oscillating wavelength alternately, that it is optically equivalent to the case in which there is formed a mixed crystal having an average composition by mixing these layers uniformly, although there is a report that there occurs slight increase of refractive index by forming the superlattice structure. Thus, it is possible to construct a reflector by using the semiconductor layers thus constructed by the superlattice structure.

Here, in view of the fact that the thermal resistance of the ternary system material such as AlInP or GaInP is smaller than that of AlGaInP, a quaternary material, and because of the fact that AlInP or GaInP can be lattice-matched to the GaAs substrate similarly to the case of AlGaInP, the present construction decreases the thermal resistance by forming a superlattice structure in place of the conventional AlGaInP semiconductor layer of uniform composition, by choosing at least two materials of small thermal resistance as compared with the average composition. With this, the heat generated in the active layer is efficiently dissipated, and temperature rise of the active layer by current injection is decreased. Further, it becomes possible to conduct the current injection with a higher level than conventional case, while this leads to higher output, and it becomes possible to obtain a surface-emission laser diode capable of operating at high output power.

(4) Fourth Construction

The surface-emission laser diode according to the fourth construction of the twelfth mode comprises: a GaAs substrate; a cavity region formed over said GaAs substrate, said cavity region including at least one quantum well active layer producing a laser light and barrier layers; and an upper reflector and a lower reflector provided at a top part and a bottom part of said cavity region over said GaAs substrate, said upper reflector and/or lower reflector including a semiconductor distributed Bragg reflector, at least a part of said is semiconductor distributed Bragg reflector comprising a low refractive index layer of $Al_xGa_{1-x}As$ $(0<x\leq1)$ and a high refractive index layer of $Al_yGa_{1-y}As$ $(0\leq y<x\leq1)$, one of said low refractive index layers constituting said upper reflector and/or said lower reflector and located closest to said active layer comprising $(Al_aGa_{1-a})_bIn_{1-b}P$ $(0<a\leq1, 0\leq b\leq1)$, an interface between said cavity region and said low refractive index layer of said upper reflector and/or said lower reflector located closest to said active layer being coincident to an anti-node of an electric strength distribution.

Figure 16:
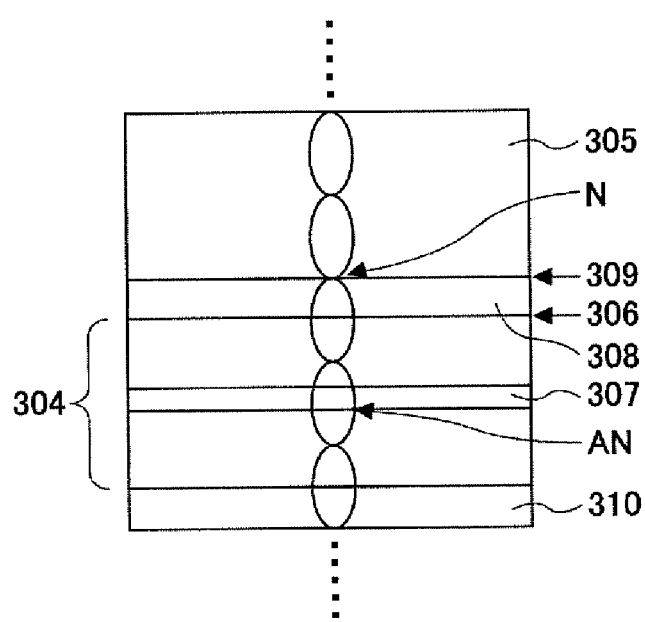
FIG. 16 is a cross-sectional diagram showing, in principle, a part of a second construction example of the twelfth mode of the present invention.

FIG. 16 shows the construction of the surface-emission laser diode according to the fourth construction.

Referring to FIG. 16, the surface-emission laser diode of the fourth construction is constructed such that the interface 306 between the cavity region 304 including the active layer 307 and the upper reflector 305 is located coincident to the anti-node AN of the electric field strength distribution in accordance with the conventionally used construction, while it should be noted that, with the construction of FIG. 2, the interface 309 for the case of growing the semiconductor layer (upper reflector 305) that contains Al, Ga and As as the major components on the foregoing $(Al_aGa_{1-a})_bIn_{1-b}P$ $(0<a\leq1, 0\leq b\leq1)$ layer 308 is made coincident to the node N of the electric field strength distribution by forming the low refractive index layer ($\lambda/4$ thickness) 308 of the upper reflector 305 closest to the active layer 307 with $(Al_aGa_{1-a})_bIn_{1-b}P$ $(0<a\leq1, 0\leq b\leq1)$. With this, the effect of optical absorption at the interface 309 is decreased significantly, and it becomes possible to suppress the increase of the threshold value effectively even in the case there is caused some segregation of In. In FIG. 16, the reference numeral 310 forms (a part of) the lower reflector. Further, in FIG. 16, only a part of the upper reflector 305 is illustrated.

In the construction of FIG. 16, it is possible to construct the lower reflector 310 by a first lower reflector that uses AlAs for the low refractive index layer, a second lower reflector that uses $Al_{x1}Ga_{1-x1}As$ ($0<x_1<1$), and at least one $(Al_aGa_{1-a})_bIn_{1-b}P$ ($0<a\leq1$, $0\leq b\leq1$) low refractive index layer, consecutively from the side of the substrate.

The thermal resistance of AlAs increases sharply when only a small amount of Ga is added. Contrary to this, the lower reflector 310 includes AlAs having a small thermal resistance for the low refractive index layer, and thus, dissipation of the heat generated in the active layer 307 is improved and temperature rise at the time of driving is suppressed. Thereby, a high output power surface-emission laser diode of excellent temperature characteristics is obtained. In the case of the structure that includes the current confinement structure that uses an Al oxide film, it becomes possible to stop the etching for mesa formation between the layer for selective oxidation, which is to be converted to the Al oxide film, and AlAs of the first lower reflector, by providing a second lower reflector of an AlGaAs low refractive index layer of small Al content between the first lower reflector that uses the AlAs low refractive index layer and the layer containing In.

Further, in the case a high refractive index layer of $Al_yGa_{1-y}As$ ($0\leq y<x\leq1$) and a low refractive index layer of $(Al_aGa_{1-a})_bIn_{1-b}P$ ($0<a\leq1$, $0\leq b\leq1$) are to be stacked in the upper reflector 305 or the lower reflector 310, it becomes possible to provide an $(Al_{a1}Ga_{1-a1})_{b1}In_{1-b1}P$ ($0\leq a_1<a\leq1$, $0\leq b_1\leq1$) intermediate layer (In segregation suppressor layer) at such an interface with Al content smaller than the $(Al_aGa_{1-a})_bIn_{1-b}P$ ($0<a\leq1$, $0\leq b\leq1$) low refractive index layer.

By inserting such intermediate layer of small Al content when stacking the AlyGa1-yAs ($0\leq y<x\leq1$) high refractive index layer on the $(Al_aGa_{1-a})_bIn_{1-b}P$ ($0<a\leq1$, $0\leq b\leq1$) low refractive index layer, the Al content at the interface is decreased, it becomes possible to form the AlyGa1-yAs ($0\leq y<x\leq1$) high refractive index layer on the $(Al_aGa_{1-a})_bIn_{1-b}P$ ($0<a\leq1$, $0\leq b\leq1$) low refractive index layer easily over a wide process condition.

Further, at the heterojunction between the material of AlGaAs system and the material of the AlGaInP system, there occurs an increase of band discontinuity in the valence band when the Al content of the material of the AlGaInP system is large. Because the intermediate layer of small Al content is inserted, the band discontinuity of the valence band is decreased, and it becomes possible to decrease the electric resistance in the stacked direction.

Further, with the semiconductor distributed Bragg reflector that constitutes the p-type reflector in any of the upper reflector 305 or the lower reflector 310, it is possible to add C (carbon) to the $Al_xGa_{1-x}As$ ($0<x\leq1$) low refractive index layer and the $Al_yGa_{1-y}As$ ($0\leq y<x\leq1$) high refractive index layer as a p-type dopant, and add Mg (magnesium) to the $(Al_aGa_{1-a})_bIn_{1-b}P$ ($0<a\leq1$, $0\leq b\leq1$) low refractive index layer 308 as a p-type dopant.

Further, it is possible that the $(Al_aGa_{1-a})_bIn_{1-b}P$ ($0<a\leq1$, $0\leq b\leq1$) low refractive index layer 308 may be the semiconductor layer formed of the short period super-lattice structure of AlInP and GaInP.

(5) Fifth Construction

The surface-emission laser diode according to the fifth construction of the twelfth mode of the present invention is a surface-emission laser diode according to the fourth construction, wherein there is provided a spacer layer between the active layer and the upper reflector and/or lower reflector, a part of the spacer layer comprises a $(Al_aGa_{1-a})_bIn_{1-b}P$ ($0=a'\leq1$, $0\leq b'\leq1$) layer, the quantum well active layer comprises a $Ga_cIn_{1-c}P_dAs_{1-d}$ ($0\leq c\leq1$, $0\leq d\leq1$) having a compressive strain, and the barrier layer is formed of $Ga_eIn_{1-e}P_{1-f}As_{1-f}$ ($0\leq e\leq1$, $0\leq f\leq1$).

Thus, with the example of FIG. 16, at least the low refractive index layer among the low refractive index layers constituting the upper reflector 305 and located closest to the active layer 307 is formed of an AlGaInP layer, and a material of the GaInPAs system is used for the barrier layer or the quantum well active layer.

Thus, it becomes possible to use the widegap material such as the $(Al_aGa_{1-a})_bIn_{1-b}P$ ($0<a\leq1$, $0\leq b\leq1$) low refractive index layer and the $(Al_aGa_{1-a})_bIn_{1-b}P$ ($0\leq a'\leq1$, $0\leq b'\leq1$) spacer layer for the cladding layer for carrier confinement, and the bandgap difference between the cladding layer and the quantum well active layer is increased further as compared with the case in which the cladding layer for carrier confinement is formed of the material of AlGaAs system. Here, it should be noted that the spacer layer is the layer provided between the active layer and the reflector in ordinary construction and performs the function of carrier confinement.

With regard to the carrier confinement, there are cases in which other low refractive index layers of the DBR close to the active layer perform the function in addition to the spacer layer. In the fifth construction, the $(Al_aGa_{1-a})_bIn_{1-b}P$ ($0\leq a'\leq1$, $0\leq b'\leq1$) spacer layer and the $(Al_aGa_{1-a})_bIn_{1-b}P$ ($0<a\leq1$, $0\leq b\leq1$) low refractive index layer can perform the function of the cladding layer.

Referring to Table 2 explained with the previous mode, for example, it becomes possible, with the 780 nm surface-emission laser diode of the system of AlGaInP (spacer layer)/GaInPAs (quantum well active layer), to secure a bandgap difference between the spacer layer and the quantum well layer, and between the beerier layer and the quantum well layer, larger than the 850 nm surface emission laser that uses the AlGaAs/AlGaAs system, by using an $(Al_{0.7}Ga_{0.3})_{0.5}In_{0.5}P$ layer of the bandgap Eg of 2.289 eV for the spacer layer, a GaInPAs layer having the bandgap of 1.5567 eV and accumulating a compressive strain for the quantum well layer, and further by using $Ga_xIn_{1-x}P$ having a bandgap Eg of accumulating a tensile strain for the barrier layer.

Further, referring to Table 2, there occurs an increase of band splitting between the heavy holes and the light holes by forming the active layer 307 by the quantum well layer of compressive strain composition as explained with reference to the previous modes, and thus, there occurs an increase of gain and decrease of the threshold value, and the laser oscillation efficiency is increased together with the laser output. It should be noted that this effect is not attained with the 850 nm surface-emission laser diode of the AlGaAs/AlGaAs system.

Thus, with the fifth construction of the twelfth mode of the present invention, a high-efficiency and high output power surface-emission laser diode is obtained with the threshold value lower than that of the 850 nm surface-emission laser diode of the AlGaAs/AlGaAs system. Further, with the present construction, there occurs an increase of carrier confinement efficiency, and the threshold value is decreased also by the increase of gain attained by the use of the strained quantum well active layer. With this, it becomes possible to reduce the reflectivity of the DBR 305 at the optical exit side. Thereby, the output of the surface emission laser can be increased further.

Further, by constructing the quantum well layer in the quantum well active layer 307 by the $Ga_cIn_{1-c}P_dAs_{1-d}$ ($0 \leq c \leq 1$, $0 \leq d \leq 1$) layer, and by constructing the barrier layer in the quantum well active layer 307 by $Ga_eIn_{1-e}P_fAs_{1-f}$ ($0 \leq e \leq 1$, $0 \leq f \leq 1$), it becomes possible to form the active layer 307 by the material free from Al. With this, incorporation of oxygen into the active layer 307 is reduced similarly to the second mode explained before, and formation of the non-optical recombination centers is suppressed, and a long lifetime surface-emission laser diode is realized.

Thus, according to Fifth Construction of the present mode, it becomes possible to realize a reliable high output surface-emission laser diode operating at the wavelength shorter than 850 nm, having large gain for the active layer and reduced threshold value, by using the AlGaInP material for a part of the spacer layer and by using GaInPAs for the barrier layer and the quantum well active layer.

While the fifth construction limits the wavelength to be shorter than 850 nm, this is merely because advantage over the conventional construction appears extremely conspicuously in this wavelength range, and the foregoing advantageous effect is attained more or less in the wavelength longer than 850 nm.

Further, with the fifth construction, too, the bandgap of GaInP is the largest among the materials of the GaInPAs system used for the barrier layer in the quantum well active layer of the surface-emission laser diode when comparison is made on the basis of the same lattice constant. Further, larger bandgap is secured with the material of the smaller lattice constant. Thus, by using the material of the GaInP system of small lattice constant for the barrier layer, it becomes possible for the surface-emission laser diode to perform high output power operation with low threshold value. For example, it should be noted that the bandgap of a $Ga_{0.6}In_{0.4}P$ tensile-strained layer is 2.02 eV while the bandgap of a $Ga_{0.5}In_{0.5}P$ lattice-matched layer is 1.87 eV. Thus, the bandgap of the $Ga_{0.6}In_{0.4}P$ tensile-strained layer is larger by 150 meV.

While the fifth construction has been explained based on the fourth construction that uses AlGaInP layer as the low refractive index layer closest to the active layer, similar effect as in the case of using AlGaInP for the cladding layer and the material of GaInPAs system for the barrier layer and the quantum well active layer, is attained also in the case of the first through third constructions, in which a part of the spacer layer provided between the active layer and the reflector is formed of the AlGaInP layer, the quantum well active layer is formed of $Ga_cIn_{1-c}P_dAs_{1-d}$ ($0 \leq c \leq 1$, $0 \leq d \leq 1$) and the barrier layer is formed of $Ga_eIn_{1-e}P_fAs_{1-f}$ ($0 \leq e \leq 1$, $0 \leq f \leq 1$).

Thus, in the third construction, it is possible to construct the surface-emission laser diode such that there is provided a spacer layer between the active layer and the upper reflector and/or the lower reflector, a part of the spacer layer is formed of the AlGaInP layer, the quantum well active is formed of $Ga_cIn_{1-c}P_dAs_{1-d}$ ($0 \leq c \leq 1$, $0 \leq d \leq 1$), and the barrier layer is formed of $Ga_eIn_{1-e}P_fAs_{1-f}$ ($0 \leq e \leq 1$, $0 \leq f \leq 1$).

Thus, by using the spacer layer of the composition $(Al_aGa_{1-a})_{b'}In_{1-b'}P$ ($0 \leq a' \leq 1$, $0 \leq b' \leq 1$), it becomes possible to secure a very large bandgap difference between the spacer layer and the quantum well active layer as compared with the case of forming the spacer layer by the material of the AlGaAs system. Further, by using a compressive strain composition for the quantum well active layer, the threshold value is decreased and the efficiency of laser oscillation is improved. Thereby, it becomes possible to operate the surface-emission laser diode with high output power.

Further, as a result of improvement of the carrier confinement efficiency and as a result of decrease of the threshold value attained by the gain increase caused by the use of the strained quantum well active layer, it becomes possible to reduce the reflectivity of the DBR 305 at the optical exit side, and it becomes possible to increase the optical output further. Further, as a result of the use of $Ga_cIn_{1-c}P_dAs_{1-d}$ ($0 \leq c \leq 1$, $0 \leq d \leq 1$) for the quantum well active layer and as a result of the use of $Ga_eIn_{1-e}P_fAs_{1-f}$ ($0 \leq e \leq 1$, $0 \leq f \leq 1$) for the barrier layer, It becomes possible to realize a long lifetime surface-emission laser diode in which the active layer is formed of the material free from Al and incorporation of oxygen into the active layer is reduced and formation of the non-optical recombination center is suppressed.

Thus, according to the present construction, a highly reliable high output power surface-emission laser diode operating at the wavelength of shorter than 850 nm is obtained with high active layer gain and low threshold value.

(6) Sixth Construction

The surface-emission laser diode according to the sixth construction of the twelfth mode of the present invention is a surface-emission laser diode of the fifth construction, wherein the oscillation wavelength is longer than about 680 nm.

Comparing the surface-emission laser diode with the 780 nm surface-emission laser diode having the active layer of the AlGaAs/AlGaAs system, it can be seen that the bandgap difference between the $Al_xGa_{1-x}As$ (x=0.6, Eg=2.0226 eV), which provides the largest bandgap in the typical compositional range of the $Al_xGa_{1-x}As$ ($0 < x \leq 1$) system spacer layer used with the surface-emission laser diode of the AlGaAs/AlGaAs system, and the active layer of the compositional wavelength of 780 nm (Eg=1.5567 eV) is generally equal to the bandgap difference (460 meV) between $(Al_aGa_{1-a})_b In_{1-b}P$ (a=0.7, b=0.5, Eg=2.289 eV), which provides the largest bandgap in the typical compositional range of the $(Al_aGa_{1-a})_bIn_{1-b}P$ ($0 < a \leq 1$, $0 \leq b \leq 1$) spacer layer used with the surface emission laser diode of the present mode and the active layer of the compositional wavelength of 680 nm (Eg=1.8233 eV).

Further, with regard to the bandgap difference between the barrier layer and the quantum well active layer, it should be noted that the bandgap difference to the active layer of the compositional wavelength of 680 nm becomes about 200 meV, assuming that the barrier layer has the composition $Ga_eIn_{1-e}P_fAs_{1-f}$ (e=0.6, f=1, Eg=2.02 eV), while this is generally equal to the case of the 780 nm surface-emission laser diode of the active layer of the AlGaAs/AlGaAs system.

This means, that by using the spacer layer of the AlGaInP system, it becomes possible to achieve the carrier confinement equivalent or larger than the surface-emission laser diode of 780 nm that uses the AlGaAs/AlGaAs system active layer, even in the case the surface-emission laser diode is the one that uses the Al-free active layer (quantum well active layer and the barrier layer), as long as the compositional wavelength is longer than 680 nm. In practice, the characteristics equivalent or more are attained in view of the effect of the strained quantum well active layer.

(7) Seventh Construction

The surface-emission laser diode according to the seventh example of the twelfth mode of the present invention is a surface-emission laser diode of any of the first through sixth constructions, wherein the surface orientation of the substrate, on which growth is to be made, is formed a (100) surface inclined in the direction of (111)A surface within the range of 5° to 20°.

In the crystal growth of the material that contains Al, In and P or GaInP, it is preferable to use a (100) GaAs substrate having a surface orientation inclined in the direction of a (111)A surface by an angle (inclination angle) of the range of 5° to 20° for the substrate 41. The reason of this is that, when the surface orientation of the substrate is close to (100), there is caused problems such as decrease of bandgap by formation of natural superlattices, deterioration of surface morphology caused by hillock (hill-like defect), formation of non-optical recombination centers, and the like, and there is a possibility that the device characteristics of the laser diode formed on the substrate is adversary affected.

When the surface orientation of the substrate is inclined from (100) surface to the direction of (111)A surface, on the other hand, formation of the natural superlattice is suppressed in correspondence to the inclination angle. Thus, the bandgap changes sharply in the range of the inclination angle of 10° to 15°, and thereafter, the band gap approaches the nominal bandgap (bandgap value of the mixed crystal). Further, formation of hillocks is gradually suppressed.

On the other hand, when the inclination angle in the direction of (111)A surface exceeds 20°, crystal growth on the substrate becomes difficult. Thus, with the red color laser (630 nm to 680 nm) that uses the AlGaInP material, the substrate inclined to the angle in the range of 5° to 20° (in many cases in the range of 7° to 15°) is used commonly. This applies not only to the case AlGaInP is used for the spacer layer (cladding layer), but also to the case in which GaInP is used for the barrier layer as in the example of Table 2. Further, in anticipation of adversary effect caused also in the case the barrier layer and the quantum well active layer are formed of GaInPAs, it is preferable to use a (100) GaAs substrate having a surface orientation inclined in the direction of (111)A surface with the angle in the range of 5° to 20° (more preferably with the angle in the range of 7° to 15°), for the growth of these materials.

With regard to the control of polarization direction, Japanese Laid-Open Patent Application 2001-60739 describes a polarization control technology that uses a substrate having a surface orientation inclined from (100) in the direction of (111)A surface of (111)B surface by 15°-40° and increases the optical gain in the inclined direction by utilizing the multiple optical gain anisotropy and further by using the multiple quantum well active layer of InAlGaAs and InGaAsP having a compressive strain. Further, Japanese Laid-Open Patent Application 2001-168461 describes the construction of forming the mesa shape in a circular shape, elliptical shape or elongated circular shape and setting the direction of the major axis from (100) in the direction of (111)A surface of (111)B surface. In this case, the surface orientation of the substrate is inclined from (100) in the [110] direction by 2° (including −5°-+5°), and the substrate is not the one inclined in the A surface or B surface direction.

With the surface-emission laser diode according to the seventh construction of the twelfth mode of the present invention, the optical gain anisotropy caused by inclining the substrate orientation in the (111)}A direction is utilized for the polarization control. However, with the present construction, it is not possible to user the polarization control technology that uses the (311)B substrate and thought most promising at the present juncture. Thus, with the seventh construction, the inclination angle of the substrate is smaller (5° to 20°) than the (311)B substrate (25°), and the optical gain anisotropy achieved with substrate inclination becomes inevitably small, although there are advantages such as the substrate cost is suppressed and the cleaving process is conducted easily.

Thus, with the seventh construction, this decrease is compensated for by the increase of optical gain anisotropy obtained by providing a compressive strain to the quantum well active layer.

Thus, the surface-emission laser diode according to the seventh construction provides a shape anisotropy with regard to the outer shape of the active layer as viewed from the optical emission direction, such that the direction in the (111)A surface is elongated. Further, the outer shape of the active layer as viewed from the optical emission direction of the surface-emission laser diode is provided with anisotropy such that the direction of the (111)A surface is elongated, the optical gain in the inclined direction ((111)A surface direction) is increased further, and the polarization controllability is improved.

(Thirteenth Mode)

Hereinafter, a surface-emission laser 400 according to a thirteenth mode of the present invention will be explained with reference to FIGS. 17 through 19.

Figure 17:
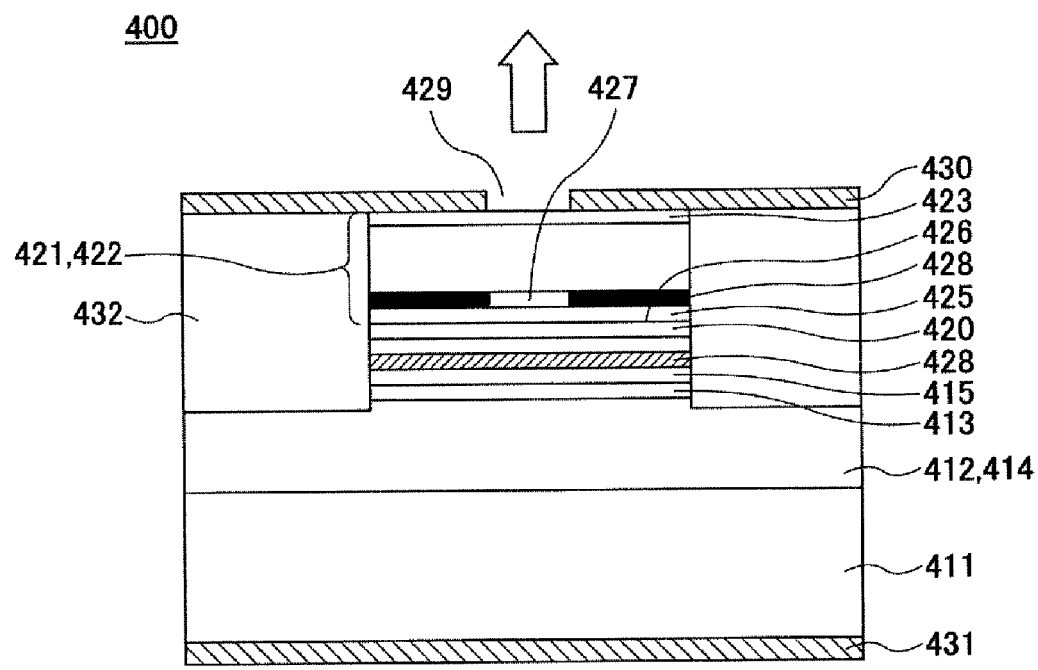
FIG. 17 is a cross-sectional diagram showing, in principle, a construction example according to a thirteenth mode of the present invention.
Figure 18:
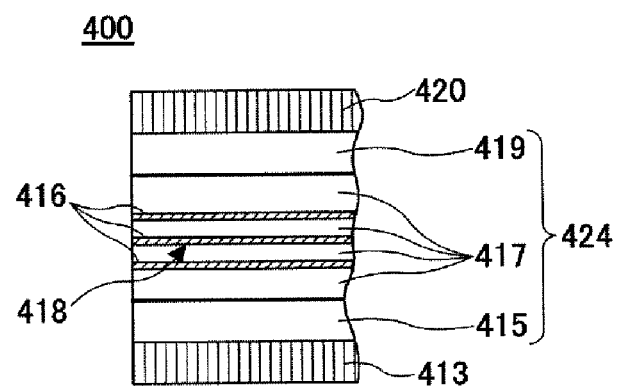
FIG. 18 is a cross-sectional diagram extracting and showing a structure in the vicinity of the active layer of FIG. 17 with enlarged scale.

The thirteenth mode gives more concrete shape of the first construction of the twelfth mode, wherein FIG. 17 shows the surface-emission laser diode 400 in a cross-sectional view for explanation of the principle, while FIG. 18 is a cross-sectional view showing the active layer and its periphery of the surface-emission laser diode 400 with enlarged scale. Further, FIG. 19 is a plan view showing a part of the surface-emission laser diode 400.

The surface-emission laser diode 400 of the thirteenth aspect of the present invention uses an n-(100)GaAs substrate 411 having a surface orientation inclined in a direction of (111)A surface with an inclination angle 15°, and on the GaAs substrate 411, there is formed an n-semiconductor distributed Bragg reflector (lower reflector) 414 by a periodic structure 412 in which an n-$Al_{0.9}Ga_{0.1}As$ layer and an n-$Al_{0.3}Ga_{0.7}As$ layer are stacked alternately for 35 periods with the thickness corresponding to ¼ times the oscillation wavelength in the medium, wherein there is formed an n-$(Al_{0.7}Ga_{0.3})_{0.5}In_{0.5}P$ low refractive index layer 413 on the periodic structure 412 with the thickness of the ¼ wavelength is formed.

Further, there is interposed a compositional graded layer (not shown) of the thickness of 20 nm and having the Al content changed gradually from one value to the other value between the n-$Al_{0.9}Ga_{0.1}As$ layer and the n-$Al_{0.3}Ga_{0.7}As$ layer constituting one unit of repetition in the periodic structure 412, wherein the thickness of the foregoing unit including the compositional graded layer is set to be equal to ¼ times the oscillation wavelength in the medium. With such a construction, the band discontinuity between the high refractive index layer and the low refractive index layer is smoothed at the time of causing to flow current to the DBR, and increase of electric resistance can suppressed.

Further, on the periodic structure 412, there are stacked consecutively: an $(Al_{0.2}Ga_{0.8})_{0.5}In_{0.5}P$ lower first spacer layer 415 that achieves lattice matching to the substrate 411; an active layer 418 in which three GaInPAs quantum well active layers 415 having a compressive strain composition and the bandgap wavelength of 780 nm and four $Ga_{0.5}In_{0.5}P$ barrier layers 417 achieving lattice matching to the substrate 411 are stacked alternately, and an $(Al_{0.2}Ga0.8)_{0.5}In_{0.5}P$ upper first spacer 419.

Further, on the upper spacer layer 419, there is formed a p-semiconductor distributed Bragg reflector (422) formed of a p-$(Al_{0.7}Ga_{0.3})_{0.5}In_{0.5}P$ low refractive index layer (serving also for the cladding layer) having the thickness of ¼ times the laser oscillation wavelength in that medium and a periodic structure 412 in which a p-$Al_xGa_{1-x}As$ (x=0.9) low refractive index layer and a p-Al$_x$Ga$_{1-x}$As (x=0.3) high refractive index layer are stacked alternately for 24.5 periods, for example (details are omitted in FIG. 1). Here, a compositional graded layer similar to the lower reflector 414 is interposed between the high refractive index layer and the low refractive index layer in the upper reflector 422.

Further, a p-GaAs contact layer 423 is formed on the uppermost part of the upper reflector 422 for achieving ohmic contact with the electrode.

With such a construction, there is formed a cavity region 424 of one oscillation wavelength (so-called lambda cavity) between the lower reflector 414 and the upper reflector 422. Thereby, the cavity region 424 forms, together with the lower reflector 414, the upper reflector 424, the cavity structure of the surface-emission laser 400.

With the surface-emission laser diode 400 according to the thirteenth mode of the present invention, the interface 426 (corresponds to interface 3 of FIG. 15) between the p-(Al$_{0.7}$Ga$_{0.3}$)$_{0.5}$In$_{0.5}$P low refractive index layer (functioning also as cladding layer) 420 and the p-Al$_x$Ga$_{1-x}$As (x=0.3) 425 formed on the low-refractive index layer 450 and constituting the upper reflector 422 is located coincident to the node of the electric field strength distribution.

Conventionally, the AlGaInP cladding layer (spacer layer) is formed in the uppermost part of the cavity region. With such a structure, the interface between the cavity region and the upper reflector of the material of the AlGaAs system is formed at the location of the anti-node where the effect of optical absorption is large. However, in the case of growing a semiconductor layer containing Al, Ga and As as the major components on the semiconductor layer containing Al, In and P as the major components, there tends to occur segregation of In such as carry over of In, and it has been difficult to suppress the increase of the threshold value.

According to the thirteenth mode of the present invention in which the interface 426 is coincident to be node of the electric field strength distribution, the effect of optical absorption at the interface 426 is reduced significantly, and it becomes possible to suppress the increase of the threshold value effectively even when there is caused some segregation of In in this part. It should be noted that increase of the threshold value is suppressed further effectively when the segregation of In is suppressed by providing a thin (Al)GaInP between the p-(Al$_{0.7}$Ga$_{0.3}$)$_{0.5}$In$_{0.5}$P low refractive index layer 420 and the p-Al$_x$Ga$_{1-x}$As (x=0.3) layer 425 as an In segregation suppressor layer.

Further, it should be noted that, while the thirteenth mode uses the (Al$_{0.7}$Ga$_{0.3}$)In$_{0.5}$P layer for the low refractive index layer of the lower reflector 414 closest to the active layer 18 in viewpoint of providing symmetry to the laser structure, it is possible to use the material of AlGaAs system as long as the problem of segregation of In is to be attended.

Hereinafter, the fabrication process of the surface-emission laser diode 400 of the thirteenth mode will be explained.

With the present embodiment, the growth of the semiconductor stacked structure constituting the surface-emission laser diode 400 is conducted by an MOCVD process. Thereby, TMG (trimethyl gallium), TMA (trimethyl aluminum), TMI (trimethyl indium), PH$_3$ (phosphine), and AsH$_3$ (arsine) are used for the source, and H$_2$Se (hydrogen selenide) is used for the n-type dopant. Further, DMZn or CBr$_4$ is used for the p-type dopant. Further, H$_2$ is used for the carrier gas.

Because it is possible to form the construction such as a compositional graded layer by controlling the supply amount of the source gases, MOCVD process is particularly suitable for the crystal growth method of a surface-emission laser diode that includes DBR. Further, it does not require high vacuum state as in the case of MBE process and it is sufficient to merely control the supply flow rate of the source gases and the supply time, MOCVD process is suited for mass production.

With the thirteenth mode, it should be noted that a part of the low refractive index layer of the p-side DBR close to the active layer 418 is formed by an AlAs layer.

Further, the stacked structure thus formed is subjected to a mesa etching, there is formed a mesa structure 426 of a predetermined size such that at lease a sidewall surface of the p-AlAs layer 427 is exposed. Further, the AlAs layer thus exposed is oxidized in water vapor ambient, starting from the exposed sidewall surface, and there is formed an Al$_x$O$_y$ current confinement layer 428.

Further, the space surrounding the mesa structure 426 is filled with a polyimide film 432 for planarization, and thereafter, the polyimide film 432 is removed from the contact layer 423 in the part corresponding to the optical exit window 429. Further, a p-side electrode 430 is formed on the p-contact layer 423 so as to avoid the optical exit part 29. Further, an n-side electrode 431 is formed on the rear side of the substrate 411.

With the surface emission laser 400 of the present mode, current confinement is achieved by selective oxidation of the layer for selective oxidation 427 that contains Al and As as the major components, and with this, threshold current is reduced significantly.

With the current confinement structure that uses an Al oxide film formed by selective oxidation of the layer for selective oxidation 427, it becomes possible to form the current confinement layer 428 near the active layer 418, and diffusion of the injected holes is suppressed, and it becomes possible to efficiently confine the carriers into a minute region not exposed to the air.

Further, with such a current confinement structure, there occurs a decrease of refractive index when the oxidized part 428 is changed to an Al oxide film, and it becomes possible to confine the light to the minute region where the carriers are confined by way of convex lens effect. Thereby, a very large efficiency is realized, and with this, the threshold current is decreased. Further, such a current confinement structure can be easily formed, and it becomes possible to reduce the production cost of the surface-emission laser diode significantly.

Figure 19:
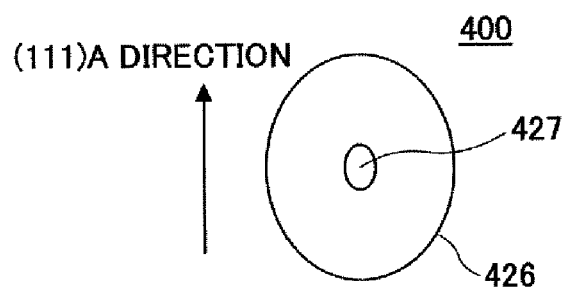
FIG. 19 is a plan view diagram of FIG. 17.

Further, with the present mode, the mesa shape as viewed from the direction of optical emission is formed to have anisotropy in that the mesa structure has an elongated elliptic shape in the direction of the (111)A surface as shown in FIG. 19. Such anisotropic shape is not limited to the elliptic shape, and it is also possible to use other shapes such as a rectangular shape. With this, the current injection region formed in the Al oxide film 428 becomes an elongated shape in the direction of the (111)A surface.

Further, with the surface-emission laser diode 400 of the thirteenth mode, which uses the material of the AlGaInP system for the low-refractive index layer of the reflector 422 closest to the active layer 418 and for the spacer layers 419 and GaInPAs for the barrier layer 417 or the quantum well active layer 416. Thereby, the laser structure is formed on the (100) GaAs substrate of the surface orientation inclined in the (111)A direction by 15°, and thus, it becomes possible to suppress the narrowing of bandgap associated with formation of natural superlattices, deterioration of surface morphology caused by hillock (hill-like defect) formation, or the effect of non-optical recombination centers.

Further, with the foregoing construction, it should be noted that (Al$_{0.7}$Ga)$_{0.5}$In$_{0.5}$P, which is a widegap material, is used for the cladding layer (the low refractive index layer of the reflector 422 closest to the active layer 418). Because of this, a very large bandgap difference of 743 meV is obtained between the cladding layer 420 and the active layer 418 as compared with the bandgap difference of 466 meV (Al content 0.6) for the case the cladding layer 420 is formed of AlGaAs. Similarly, a large bandgap difference is secured between the barrier layer 417 and the active layer 418, and excellent carrier confinement is realized. Further, because the active layer 418 accumulates therein a compressive strain, it is also attained the increase of gain caused by band splitting of heavy holes and light holes.

With these effects, the surface-emission laser diode 400 has a very high gain and it is possible to perform high output power operation at low threshold.

While it was explained for the case of providing a single layer of $(Al_{0.2}Ga_{0.8})_{0.5}In_{0.5}P$ layer 419 as the spacer layer between the $(Al_{0.7}Ga_{0.3})_{0.5}In_{0.5}P$ low refractive index layer and the active layer 418, it is also possible to form the space layer by plural semiconductor layers. Further, the AlGaInP low refractive index layer 420 or the AlGaInP spacer layer may contain other constituent elements with a trace amount.

Further, because the active layer 418 and the barrier layer 417 are formed of the material free from Al, the active region (quantum well active layer and adjacent layers) is free from Al, and incorporation of oxygen is reduced with the surface-emission laser diode 400. Thereby, it becomes possible to suppress formation of non-optical recombination centers. With this, it becomes possible to realize a surface-emission laser diode of long lifetime.

Further, with the surface-emission laser diode 400, control of polarization direction is achieved by utilizing the optical gain anisotropy caused by inclination of the substrate 411.

Therefore, with the surface-emission laser diode 400 of the present embodiment, the inclination angle of the substrate is small (15°) when compared with the surface-emission laser diode that uses the (311)B substrate (inclination angle 25°), which is thought most promising at the present juncture.

Thus, with the present mode, this decrease of the optical gain anisotropy is compensated for by the increase of the optical gain anisotropy caused by providing a compressive strain to the quantum well active layer 416, and by forming the outer shape of the quantum well active layer 416 so as to extend in the direction of the (111)A surface for increasing the optical gain in the substrate inclination direction (direction of (111)A). With such a construction, it becomes possible to realize a polarization control not inferior to the case of using the (311)B substrate.

Thus, according to thirteenth mode of the present invention, it becomes possible to realize a high output power surface-emission laser diode of 780 nm wavelength band having large gain, low threshold value, good reliability and controlled polarization direction. Thereby, the surface-emission laser diode 400 of the present embodiment is designed to the structure in which the increase of threshold value is retarded even when there is caused segregation of In at the time of conducting crystal growth of the semiconductor layer 425 containing Al, Ga and As as the major components on the semiconductor layer 420 that contains Al, In and P as the major components. Thereby, production of the laser diode can be conducted easily.

It should be noted that the foregoing effect of the present invention of Al-free active layer decreases at shorter wavelength band, but it appears conspicuously as long as the oscillation wavelength is longer than 680 nm.

For example, when compared with the surface-emission laser diode of the 780 nm band that uses the active layer of AlGaAs/AlGaAs system, it should be noted that the bandgap difference between the $Al_xGa_{1-x}As$ (x=0.6, Eg=2.0226 eV) having the largest bandgap in the typical compositional range used for $Al_xGa_{1-x}As$ (0<x≦1) system spacer layer used with the surface-emission laser diode of the AlGaAs/AlGaAs system and the active layer of the compositional wavelength 780 nm (Eg=1.5567 eV), is generally equal to the bandgap difference (460 meV) between the $(Al_aGa_{1-a})_bIn_{1-b}P$ (a=0.7, b=0.5, Eg=2.289 eV) having the largest bandgap in the typical compositional range used for the $(Al_aGa_{1-a})_bIn_{1-b}P$ (0<a≦1, 0≦b≦1) spacer layer and the active layer of the compositional wavelength of 680 nm (Eg=1.8233 eV).

Further, with regard to the bandgap difference between the barrier layer and the quantum well active layer, the bandgap different to the active layer of the compositional wavelength of 680 nm becomes about 200 meV when the barrier layer is formed of $Ga_eIn_{1-e}P_fAs_{1-f}$ (e=0.6, f=1, Eg=2.02 eV), while this is generally equivalent to the case of the surface-emission laser diode of 780 nm that uses the AlGaAs/AlGaAs system active layer.

This means that it becomes possible to achieve the carrier confinement equivalent to or superior to the case of the surface-emission laser diode of the 780 nm band that uses the active layer of the AlGaAs/AlGaAs system while using an Al-free active layer (quantum well active layer and barrier layer) by using the spacer layer of the AlGaInP system, provided that the compositional wavelength is longer than 680 nm. In fact, the effect of the strained quantum well active layer is added, and it is possible to obtain the characteristics exceeding the surface-emission laser diode of the AlGaAs/AlGaAs system.

Further, when Al is incorporated to the barrier layer 417, it becomes possible to fabricate a red color surface-emission laser diode of the wavelength shorter than 680 nm such as the device of the 650 nm band. In this case, the effect of Al-free active layer is not attained, but it becomes possible to improve the problem of segregation of In noted before.

(Fourteenth Mode)

Next, a fourteenth mode of the present invention will be explained with reference to FIG. 20. It should be noted that the fourteenth mode relates to the construction that gives practical shape to the third construction mentioned before.

Figure 20:
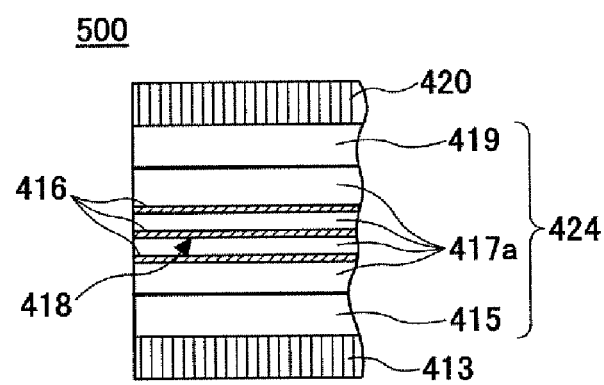
FIG. 20 is a cross-sectional view extracting and showing a structure in the vicinity of the active layer according to a fourteenth mode of the present invention with enlarged scale.

FIG. 20 is a cross-sectional view showing the part around the active layer of a surface-emission laser diode 500 of the present mode in an enlarged scale.

Referring to FIG. 20, the present embodiment has the construction similar to that of the thirteenth mode of FIG. 18, except that a barrier layer 417a of $Ga_{0.6}In_{0.4}P$ having a tensile strain is used in place of the barrier layer 417.

In the material of the GaInPAs system used for the barrier layer of the quantum well active layer in the surface-emission laser diode, GaInP has the largest bandgap when compared with the same lattice constant. Further, a larger bandgap is obtained with the material having a smaller lattice constant. Thus, by using a material of the GaInP system of small lattice constant for the barrier layer, it is possible to realize a large band discontinuity between the barrier layer and the quantum well active layer, and it becomes possible to increase the gain of the surface-emission laser diode. With this, the surface-emission laser diode can perform high output power operation with low threshold value. For example, it should be noted that the bandgap of the tensile-strained $Ga_{0.6}In_{0.4}P$ layer is 2.02 eV, the bandgap of the $Ga_{0.5}In_{0.5}P$ lattice matched layer is 1.87 eV, and thus the $Ga_{0.6}In_{0.4}P$ tensile strain layer has a bandgap larger by 150 meV.

It should be noted that the effect of increasing the band discontinuity by using a tensile composition layer for the barrier layer is obtained not only when the quantum well active layer has a compressive composition but also in the case it has the lattice-matched composition or tensile composition.

(Fifteenth Mode)

The surface-emission laser diode according to the fifteenth mode of the present invention has a construction similar to that of the surface-emission laser diode 400 according to the thirteenth mode explained with reference to FIG. 18, except that C is used for the dopant of the multilayer structure of the p-semiconductor distributed Bragg reflector formed of p-$Al_xGa_{1-x}As$ (x=0.9) and p-$Al_xGa_{1-x}As$ (x=0.3) and Mg is used for the dopant of the p-$(Al_{0.7}Ga_{0.3})_{0.5}In_{0.5}P$ low refractive index layer.

Zn (zinc) is used extensively for the p-type dopant of (Al) GaInP layer, while Zn has a large diffusion coefficient and easily causes diffusion to the active layer or to the neighbor of the active layer during the growth process of the upper reflector. Thereby, there is caused deterioration of crystal quality in the active layer, resulting in degradation of the device characteristics such as decrease of efficiency of optical emission or increase of absorption loss. This problem becomes particularly serious when the p-side semiconductor layer is formed underside of the active layer.

Further, the surface-emission laser diode has a film thickness several times larger than that of an edge-emission laser diode and thus requires longer growth time. Thus the problem of thermal diffusion is by no means a problem that can be neglected.

Mg has a smaller diffusion coefficient than Zn and it is thought that use of Mg can improve the foregoing problem. On the other hand, with the semiconductor layer containing Al, Ga and As as the major components, the diffusion coefficient of C is smaller than the diffusion coefficient of Mg. Further, it is known that controllability becomes poor when Mg is added to the material of the As system.

Thus, with the present embodiment, Mg is added to the AlGaInP layer and C is added to the AlGaAs multilayer film. With this, the problem of dopant diffusion or memory effect can be reduced, and it becomes possible to carry out doping with good controllability. Thereby, a doping profile close to the designed profile is obtained, and at the same time, degradation of the crystal quality of the active layer is suppressed. With this, it becomes possible to achieve low threshold value and high output operation in the surface-emission laser diode.

Figure 21:
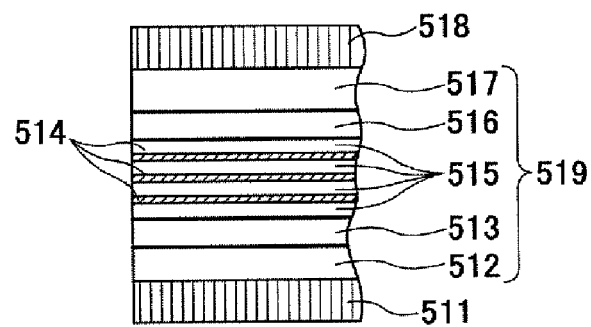
FIG. 21 is a diagram showing the construction example of the peripheral part of the active layer of the surface-emission laser diode for the case an AlGaInP layer is provided in a cavity region sandwiched by the upper and lower reflectors in a seventeenth and eighteenth modes.

It should be noted that the effect of using Mg for the dopant of the AlGaInP film and C for the dopant of the AlGaAs film is obtained not only in the case of using the AlGaInP film as the low refractive index layer of the reflector, but also in the case the AlGaInP film is provided in the cavity region sandwiched between the upper and lower reflectors as shown in FIG. 21. Further, similar effect is obtained also in the case of forming the cavity region by the material of the AlGaInP system similarly to the present mode and the reflector is formed of the material of the AlGaAs system as in the case of the surface-emission laser diode of the 650 nm visible wavelength band.

In the construction of FIG. 21, it should be noted that an n-$(Al_{0.7}Ga_{0.3})_{0.5}In_{0.5}P$ cladding layer 512 is formed on an n-$Al_{0.9}Ga_{0.1}As$ layer 511 constituting the uppermost low refractive index layer of the n-type lower reflector, and an active layer is formed on the n-type cladding layer 512 via a $(Al_{0.2}Ga_{0.8})_{0.5}In_{0.5}P$ lower spacer layer 514 in the form of alternate stacking of the GaInPAs quantum active layer 514 accumulating therein a compressive strain and a $Ga_{0.5}In_{0.5}P$ barrier layer 515, and wherein there is further formed a p-$(Al_{0.7}Ga_{0.3})_{0.5}In_{0.5}P$ cladding layer 517 on the active layer via a $(Al_{0.2}Ga_{0.8})_{0.5}In_{0.5}P$ upper spacer layer 516, and the cladding layer 517 is formed with a p-$Al_{0.9}Ga_{0.1}As$ layer 518 constituting the lowermost low refractive index layer of the p-type upper reflector 518.

The n-$Al_{0.9}Ga_{0.1}As$ layer 511 and p-$Al_{0.9}Ga_{0.1}As$ layer 518 have the thickness of ¼ times the laser oscillation wavelength in that medium, and in the illustrated example, the semiconductor layers 512-517 form a cavity 519 of one wavelength between the upper and lower reflectors 511 and 518.

(Sixteenth Mode)

The surface-emission laser according to sixteenth mode of the present invention has a construction similar to that of the surface-emission laser diode 400 of FIG. 18, except that stacking of the n-$(Al_{0.7}Ga_{0.3})_{0.5}In_{0.5}P$ low refractive index layer and the p-$(Al_{0.7}Ga_{0.3})_{0.5}In_{0.5}P$ low refractive index layer at the top part of the lower reflector 413 is replaced with a short period superlattice structure of $Al_{0.5}In_{0.5}P$ and $Ga_{0.5}In_{0.5}P$.

Although it changes depending on the material, thermal resistance of a semiconductor layer increases with increasing number of the elements that constitutes the semiconductor material. Thus, AlGaInP, a quaternary material, has a large thermal resistance. Thus, the heat generated in such an active layer is not dissipated easily but is accumulated in the active layer and invites the temperature rise of the active layer. Thus, there has been a problem that the optical output saturates with small injection current.

In the case of surface-emission laser diode, it can be regarded, when there is formed a superlattice structure by stacking the layers having a thickness sufficiently smaller than the oscillating wavelength alternately, that it is optically equivalent to the case in which there is formed a mixed crystal having an average composition by mixing these layers uniformly, although there is a report that there occurs slight increase of refractive index by forming the superlattice structure. Thus, it is possible to construct a reflector by using the semiconductor layers thus constructed by the superlattice structure.

Here, in view of the fact that the thermal resistance of the ternary system material such as AlInP or GaInP is smaller than that of AlGaInP, a quaternary material, and because of the fact that AlInP or GaInP can be lattice-matched to the GaAs substrate similarly to the case of AlGaInP, the present construction decreases the thermal resistance by forming a superlattice structure in place of the conventional AlGaInP semiconductor layer of uniform composition, by choosing at least two materials of small thermal resistance as compared with the average composition. With this, the heat generated in the active layer is efficiently dissipated, and temperature rise of the active layer by current injection is decreased. Further, it becomes possible to conduct the current injection with a higher level than conventional case, while this leads to higher output, and it becomes possible to obtain a surface-emission laser diode capable of operating at high output power.

Meanwhile, it should be noted that the effect of thermal resistance reduction for the case of forming AlGaInP by way of short period superlattice structure of AlInP and GaInP is not limited to the case of using AlGaInP for the low refractive index layer of a reflector, but it is obtained also for the case of the superlattice structure provided in the cavity region 519 sandwiched by the upper and lower reflectors 511 and 518. Further, similar effect is obtained also in the surface-emission laser diode that forms the cavity region by the material of the AlGaInP system as in the case f the visible 650 nm band surface-emission laser diode.

Further, because heat dissipation from the active layer is made primarily at the side of the substrate, it is preferable that the foregoing construction is applied at least to the AlGaInP layer at the substrate side.

(Seventeenth Mode)

Figure 22:
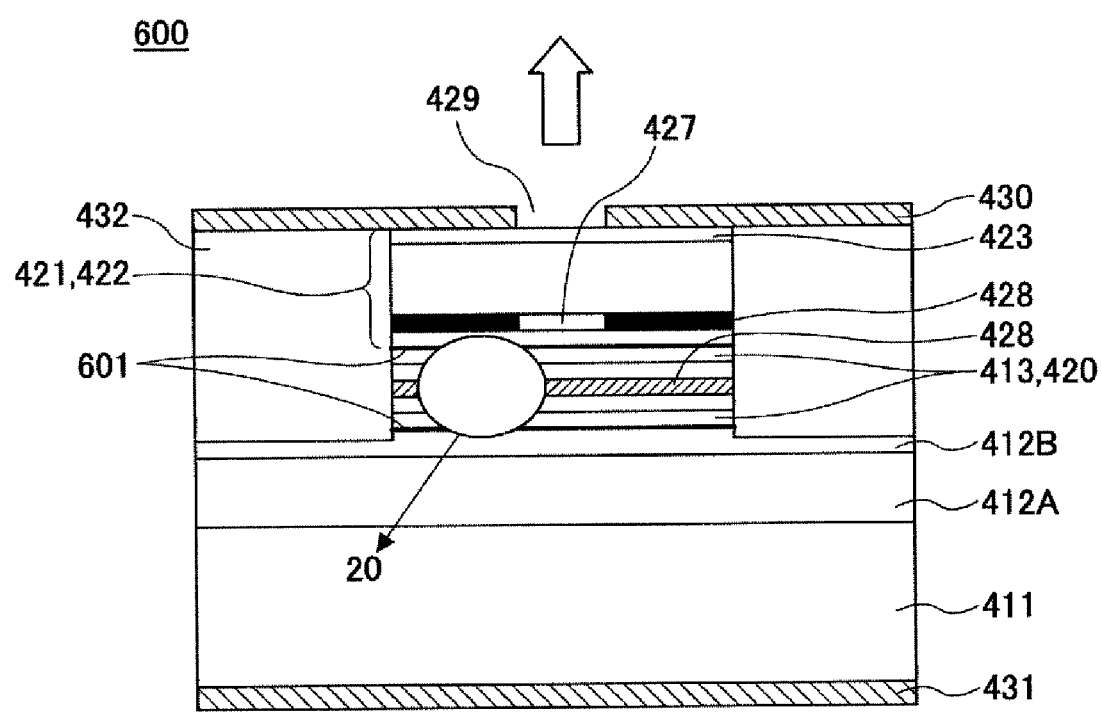
FIG. 22 is a diagram showing a construction example of the surface-emission laser diode according to a twenty-first mode of the present invention.

Hereinafter, a surface-emission laser diode 600 according to the seventeenth mode of the present invention will be explained with reference to FIG. 22, wherein those parts of FIG. 222 explained previously are designated by the same reference numerals and the description thereof will be omitted.

The surface-emission laser diode 600 according to the present embodiment has a construction similar to that of the surface-emission laser diode 500 according to the fourteenth mode, except for the following two points.

The first point is that the lower reflector 414 is formed of consecutive stacking, from the side of the substrate 411, of a first lower reflector 412A in which an n-AlAs low refractive index layer and an n-$Al_{0.3}Ga_{0.7}As$ high refractive index layer are stacked for 31 periods, and a second lower reflector 412B in which an n-$Al_{0.9}Ga_{0.1}As$ low refractive index layer and an n-$Al_{0.3}Ga_{0.7}As$ high refractive index layer are stacked for 9 periods, and that the n-$(Al_{0.7}Ga_{0.3})_{0.5}In_{0.5}$ low refractive index layer 413 is formed thereon.

Because the lower reflector 414 contains AlAs of small thermal resistance as the low refractive index layer, dissipation characteristics of the heat generated in the active layer 416 is improved and the temperature rise at the time of driving is suppressed. Thereby, a high output power surface-emission laser diode of excellent temperature characteristics is obtained.

Meanwhile, in the case the etching surface reaches, at the time of formation of the mesa structure, the AlAs layer of the first lower reflector 412A, there proceeds oxidation also from the edge surface of the AlAs layer exposed at the sidewall at the time of oxidation processing of the AlAs layer for selective oxidation to be conducted laser, and there may arise the problem that the active layer 416 is insulated or electric resistance of the laser diode is increased. This is because the oxidation rate of AlGaAs depends heavily on the Al content such that the oxidation rate increases with increasing Al content and reaches maximum at the composition of AlAs.

Because of this, with the present mode, the second lower reflector 412B of AlGaAs of small oxidation rate is provided on the foregoing lower reflector 412A. It should be noted that such second lower reflector 412B becomes necessary in the case the oxidation rate of the low refractive index layer of the first lower reflector 412A is formed of the material or thickness faster than the layer for selective oxidation. For example, there are cases in which the lower refractive index of the first lower reflector 412A is larger than that of the layer for selective oxidation 427 even when Ga is contained, as in the case in which the layer for selective oxidation 427 is formed of a material in which a small amount of Ga is added to AlAs. In such a case, too, the second lower reflector 412B becomes necessary. As long as the low refractive index layer in the first lower reflector 412A has a composition (material) of small thermal resistance as compared with that of the low refractive index layer in the second lower reflector 412B, efficient heat dissipation is realized.

In the mesa etching, there arises variation in each lot, while in the present mode, it is sufficient that the mesa etching is conducted such that the etching stops between the layer for selective oxidation 427 of Al oxide and the AlAs layer 412A of the first lower reflector.

It should be noted that this mesa etching can be conducted by a reaction beam etching (RIBE) method by introducing a $Cl_2$ gas into the processing vessel of a dry etching apparatus that holds the substrate to be processed. During this mesa etching process, it becomes possible to monitor the progress of etching by obtaining the ratio of In emission (451 nm) and Al emission (396 nm) are obtained by using a plasma atomic emission spectrometer as explained already with previous embodiment.

After several minutes from the start of the etching, the In emission (451 nm) is detected while the In emission disappears in the meantime. Thus, by terminating the etching at the moment the emission of In has disappeared, it becomes possible to stop the etching inside the second lower reflector 412B. Thereby, it becomes control the mesa etching easily with good reproducibility.

The second point is that there is provided a $(Al_{0.1}Ga_{0.9})_{0.5}In_{0.5}P$ intermediate layer 601 of the thickness of 20 nm, for example, at the interface of the $Al_{0.3}Ga_{0.7}As$ high refractive index layer and the $(Al_{0.7}Ga_{0.3})_{0.5}In_{0.5}P$ low refractive index layer of both n-side and p-side.

By inserting the intermediate layer 601 of low Al content, it becomes possible with the present mode to expand the range of growth condition in which planar crystal growth can be conducted with good crystal quality particularly in the case of stacking a p-$Al_{0.3}Ga_{0.7}As$ high refractive index layer on the p-$(Al_{0.7}Ga_{0.3})_{0.5}In_{0.5}P$ low refractive index layer, and formation of the high refractive index layer can be conducted easily. Further, while there arises a problem of increased band discontinuity in the valence band at the heterojunction of a material of the AlGaAs system and a material of the AlGaInP system, it becomes possible to reduce such band discontinuity of the valence band by inserting such an intermediate layer of low Al content, and it becomes possible to decrease the electric resistance. Thereby, the intermediate layer 601 may contain As.

Further, by using the surface-emission laser diode of the twelfth through seventeenth modes of the present invention, it becomes possible to construct the surface-emission laser diode array 220, the optical transmission module 240, the optical communication system 260, the laser printer 280 that uses the surface-emission laser array chip 281, or the like.

Further, the present invention is not limited to the embodiments heretofore but various variations and modifications may be made within the scope of the invention described in the patent claims.

The invention claimed is:

1. A surface-emission laser diode comprising:
   a semiconductor substrate;
   a cavity region formed over said semiconductor substrate, said cavity region comprising:
      an active layer structural part including at least one quantum well active layer producing a laser light and a barrier layer; and
      a spacer layer provided in a vicinity of said active layer structural part, said spacer layer comprising at least one material;
   an upper reflector and a lower reflector provided over said semiconductor substrate respectively at a top part and a bottom part of said cavity region,
   said upper reflector and said lower reflector constituting a semiconductor distributed Bragg reflector having a periodic change of refractive index and reflecting an incident light by interference of optical waves,
   at least a part of said semiconductor distributed Bragg reflector being formed of a layer of small refractive index of $Al_xGa_{1-x}As$ ($0<x\leq1$) and a layer of large refractive index of $Al_yGa_{1-y}As$ ($0\leq y<x\leq1$), said lower reflector being formed of a first lower reflector having a low-refractive index layer of AlAs and a second lower reflector formed on said first lower reflector, said second lower reflector having a low-refractive index layer of AlGaAs, wherein a part of said spacer layer comprises $(Al_aGa_{1-a})_bIn_{1-b}P$ ($0 < a \leq 1$, $0 \leq b \leq 1$), said quantum well active layer comprises $Ga_cIn_{1-c}P_dAs_{1-d}$ ($0 \leq c \leq 1$, $0 \leq d \leq 1$), and said barrier layer comprises $Ga_eIn_{1-e}P_fAs_{1-f}$ ($0 \leq e \leq 1$, $0 \leq f \leq 1$).

2. The surface-emission laser diode as claimed in claim 1, wherein at least a lower spacer layer and an upper spacer layer contains In.

3. The surface-emission laser diode as claimed in claim 1, wherein in said second lower reflector, said low refractive index layer and said high refractive index layer are repeated by 10 pairs or less.

4. The surface-emission laser diode as claimed in claim 1, wherein said quantum well active layer has a compressive strain.

5. The surface-emission laser diode as claimed in claim 1, wherein said barrier layer has a tensile strain.

6. The surface-emission laser diode as claimed in claim 1, wherein said semiconductor substrate comprises a (100) GaAs substrate having a surface orientation inclined in a direction of a (111)A surface with an angle in a range of 5° to 20°.

7. The surface-emission laser diode as claimed in claim 1, wherein said surface-emission laser diode has an oscillation wavelength of about 680 nm or longer.

8. The surface-emission laser diode as claimed in claim 1, wherein said semiconductor substrate comprises a (100) GaAs substrate having a surface orientation inclined in a direction of a (111)A surface by an angle in a range of 5° to 20°.

9. The surface-emission laser diode as claimed in claim 1, wherein said surface-emission laser diode has an oscillation wavelength of about 680 nm or longer.

10. An image forming apparatus comprising:
a photosensitive body;
an optical system that focuses one or more light beams upon the photosensitive body to form an optical image on the photosensitive body; and
one or more surface-emission laser diodes that generates said one or more light beams, respectively, each surface-emission laser diode of the one or more surface-emission laser diodes comprising:
a semiconductor substrate;
a cavity region formed over said semiconductor substrate, said cavity region comprising:
an active layer structural part including at least one quantum well active layer producing a laser light and a barrier layer; and
a spacer layer provided in a vicinity of said active layer structural part, said spacer layer comprising at least one material; and
an upper reflector and a lower reflector provided over said semiconductor substrate respectively at a top part and a bottom part of said cavity region, wherein
said upper reflector and said lower reflector constitute a semiconductor distributed Bragg reflector having a periodic change of refractive index and reflecting an incident light by interference of optical waves,
at least a part of said semiconductor distributed Bragg reflector is formed of a layer of small refractive index of $Al_xGa_{1-x}As$ ($0 < x \leq 1$) and a layer of large refractive index of $Al_yGa_{1-y}As$ ($0 \leq y < x \leq 1$), and
said lower reflector includes a first lower reflector having a low-refractive index layer of AlAs and a second lower reflector formed on said first lower reflector, said second lower reflector having a low-refractive index layer of AlGaAs, and wherein
a part of said spacer layer comprises $(Al_aGa_{1-a})_bIn_{1-b}P$ ($0 < a \leq 1$, $0 \leq b \leq 1$),
said quantum well active layer comprises $Ga_cIn_{1-c}P_dAs_{1-d}$ ($0 \leq c \leq 1$, $0 \leq d \leq 1$), and
said barrier layer comprises $Ga_eIn_{1-e}P_fAs_{1-f}$ ($0 \leq e \leq 1$, $0 \leq f \leq 1$).

11. An optical transmission apparatus comprising:
one or more optical transmission media that carry respective light beams; and
one or more surface-emission laser diodes that generates said light beams, respectively, each surface-emission laser diode of the one or more surface-emission laser diodes comprising:
a semiconductor substrate;
a cavity region formed over said semiconductor substrate, said cavity region comprising:
an active layer structural part including at least one quantum well active layer producing a laser light and a barrier layer; and
a spacer layer provided in a vicinity of said active layer structural part, said spacer layer comprising at least one material; and
an upper reflector and a lower reflector provided over said semiconductor substrate respectively at a top part and a bottom part of said cavity region, wherein
said upper reflector and said lower reflector constitute a semiconductor distributed Bragg reflector having a periodic change of refractive index and reflecting an incident light by interference of optical waves,
at least a part of said semiconductor distributed Bragg reflector is formed of a layer of small refractive index of $Al_xGa_{1-x}As$ ($0 < x \leq 1$) and a layer of large refractive index of $Al_yGa_{1-y}As$ ($0 \leq y < x \leq 1$), and
said lower reflector includes a first lower reflector having a low-refractive index layer of AlAs and a second lower reflector formed on said first lower reflector, said second lower reflector having a low-refractive index layer of AlGaAs, and wherein
a part of said spacer layer comprises $(Al_aGa_{1-a})_bIn_{1-b}P$ ($0 < a \leq 1$, $0 \leq b \leq 1$),
said quantum well active layer comprises $Ga_cIn_{1-c}P_dAs_{1-d}$ ($0 \leq c \leq 1$, $0 \leq d \leq 1$), and
said barrier layer comprises $Ga_eIn_{1-e}P_fAs_{1-f}$ ($0 \leq e \leq 1$, $0 \leq f \leq 1$).

* * * * *